United States Patent
Yasunaga et al.

(12) Patent No.: US 6,191,493 B1
(45) Date of Patent: Feb. 20, 2001

(54) RESIN SEAL SEMICONDUCTOR PACKAGE AND MANUFACTURING METHOD OF THE SAME

(75) Inventors: Masatoshi Yasunaga; Shin Nakao; Shinji Baba; Mitsuyasu Matsuo; Hironori Matsushima, all of Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/260,594

(22) Filed: Mar. 2, 1999

Related U.S. Application Data

(62) Division of application No. 08/837,960, filed on Apr. 14, 1997, now Pat. No. 5,920,770, which is a division of application No. 08/198,078, filed on Feb. 17, 1994, now Pat. No. 5,656,863.

(30) Foreign Application Priority Data

| Feb. 18, 1993 | (JP) | 5-29487 |
| Apr. 23, 1993 | (JP) | 5-120687 |

(51) Int. Cl.[7] .......................... H01L 21/44; H01L 21/48; H01L 21/50
(52) U.S. Cl. .......................... 257/787; 257/773; 257/778; 257/780
(58) Field of Search .......................... 438/106; 257/734, 257/778, 780, 787

(56) References Cited

U.S. PATENT DOCUMENTS

| 4,472,730 | 9/1984 | Ohta . |
| 5,093,281 | 3/1992 | Eshima . |
| 5,128,746 | 7/1992 | Pennisi et al. . |
| 5,139,969 | 8/1992 | Mori . |
| 5,171,716 | 12/1992 | Cagan et al. . |
| 5,205,036 | 4/1993 | Yamazaki . |
| 5,237,013 | 8/1993 | Moore et al. . |
| 5,244,838 | 9/1993 | Casati et al. . |
| 5,304,460 | * 4/1994 | Fulton et al. . |
| 5,304,512 | 4/1994 | Arai et al. . |

(List continued on next page.)

FOREIGN PATENT DOCUMENTS

| 59-143343 | 2/1986 | (JP) . |
| 63-99559 | 4/1988 | (JP) . |
| 63-129878 | 8/1988 | (JP) . |
| 64-18752 | 1/1989 | (JP) . |
| 1-171255 | 7/1989 | (JP) . |

(List continued on next page.)

OTHER PUBLICATIONS

Fujitsu Semiconductor Device Data Book (1992).
Takashi Inoue et al., "Mirco Carrier for LSI Chip Used in the Hitac M–880 Processor Group" IEEE (1990).
Davidson et al., "The Design of ES/9000 Module" IEEE (1991).

*Primary Examiner*—Kevin M. Picardàt
*Assistant Examiner*—D. M. Collins
(74) *Attorney, Agent, or Firm*—McDermott, Will & Emery

(57) ABSTRACT

Bonding pads are formed on a main surface of a semiconductor chip. An insulating layer having openings located on the bonding pads is formed on the main surface of the semiconductor chip. Base metal layers are formed on the bonding pads. A buffer coat film having a portion laid on a periphery of the base metal layer is formed on the insulating layer. Connection layers are formed on the base metal layers. First conductors are formed on the connection layers. A seal resin exposing only top surfaces of the first conductors is formed. Lumpish second conductors are formed on the top surfaces of the first conductor. Thereby, a resin seal semiconductor package can be made compact and it has improved electrical characteristics and high reliability.

6 Claims, 67 Drawing Sheets

U.S. PATENT DOCUMENTS

| | | |
|---|---|---|
| 5,321,303 | 6/1994 | Kawahara et al. . |
| 5,331,235 | 7/1994 | Chun . |
| 5,371,044 | 12/1994 | Yoshida et al. . |
| 5,373,190 | 12/1994 | Ichiyama . |
| 5,427,938 | 6/1995 | Matsumura et al. . |
| 5,438,478 | 8/1995 | Kondo et al. . |
| 5,474,958 | 12/1995 | Djennas et al. . |
| 6,007,357 * | 12/1999 | Perino et al. . |
| 6,014,318 * | 1/2000 | Takeda . |

FOREIGN PATENT DOCUMENTS

| | | |
|---|---|---|
| 1-179334 | 7/1989 | (JP) . |
| 1-196856 | 8/1989 | (JP) . |
| 1-209746 | 8/1989 | (JP) . |
| 2-12829 | 1/1990 | (JP) . |
| 2-207562 | 8/1990 | (JP) . |
| 3-104141 | 5/1991 | (JP) . |
| 4-139848 | 5/1992 | (JP) . |
| 4-207046 | 7/1992 | (JP) . |

* cited by examiner

RESIN SEAL SEMICONDUCTOR PACKAGE AND MANUFACTURING METHOD OF THE SAME

This application is a divisional of application Ser. No. 08/837,960 filed Apr. 14, 1997, now U.S. Pat. No. 5,920,770 which is a division of application Ser. No. 08/198,078 filed Feb. 17, 1994 U.S. Pat. No. 5,656,863.

BACKGROUND OF THE INVENTION

1. Field of the Invention

The present invention relates to a resin seal semiconductor package accommodating a semiconductor component and a manufacturing method of the same. In particular, the invention relates to the resin seal semiconductor package which can achieve a high performance and a high reliability as well as reduction in size, and also relates to the manufacturing method of the same.

2. Description of the Related Art

Semiconductor packages are well-known containers for accommodating semiconductor components. Two kinds of materials, i.e., ceramics and resin, are generally known as the material of the semiconductor packages. Of these materials, the semiconductor packages made of resin have been broadly used as commercial packages because of low material costs and high mass-productivity. A conventional example of the package made of resin, i.e., a so called resin seal semiconductor package will be described below.

FIG. 95 is a perspective view partially in section showing an example of the conventional resin seal semiconductor package. Referring to FIG. 95, a semiconductor chip 103 on which elements are formed is disposed on a die pad 107 made of Fe—Ni alloy or the like. Bonding pads 104 which function as external I/O electrodes are formed on a main surface of the semiconductor chip 103. Around the die pad 107, there are disposed internal leads 105 and external leads 102 for electrical connection with electrodes of external equipments.

The bonding pads 104 and the internal leads 105 are electrically connected together by bonding wires 106 made of gold (Au) or the like. Thereby, elements formed on the semiconductor chip 103 and the external equipments are electrically connected. The die pad 107, semiconductor chip 103 and internal leads 105 are covered with seal resin 101.

The above resin seal semiconductor package suffers from following problems because of the structure described above. The conventional structure requires the bonding wires 106, internal leads 105 and external leads 102 for electrically connecting the elements and external equipments. Regions in which the bonding wires 106 and internal leads 105 are formed cause a problem.

Since the regions for the bonding wires 106 and internal leads 105 are required around the semiconductor chip 103, the seal resin 101 has a width larger by about 1 mm than a width of the semiconductor chip 103. This impedes reduction of the package size.

Further, connections (i.e., bonding wires 106, internal leads 105 and external leads 102) for the external equipments are relatively long, which deteriorates electrical performance because of an increase of the impedance component.

Three improvements aimed at reduction of the package sizes and improvement of the electrical performance have been proposed for overcoming the above problems. These improvements will be described below with reference to FIGS. 96–99.

FIG. 96 is a cross section showing a resin seal semiconductor package of a first improvement disclosed in Japanese Patent Laying-Open No. 3-104141 (1991). Referring to FIG. 96, bonding pads 114 are formed on a main surface of a semiconductor chip 113. Protruded electrodes 112 to be electrically connected to external equipments are formed on the bonding pads 114. The protruded electrodes 112 may be made of solder (Pb/Sn) or other electrically conductive material plated with solder. Tip ends of the protruded electrodes 112 are protruded externally through a seal resin 111 covering the semiconductor chip 113.

Owing to the structures described above, the resin seal semiconductor package of the first improvement comes to have a size nearly equal to that of the semiconductor chip 113, and thus can be smaller than conventional semiconductor packages. Further, the connections (i.e., protruded electrodes 12) for external equipments can be made shorter than the conventional connections, so that the electrical property can be improved.

A second improvement will now be described below with reference to FIGS. 97 and 98. FIG. 97 is fragmentary cross section showing a resin seal semiconductor package of the second improvement disclosed in Japanese Patent Laying-Open No. 4-207046 (1992). In FIGS. 98A to D are perspective views partially in section showing different steps in a process of manufacturing the resin seal semiconductor package in FIG. 97.

Referring first to FIG. 97, a bonding pad 124 is formed on a main surface of a semiconductor chip 123. A protection film 126 is formed on the main surface of the semiconductor chip 123. The protection film 126 has an opening which is located on a portion of a surface of the bonding pad 124. The protection film 126 and the semiconductor chip 123 form a semiconductor element 125.

A seal resin 121 is formed over the protection film 126. The seal resin 121 is provided with an opening 121a located above the bonding bad 124. A protruded electrode 122 protruded from the surface of the seal resin 121 is formed in the opening 121a and is located on the bonding pad 124. Metal of a low melting point or electrically conductive resin is disclosed as the material of protruded electrode 122.

A method of manufacturing the resin seal semiconductor package of the second improvement thus structured will be described below with reference to FIGS. 98A–98D. Referring first to FIG. 98A, a plurality of bonding pads 124 are formed at predetermined positions on the main surface of the semiconductor chip 123. The protection film (not shown in FIGS. 98A–98D) is formed such that the openings thereof are located on portions of the surfaces of the bonding pads 124. In this manner, the semiconductor element 125 is formed.

In FIG. 98B, the seal resin 121 is formed on the main surface of the semiconductor element 125. Then, as shown in FIG. 98C, the openings 121a extending to the bonding pads 124 are formed at portions of the seal resin 121 located above the bonding pads 124. As shown in FIG. 98D, the openings 121a are filled with conductive material to form the protruded electrodes 122.

Owing to the structures described above, the second improvement can reduce the size of the package and improve the electrical performance similarly to the first improvement.

A third improvement will be described below with reference to FIG. 99, which is a cross section of a resin seal semiconductor package disclosed in Japanese Patent Laying-Open No. 4-139848 (1992). In FIG. 99, an interconnection layer 135 and bonding pads 134 are formed on a surface of a semiconductor chip 133.

The interconnection layer 135 is covered with a protection film 136 having openings located on portions of surfaces of the bonding pads 134. Bonding pads 134 are connected to columnar electrodes 132 formed thereon. The semiconductor chip 133 is sealed with a seal resin 131 which exposes only top surfaces of the electrodes 132.

Owing to the above structures, the third improvement can reduce the size of the semiconductor package and improve the electrical performance similarly to the first and second improvements.

As described above, the resin seal semiconductor packages of the first to third improvements have such advantages that the size of the semiconductor packages can be reduced and the electrical performance can be improved, but they respectively have following problems, which will be described below with reference to FIGS. 100–103.

First, the problem of the first improvement will be described below with reference to FIGS. 100 and 101. FIG. 100 is a cross section schematically showing a problem of the protruded electrode 112 made only of solder. FIGS. 101A and 101B are cross sections showing different steps for connecting the semiconductor package to the interconnection on a printed board in the case where a solder 115 is plated on the top surface of the protruded electrode 112.

Referring to FIG. 100, if the protruded electrode 112 is formed only of a single layer of solder, there arises a problem when connecting the protruded electrode 112 to the interconnection layer on the printed board (not shown). In a general manner of connecting the protruded electrode 112 to the interconnection layer on the printed board, solder in the form a paste (will be referred to as "solder paste") is provided on the interconnection layer on the printed board, and the protruded electrode 112 is welded to the solder paste.

If the protruded electrode 112 is formed only of the single layer of solder as described above, the protruded electrode itself melts, so that an electrode on the printed board is bonded to the protruded electrode 112. Thereby, a gap 116 may be formed at an interface between the seal resin 111 and the protruded electrode 112 as shown in FIG. 100. This causes such problems that the protruded electrode 112 is liable to be detached and moisture may enter the gap 116, resulting in reduction of reliability of the semiconductor package.

Another problem may be caused in the case where the solder plating layer 115 is formed over the top surface of the protruded electrode 112, as will be described below. Referring to FIG. 101A, the protruded electrode 112 is connected to an interconnection layer 51 formed on a surface of a printed board 50. The protruded electrode 112 and the interconnection layer 51 are connected together mainly through a solder paste 53.

Components of the solder paste 53 are generally adjusted to have a low melting point. More specifically, a ratio of lead (Pb) contained in the solder paste 53 is kept at a low value of about 40%. The amount of lead contained in the solder affects both the fatigue strength and melting point. Although a higher ratio of lead in the solder increases the fatigue strength, it also undesirably increases the melting point. As a result, the ratio of lead in the solder paste 53 is kept at a small value of about 40%.

Referring to FIG. 101B, connection between the protruded electrode 112 and the interconnection layer 51 in this case is effected by the melting of the solder plating layer 115 and the solder paste 53. Components of the connection layer 53b depend on the amount of the components of the solder paste 53. Therefore, the ratio of lead contained in the connection layer 53b is relatively low and is about 40%. This results in a problem that a fatigue strength of the connection layer 53b comes to be small.

Also, a method of manufacturing the first improvement may have following problems. Japanese Patent Laying-Open No. 3-104141 (1991) disclosing the first improvement does not sufficiently disclose the specific manufacturing method. Further, referring to FIG. 96, it is unclear how the semiconductor chip 113 is supported in forming the resin 111.

In order to support the semiconductor chip 113, it is necessary to support the protruded electrodes 112 in an appropriate manner. In connection with this, if the protruded electrode 112 is formed of a single layer of solder, the protruded electrode 112 is soft, so that it may be difficult to fix the same. Further, a barrier layer is not formed between the protruded electrode 112 and the bonding pad 114, so that reliability of the joint between the protruded electrode 112 and the bonding pad 114 may decrease.

Problems of the second improvement will be described below with reference to FIGS. 102A and 102B. In these figures, the protruded electrode 122 in the semiconductor package is electrically connected to the interconnection layer 51 formed on the printed board 50 through the connection layer 53, e.g., of solder paste. Also in this case, the protruded electrode 122 is welded to the solder paste 53 similarly to the case of the first improvement.

As a result, a connection layer 53c is formed in the connection between the protruded electrode 122 and the interconnection layer 51 as shown in FIG. 102B. Components of the connection layer 53c substantially depend on the components of the solder paste 53. Therefore, the fatigue strength of the connection layer 53c between the protruded electrode 122 and the interconnection layer 51 decreases, resulting in low reliability, similarly to the first improvement.

Also a method of manufacturing the second improvement may have following problems. According to the manufacturing method of the second improvement, it is necessary to form the opening 121a in the seal resin 121. The seal resin 121, however, generally contains silica. This makes etching of the seal resin 121 difficult.

More specifically, referring to FIG. 98C, irregularity is liable to be formed in a wall of the opening 121a in forming the opening 121a. Therefore, it is difficult to keep air-tight the seal resin 121 and the protruded electrode 122. It can be considered that wet etching is mainly utilized as an etching technique for forming the opening 121a at present.

In order to form the opening 121a having a predetermined depth, a width of the opening 121a is therefore inevitably increases corresponding to the depth. As a result, it is required to increase a pitch between the openings 121a, so that it is difficult to comply with a demand for increase of pins in number. Since the seal resin 121 is opaque, positioning of the bonding pads 124 and the openings 121a is difficult.

Problems of the third improvement will be described below with reference to FIG. 103. In the operation for connecting the resin seal semiconductor package of the third embodiment to the printed board 50, a flat surface of the semiconductor package including the top surfaces of the electrodes 132 is pressed against the solder pastes which will form the connection layers 53d.

Thereby, the solder pastes spread out and thus may cause short-circuit of the adjacent electrodes 132. More specifically, the connection layers 53d formed of solder pastes contact with the adjacent connection layers 53d as can be seen in regions 55 in FIG. 103. This results in reduction of yield in the connections between the semiconductor package and the printed board 50.

A method of manufacturing in accordance with the third improvement has a problem caused by connecting the electrode 132 to the bonding pad 134, as will be described below. In the manufacturing method of the third improvement, the electrode 132 and the bonding pad 134 may be connected together by directly pressing them together.

For this pressing, a relatively large load is applied for pressing the electrode 132 against the bonding pad 134. As a result, such problems are likely to occur that the bonding pad 134 deforms and that the protection film 136 cracks.

The first and second improvements further have the following problem.

The first and second improvements require the protruded electrodes of about several hundreds microns or more in height. It takes long time to form such protruded electrodes in a conventional method such as a plating method. This reduces productivity.

In the first to third improvements, the protruded electrodes 112, 122, 132 are formed on the bonding pads 114, 124 and 134, respectively. Therefore, the protruded electrodes 112, 122 and 132 can be formed only at the limited positions.

The following problem may occur when the resin seal semiconductor packages of the first to third improvements is mounted on the printed boards. The protruded electrodes 112, 122 or 132 are formed throughout the main surface of the resin seal semiconductor package. When the conventional resin seal semiconductor package is to be mounted on the printed board, the printed board is therefore opposed to the main surface of the resin seal semiconductor package.

Thus, the printed board must have an area nearly equal to the area of the main surface of the resin seal semiconductor package in order to mount the resin seal semiconductor package on the printed board. This restricts high integration of the resin seal semiconductor packages.

The following disadvantage may also be caused in connection with a socket used for evaluating a performance of the resin seal semiconductor packages of the first to third improvements.

FIG. 104 is a perspective view showing an example of a conventional socket used for performance evaluation of the resin seal semiconductor package. Referring to FIG. 104, a conventional socket 203 is provided with contacts 204 to be electrically connected to I/O terminals 202 of a resin seal semiconductor package 201 as well as I/O terminals 205 to be electrically connected to a performance evaluating device (not shown). The I/O terminals 205 are electrically connected to the contacts 204.

In this example, the contact 204 is formed of two metal plate springs. The I/O terminal 202 of the resin seal semiconductor package 201 is inserted between the two metal plate springs of the contact 204. In this state, the performance evaluation of the resin seal semiconductor package 201 is carried out. The socket described above is also used for the screening.

If the socket 203 described above is used for the performance evaluation of the resin seal semiconductor packages having the protruded electrodes 112, 122 and 132 of the first to third improvements, the protruded electrodes 112, 122 and 132 and the contacts 204 cannot ensure stable electrical contact, and thus the socket 203 cannot function satisfactorily.

In connection with the above problems, the following problem also occur if the performance of the resin seal semiconductor packages having the protruded electrodes 112, 122 and 132 of the first to third improvements is to be evaluated with another conventional inspection device. FIG. 105 is a perspective view showing an example of the above another inspection device.

An inspection device 210 having a probe is shown in FIG. 105. The inspection device 210 includes contact needles 213, and also includes first to third screws 216, 221 and 219 for moving the contact needles 213 in a desired direction.

The first screw 216 is used to adjust the position of the contact needle 213 in a vertical direction. The second screw 219 is used to adjust the position of the contact needle 213 in a longitudinal (front to rear) direction. The third screw 221 is used to adjust the position of the contact needle 213 in a lateral (left to right) direction.

The inspection device 210 further includes support bases 220, on which first and second movable bases 217 and 218 are mounted. The contact needle 213 is attached to the first movable base 217 through a support plate 214 and a fixing plate 215.

In an operation for conducting the performance evaluation of the resin seal semiconductor package 211 having the protruded electrodes with the inspection device 210 thus constructed, the first to third screws 216, 219 and 221 are first adjusted appropriately to adjust the positions of the contact needles 213. The contact needles 213 are sequentially brought into contact with the respective protruded electrodes 212 in the resin seal semiconductor package 211. In this manner, the performance evaluation of the resin seal semiconductor package is conducted.

However, the performance evaluation with the inspection device 210 thus constructed requires a time-consuming operation. Further, the inspection device 210 cannot easily ensure stable electrical contact between the contact needle 213 and the protruded electrode 212.

SUMMARY OF THE INVENTION

The present invention is developed for overcoming the above disadvantages, and it is an object of the invention to provide a resin seal semiconductor package in which size thereof is reduced, electrical characteristics are improved and high reliability is achieved, as well as a method of manufacturing the same.

Another object of the invention is to provide a resin seal semiconductor package in which protruded electrodes for external connection can be easily formed in the resin seal semiconductor package, as well as a method of manufacturing the same.

Still another object of the invention is to provide a resin seal semiconductor package, in which degree of freedom of positions of bonding pads is increased and thereby circuits can be easily designed, as well as a manufacturing method of the same.

Further another object of the invention is to provide a resin seal semiconductor package, in which electrodes for external connection can be formed at standardized positions, as well as a manufacturing method of the same.

Yet another object of the invention is to provide a resin seal semiconductor package, in which a packaging density of the resin seal semiconductor packages can be improved by reducing a contact area of a printed board and the resin seal semiconductor package mounted thereon, as well as a method of mounting the same.

It is also an object of the invention to provide a socket for performance evaluation of a resin seal semiconductor package having protruded electrodes. The socket can stably ensure electrical contact between the protruded electrodes of the resin seal semiconductor package and electrodes of the socket for performance evaluation, and thereby can efficiently and stably perform the performance evaluation and screening of the resin seal is semiconductor package having the protruded electrodes.

A resin seal semiconductor package according to an aspect of the invention includes a semiconductor chip provided at its main surface with an element, a bonding pad formed in the main surface of the semiconductor chip and functioning as an electrode for external connection, a first conductor formed on the bonding pad and having a substantially flat top surface, a seal resin sealing the semiconductor chip and exposing only the top surface of the first conductor, and a lumpish second conductor formed on the top surface of the first conductor and made of material different from that of the first conductor. The resin seal semiconductor package preferably includes a base metal layer provided between the bonding pad and the first conductor and functioning as a barrier layer. A third conductor is preferably formed between the base metal layer and the first conductor for electrically connecting them.

In the specification, the bonding pad is defined as a conductive layer, which is nearest to the semiconductor chip, among a plurality of conductive layers which form an electrode part for external connection having a multilayer structure and are formed on the semiconductor chip for electrically connecting an electrode of an external equipment and the element on the semiconductor chip.

The resin seal semiconductor package according to the above aspect includes the base metal layer functioning as the barrier layer. This can prevent diffusion between the bonding pad and first conductor. As a result, reliability of the junction between the first conductor and the bonding pad can be improved. Since the first conductor has the substantially flat top surface, the second conductor can be easily formed on the top surface of the first conductor.

Owing to the provision of the lumpish second conductor, the second conductor can be used as a part of the connection to the external equipment by melting the second conductor when connecting the same to the external equipment. Therefore, the ratio of components contained in the connection to the external equipment can be appropriately controlled, and hence various characteristics such as a fatigue strength of the connection can be improved. Consequently, reliability of the connection between the external equipment and the resin seal semiconductor package can be improved.

In the structure where the third conductor is formed between the base metal layer and the first conductor, the base metal layer and the first conductor can be joined together by melting the third conductor. Thereby, a load applied for joining the base metal layer to the first conductor can be remarkably reduced. As a result, it is possible to effectively prevent problems such as deformation of the bonding pad, cracking of a protection film and deformation of the base metal layer, which may be caused by application of a relatively large load when joining the base metal layer to the first conductor.

A resin seal semiconductor package according to another aspect of the invention includes a semiconductor chip provided at its main surface with an element, a bonding pad formed on the main surface of the semiconductor chip, a base metal layer which is connected to the bonding pad, extends to a position shifted from the bonding pad in a direction of the main surface of the semiconductor chip and has a function as a barrier layer, a first conductor formed in a position on the base metal layer shifted from the bonding pad and having a substantially flat top surface, a seal resin sealing the semiconductor chip and exposing the top surface of the first conductor, and a lumpish second conductor formed on the top surface of the first conductor and made of material different from that of the first conductor.

The resin seal semiconductor package of the above aspect includes the base metal layer extending from the position on the bonding pad to the position shifted therefrom in the direction of the main surface of the semiconductor chip. The first conductor is not formed on the bonding pad. Therefore, a planar area of the bonding pad can be reduced. Consequently, the ratio of an area occupied by the bonding pad in the main surface of the semiconductor chip can be made small, which contributes to high integration of elements formed in the semiconductor chip.

Owing to the extension of the base metal layer, the first conductor can be formed at a desired position. Thus, the bonding pad and an external equipment can be electrically connected together at a desired position. This can increase the degree of freedom of layout of the elements on the semiconductor chip and the degree of freedom relating to connection to the external equipments.

According to a method of manufacturing a resin seal semiconductor package of an aspect of the invention, a first conductor is formed on an insulating base plate. Then, a connection layer is formed on a bonding pad formed on a main surface of a semiconductor chip. The semiconductor chip is turned over to dispose the connection layer on the first conductor. The connection layer and the first conductor is joined together. The semiconductor chip disposed on the insulating base plate is sealed with resin. The insulating base plate is separated from the first conductor to expose a top surface of the first conductor. A lumpish second conductor is formed on the exposed top surface of the first conductor.

In a process of forming the second conductor, a mask having an opening located above the first conductor is disposed on the resin. A second conductor material is disposed in the opening of the mask. The second conductor material is melted to form the lumpish second conductor.

The second conductor may be formed through following steps. The second conductor material is laid on the base plate. The base plate is laid on the resin, and thereby the second conductor material is disposed on the top surface of the first conductor. The second conductor material is disposed to the first conductor. The base plate is separated from the second conductor material. The second conductor material is melted to form the lumpish second conductor.

Further, the second conductor may be formed by immersing the top surface of the first conductor in the second conductor material in a liquid phase. The second conductor may be formed by immersing the top surface of the first conductor in plating solution containing the second conductor material in the form of ions and thereby depositing the second conductor material on the top surface of the first conductor.

According to the method of manufacturing the resin seal semiconductor package of the above aspect, the first conductor is joined to the connection layer after the first conductor is disposed on the connection layer. The connection layer is melted, whereby the first conductor and the connection layer can be joined together. Therefore, only a small load is required for joining the first conductor and the connection layer. This small load can prevent adverse effect on other structural components, which may be caused when a relatively large load is required for joining the first conductor and the connection layer.

The semiconductor chip disposed on the insulating base plate is sealed with the resin. Thereafter, the insulating base plate are separated from the first conductor. Therefore, the top surface of the first conductor is substantially flat, and there would not be a difference in level formed in the connection between the first conductor and the seal resin. Therefore, the second conductor material can be easily formed on the exposed top surface of the first conductor.

The second conductor material is preferably disposed in the opening of the mask located above the first conductor. The second conductor material is melted to form the lumpish second conductor. Since the second conductor does not wet on the resin, the second conductor material is formed in the lumpish form only on the first conductor. In this manner, the lumpish second conductor which is electrically connected to the first conductor can be formed.

In another aspect, the second conductor material is laid on the base plate. The base plate is laid on the resin, so that the second conductor material is disposed on the top surface of the first conductor. The first conductor and the second conductor material are bonded together. Thereby, the second conductor material can be separated from the base plate and left on the first conductor. Thereafter, the second conductor material is melted to form the lumpish second conductor on the first conductor similarly to the case already described.

The second conductor may be formed by immersing the top surface of the first conductor in the second conductor material in a liquid phase. Since the second conductor does not wet on the resin, the second conductor material leaves only on the top surface of the first conductor after the immersion of the top surface of the first conductor in the second conductor material in the liquid phase. Therefore, the second conductor can be formed on the first conductor.

The second conductor may be formed by immersing the top surface of the first conductor in plating solution containing the second conductor material in the form of ions. The second conductor material is deposited only on the top surface of the first conductor immersed in the plating solution. Thereby, the second conductor can be formed on the first conductor.

Still another aspect of the invention provides a method of manufacturing a resin seal semiconductor package which includes a semiconductor chip provided with an element, a bonding pad formed on a main surface of the semiconductor chip, a conductor which includes a columnar portion formed on the bonding pad with a base metal layer therebetween and having a first cross sectional area and a conical portion located on the columnar portion and having a second cross sectional area at its bottom larger than the first cross sectional area, and a seal resin sealing the semiconductor chip and exposing a portion of a surface of the conical portion of the conductor.

In the method, the base metal layer is formed on the bonding pad. Then, a first molding die provided with a through hole which is located at a position corresponding to the conductor and has a diameter smaller than a maximum diameter of the conical portion, as well as a second molding die to be mated with the first molding die is prepared. The through hole in the first molding die is positioned with respect to a surface of the conical portion of the conductor. Vacuum suction is effected on the conical portion through the through hole for fixing the conical portion to the through hole. The second molding die is disposed on the semiconductor chip. While holding the conical portion with respect to the through hole by suction, resin is supplied into a space defined by the first and second molding dies to form the seal resin. Then, the first and second molding dies are separated from the seal resin.

According to the method of manufacturing the resin seal semiconductor package of the above aspect, the first molding die is provided with the through hole having the diameter smaller than the maximum diameter of the conical portion of the conductor. The conical portion of the conductor is positioned with respect to the through hole, and the vacuum suction is effected on the conical portion through the through hole. Thereby, the semiconductor chip can be fixed to the first molding die. While maintaining the semiconductor chip in the fixed state, the semiconductor chip can be hermetically sealed with the resin. As a result, the seal resin which seals the semiconductor chip and partially exposes the surface of the conical portion of the conductor can be formed.

A resin seal semiconductor package of a further aspect of the invention includes a semiconductor chip provided at its main surface with an element, a bonding pad formed on the main surface of the semiconductor chip, a conductive layer formed on and electrically connected to the bonding pad, an electrode for external connection electrically connected to the conductive layer and making an electrical connection, which is located in a region on the semiconductor chip not bearing the bonding pad, to an external equipment, and a seal resin sealing the semiconductor chip and exposing a portion of a surface of the electrode for external connection.

In the resin seal semiconductor package of the above aspect, the electrode for external connection is formed at a position which is shifted from the bonding pad when viewed perpendicularly to the main surface of the resin seal semiconductor package. The electrode for external connection is electrically connected to the bonding pad through the conductive layer.

By extending the conductive layer in a main surface direction of the semiconductor chip (i.e., a main surface direction of the resin seal semiconductor package), the position of the electrode for external connection can be shifted from the bonding pad as described above. Thereby, the degree of freedom of layout of elements can be increased. Positions of the electrodes for external connection can be easily standardized with respect to various devices.

A resin seal semiconductor package of further aspect of the invention includes a semiconductor chip provided at its main surface with an element, first and second bonding pads formed on the main surface of the semiconductor chip and functioning as electrodes for external connection, a conductive layer which extends from the first bonding pad to the second bonding pad for electrically connecting the first and second bonding pads, an electrode for external connection electrically connected to the conductive layer and making an electrical connection, which is located in a region on the semiconductor chip not bearing the first and second bonding pads, to an external equipment, and a seal resin sealing the semiconductor chip and exposing a portion of a surface of the electrode for external connection.

According to the resin seal semiconductor package of the above aspect, a plurality of bonding pads receiving the same signal can be electrically connected together by the conductive layer. Thereby, the electrodes for external connection can be reduced in number. This result in increase of the degree of freedom of layout of the electrodes for external connection.

A semiconductor device according to the invention is on the premise that a resin seal semiconductor package provided at its main surface with a plurality of protruded electrodes having partially exposed surfaces is electrically connected to and mounted on a printed board.

The resin seal semiconductor package is mounted on the printed board with its main surface being upright to the printed board. The printed board has protruded connection electrodes at positions corresponding to the protruded electrodes of the resin seal semiconductor package. The protruded electrodes of the resin seal semiconductor package and the connection electrodes on the printed board are welded and bonded together.

According to the resin seal semiconductor package described above, the resin seal semiconductor package can be mounted on the printed board with its main surface being upright to the printed board. Thereby, an area through which the resin seal semiconductor package is opposite to the printed board can be reduced. Thus, many resin seal semiconductor packages can be mounted on the printed board. This allows high integration of the resin seal semiconductor packages.

A method of mounting a resin seal semiconductor package according to the invention is on the premise that the resin seal semiconductor package has the following structures. The resin seal semiconductor package has a main surface having a first area, a first side surface having a second area smaller than the first area and defining a portion of a periphery of the main surface, and a protruded electrode for external connection including a first conductor and a second conductor formed on the first conductor. The first conductor is formed near the periphery of the main surface and along the first side surface and has a top surface at substantially the same level as the main surface.

On a base plate on which the resin seal semiconductor package is mounted, there is formed a protruded connection electrode at a position corresponding to the protruded electrode. The first side surface is disposed at a predetermined position on the base plate to connect the protruded electrode to the protruded connection electrode.

According to the method of mounting the resin seal semiconductor package of the invention, the first side surface is disposed on the base plate. Therefore, an area for mounting the resin seal semiconductor package (i.e., an area through which the resin seal semiconductor package and the base plate are opposite each other) can be made smaller than that in the prior art. This can achieve high integration of the resin seal semiconductor packages on the base plate.

A resin seal semiconductor package according to a further another aspect of the invention includes first and second semiconductor chips each having a main surface and a rear surface and being disposed with their rear surfaces opposite each other, first conductor formed on the main surfaces of the first and second semiconductor chips and each forming a portion of a protruded electrode for external connection, a seal resin sealing and integrating the first and second semiconductor chips and partially exposing a surface of each first conductor, and second conductor formed on a portion of the surface of the first conductor and forming a portion of the protruded electrode for external connection.

According to the resin seal semiconductor package of the above aspect, the first and second semiconductor chips of which rear surfaces are opposite to each other are sealed with the common seal resin. Therefore, the protruded electrodes for external connection can be formed both on a main surface and a rear surface of the one resin seal semiconductor package. Thereby, an area for mounting the resin seal semiconductor packages on the printed board can be made smaller than that in the prior art. Consequently, high integration of the resin seal semiconductor packages can be achieved.

A socket according to the invention includes a receiving electrode disposed at its one surface for receiving in a predetermined direction a protruded electrode which protrudes from a main surface of the resin seal semiconductor package, and a connection electrode disposed at the other surface for making electrical connection to a performance evaluating device used for evaluating a performance of the resin seal semiconductor package. The socket includes elastic member for elastically maintaining contact of the receiving electrode with the protruded electrode in the predetermined direction.

According to the socket of the invention, the contact between the receiving electrode and the protruded electrode is elastically maintained by the elastic member. Therefore, the receiving electrode can be stably in contact with the protruded electrode. Consequently, the performance evaluation of the resin seal semiconductor package having the protruded electrode can be stably and reliably performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 94:
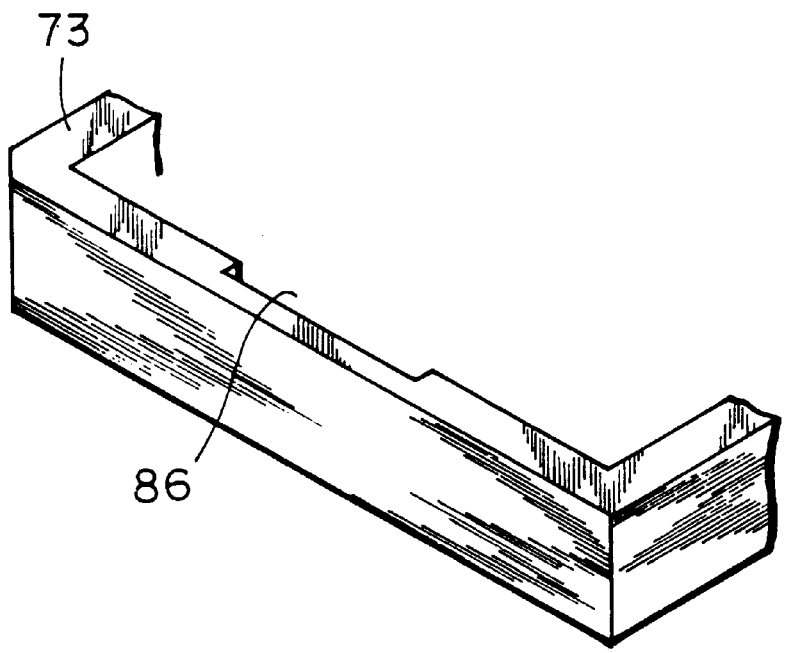
FIG. 94 is a perspective view showing a distinctive portion of a socket for performance evaluation of a resin seal semiconductor package of a thirty-ninth embodiment of the invention.
Figure 95:
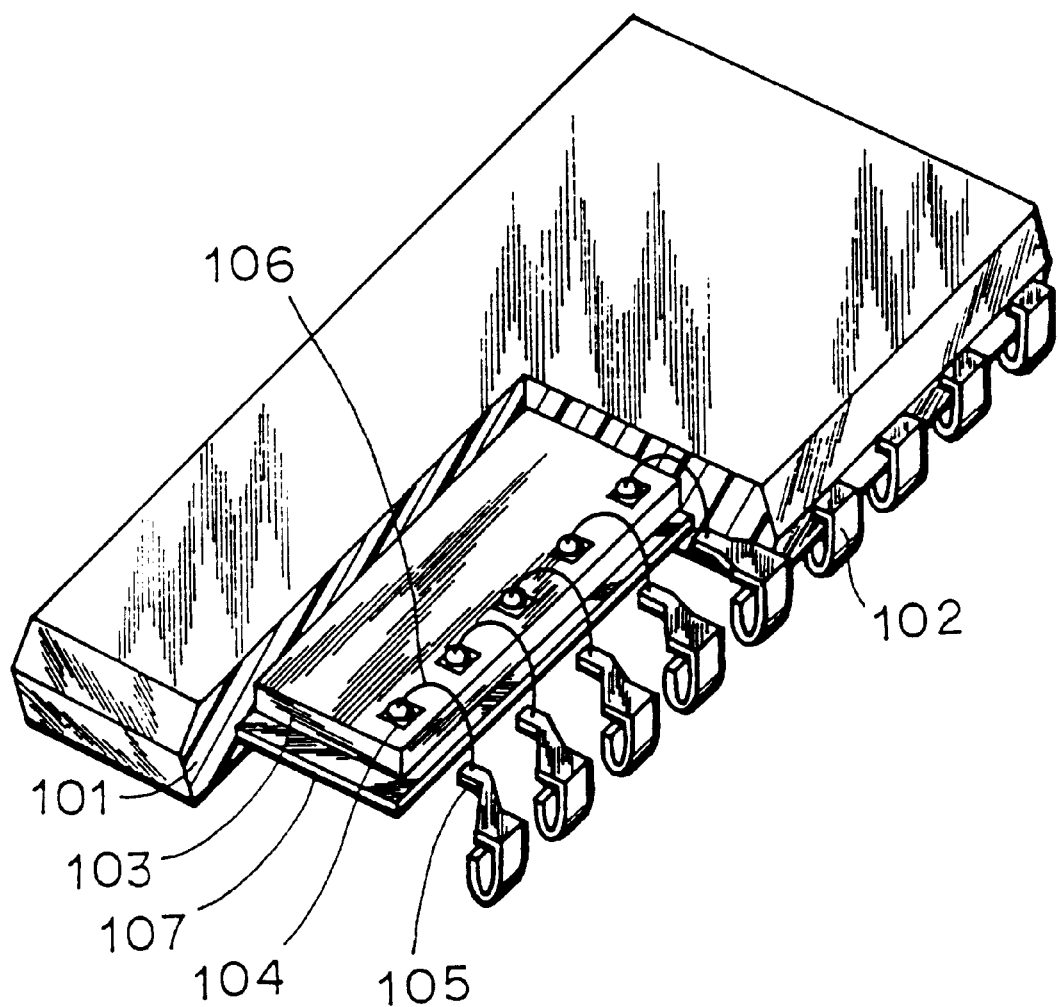
FIG. 95 is a perspective view partially in section showing an example of a resin seal semiconductor package in the prior art.
Figure 96:
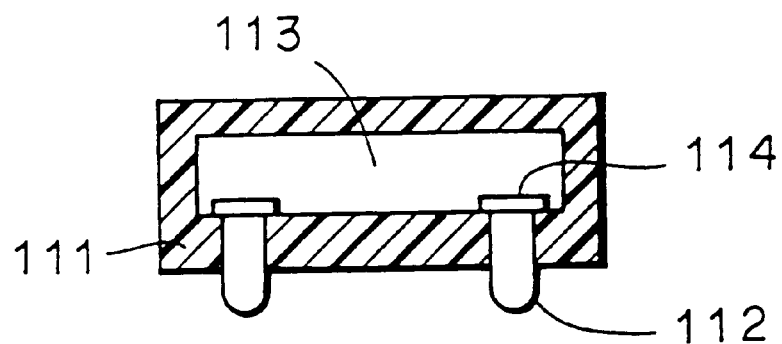
FIG. 96 is a cross section showing a resin seal semiconductor package disclosed in Japanese Patent Laying-Open No. 3-104141.
Figure 97:
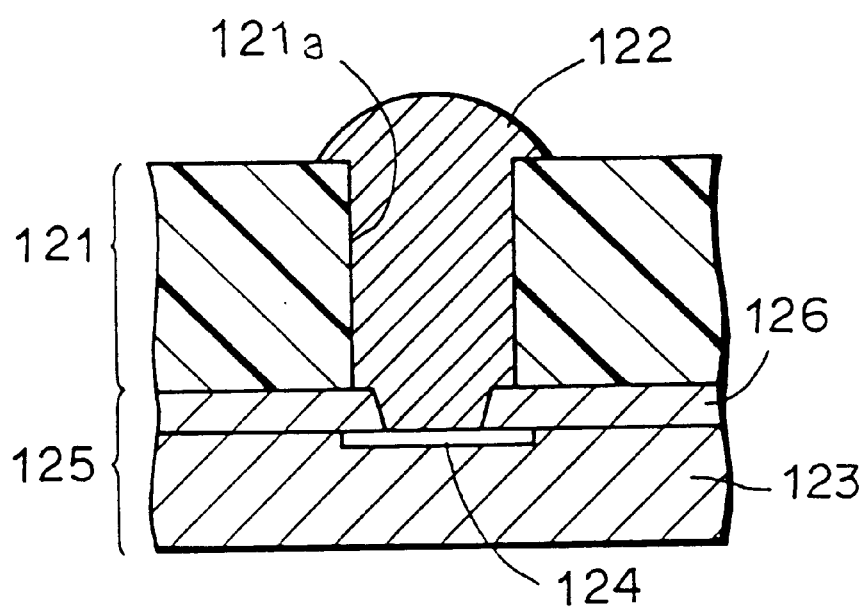
FIG. 97 is a fragmentary cross section of a resin seal semiconductor package disclosed in Japanese Patent Laying-Open No. 4-207046.
Figure 98A:
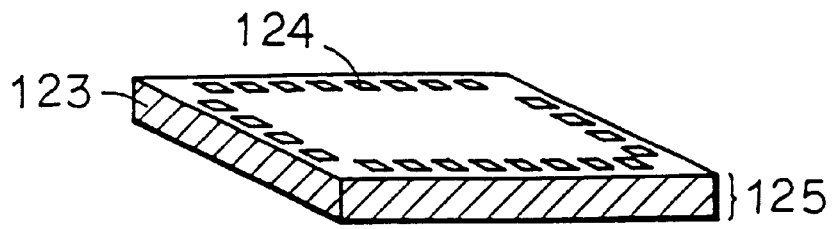
FIGS. 98A–98D are perspective views showing 1st to 4th steps in a process of manufacturing the resin seal semiconductor package shown in FIG. 97, respectively.
Figure 98B:
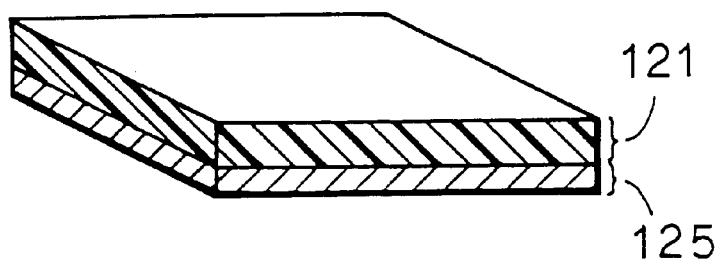
Figure 98C:
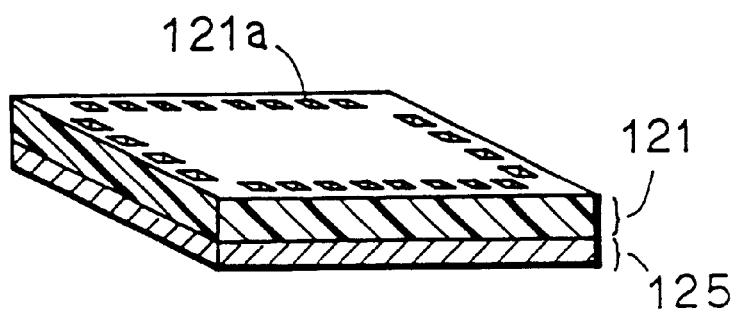
Figure 98D:
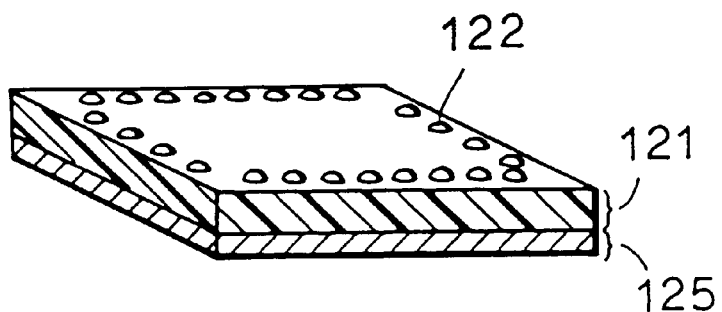
Figure 99:
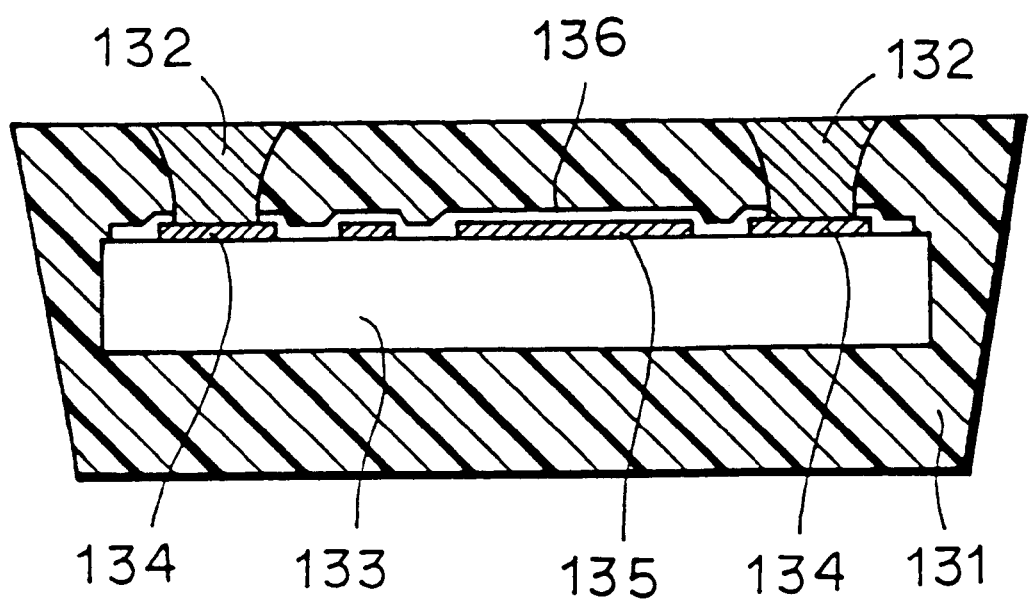
FIG. 99 is a cross section showing a resin seal semiconductor package disclosed in Japanese Patent Laying-Open No. 4-139848.
Figure 100:
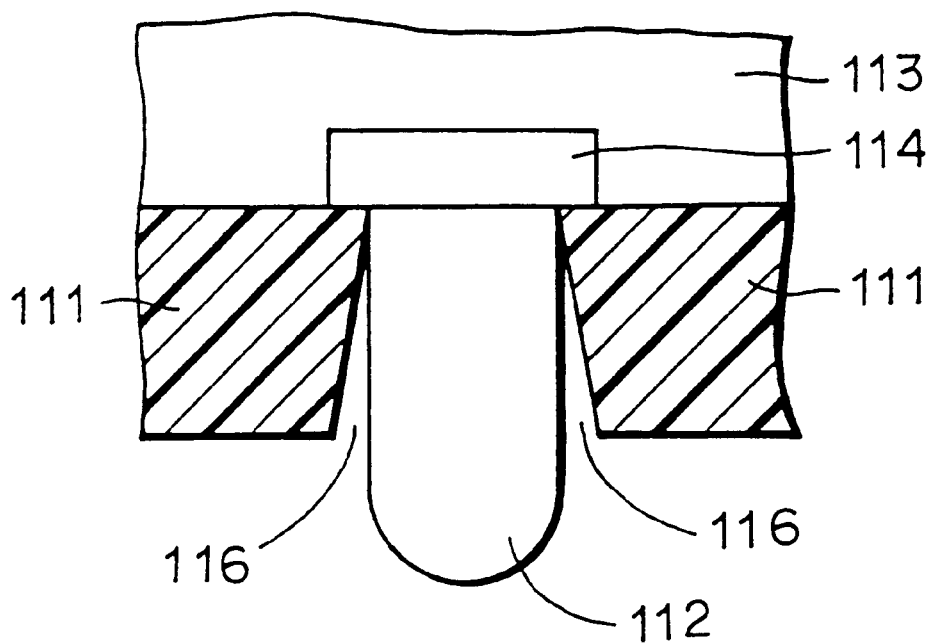
FIG. 100 is a fragmentary cross section showing a problem of the resin seal semiconductor package shown in FIG. 96.
Figure 101A:
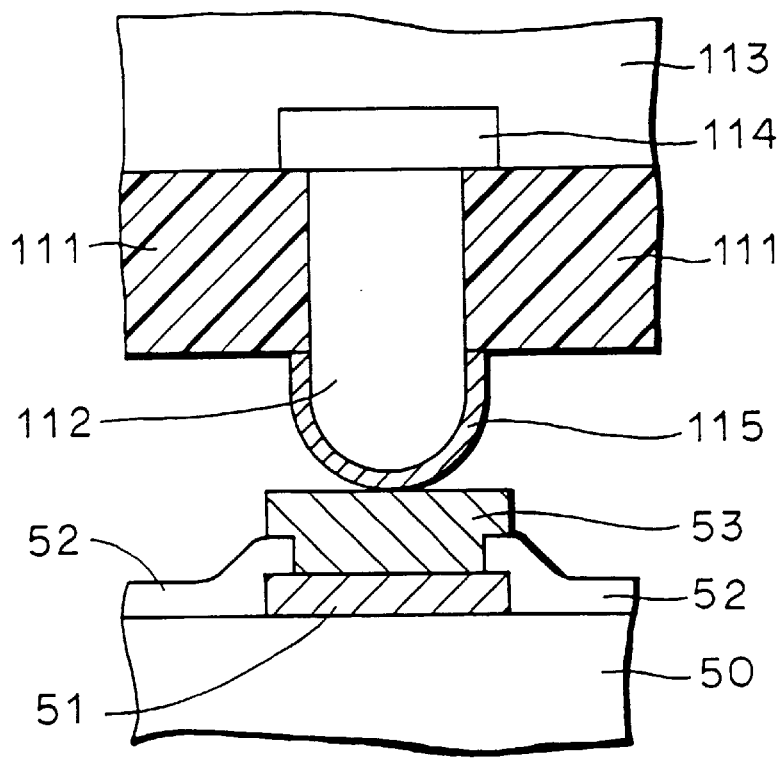
FIG. 101A is a fragmentary cross section showing a state in which a modification of the resin seal semiconductor package shown in FIG. 96 is being mounted on the printed board, and specifically in which electrodes of the resin seal semiconductor package are disposed on interconnection layers on the printed board.
Figure 101B:
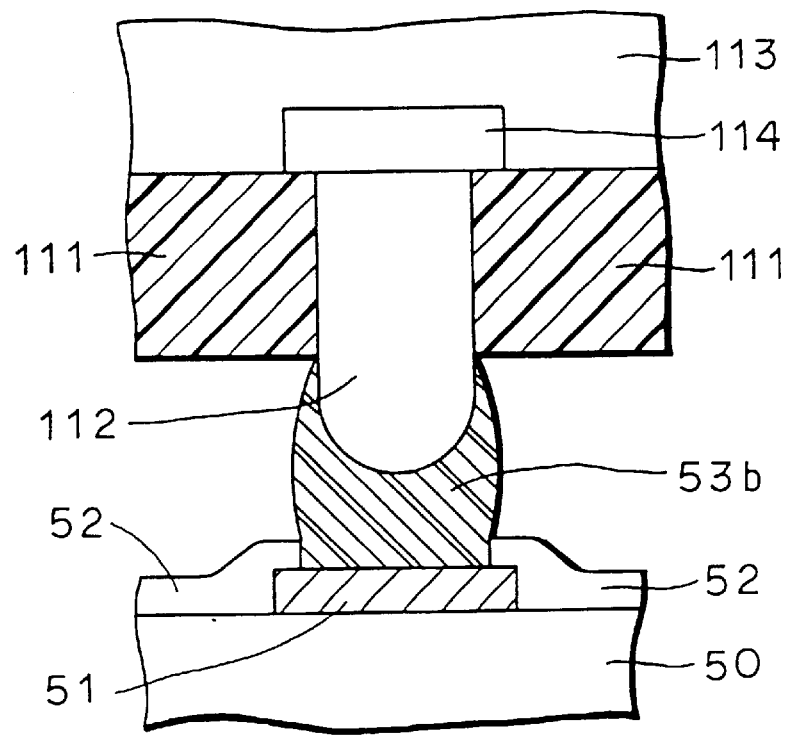
FIG. 101B is a fragmentary cross section showing a state in which the electrode of the resin seal semiconductor package shown in FIG. 101A is connected to the interconnection layer with a connection therebetween.
Figure 102A:
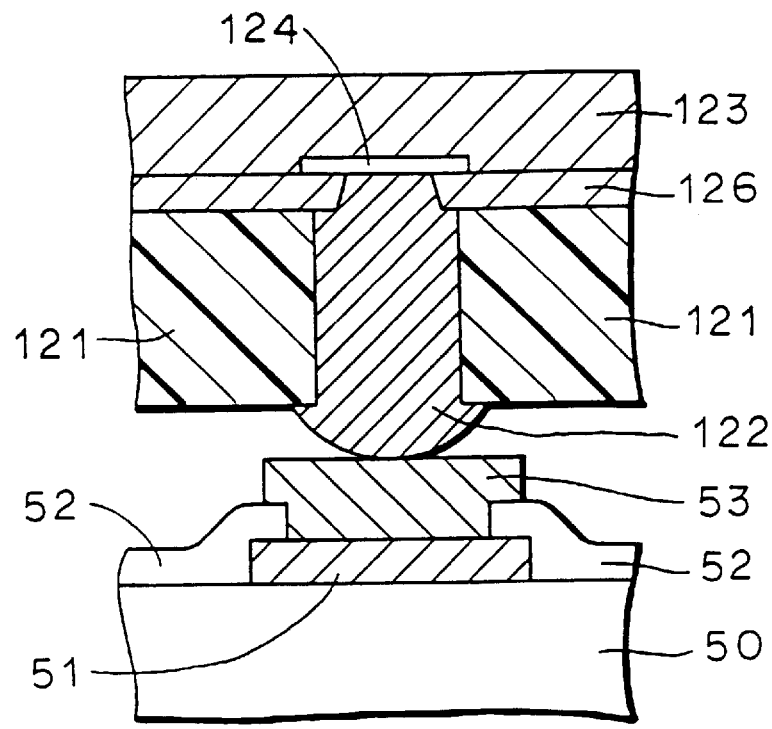
FIG. 102A is a fragmentary cross section showing a state in which the resin seal semiconductor package shown in FIG. 97 is being mounted on the printed board, and specifically in which electrodes of the resin seal semiconductor package are disposed on interconnection layers on the printed board.
Figure 102B:
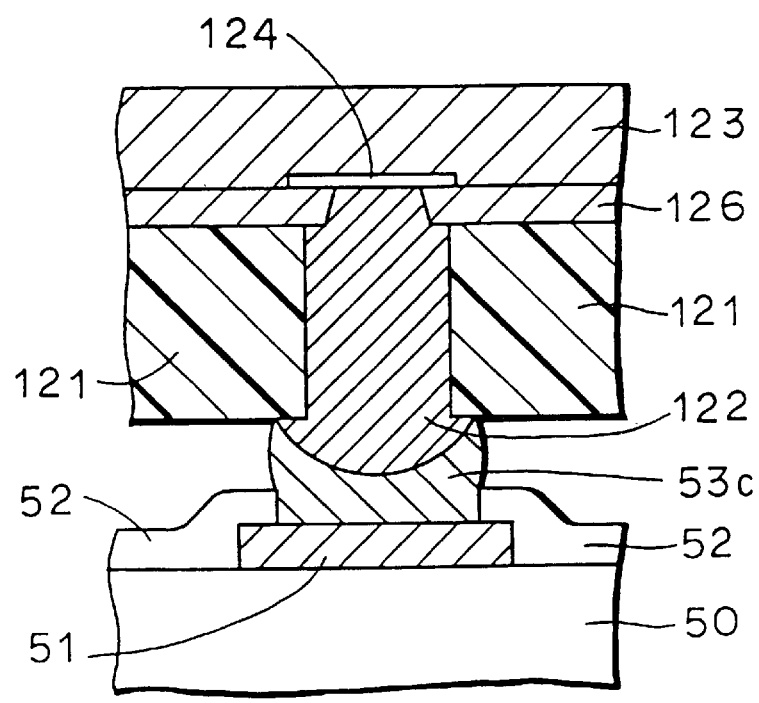
FIG. 102B is a fragmentary cross section showing a state in which the electrode of the resin seal semiconductor package shown in FIG. 102A is connected to the interconnection layer on the printed board with a connection therebetween.
Figure 103:
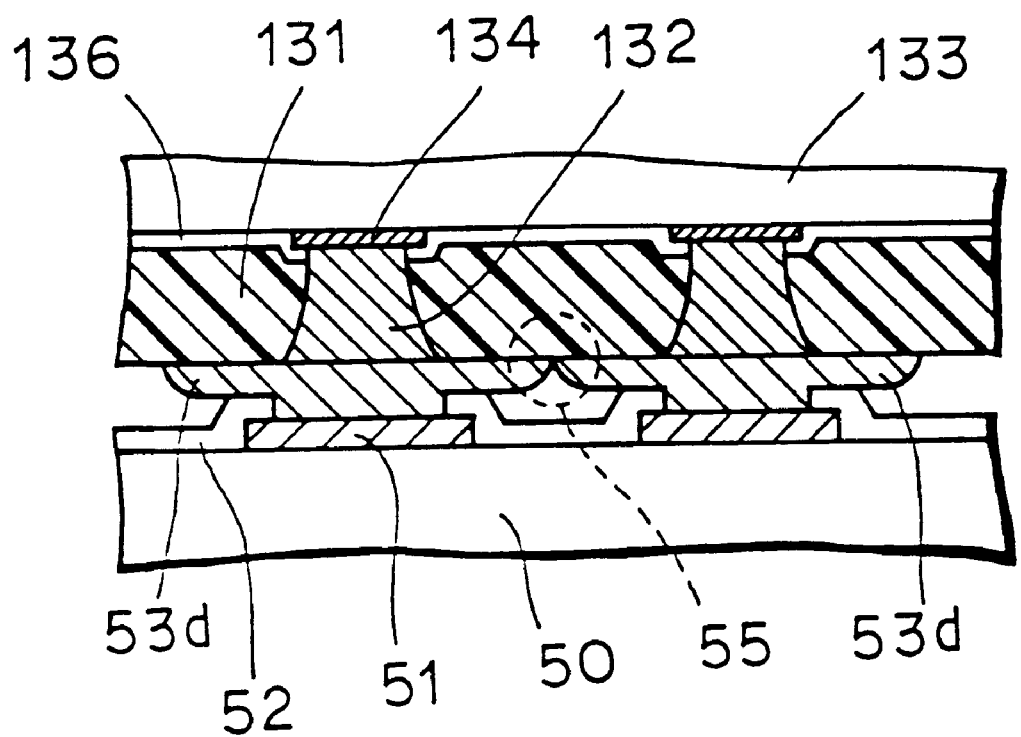
FIG. 103 is a fragmentary cross section showing a problem caused by mounting the resin seal semiconductor package shown in FIG. 99 on the printed board.
Figure 104:
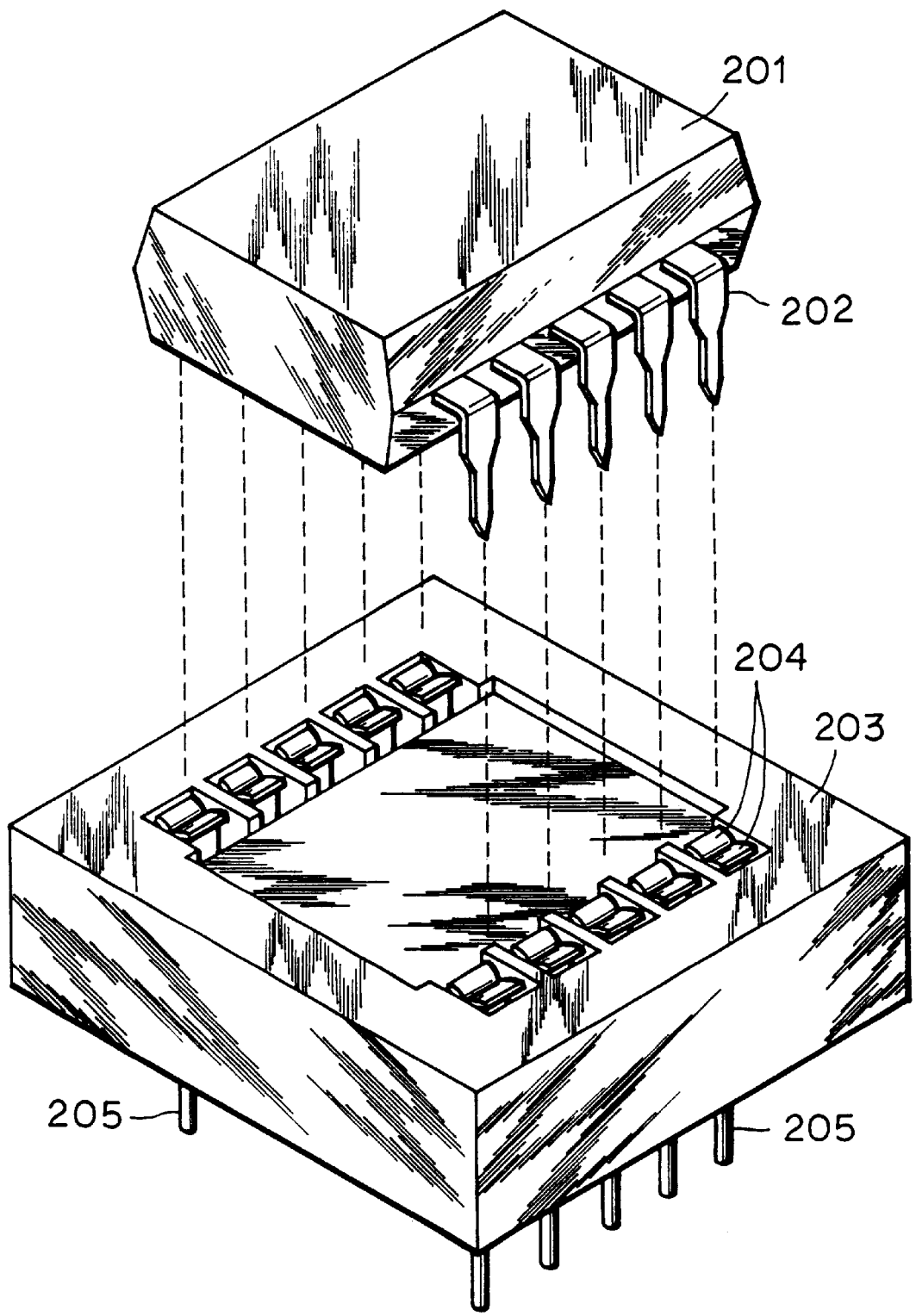
FIG. 104 is a perspective view showing a socket for evaluating a performance of a resin seal semiconductor package in the prior art.
Figure 105:
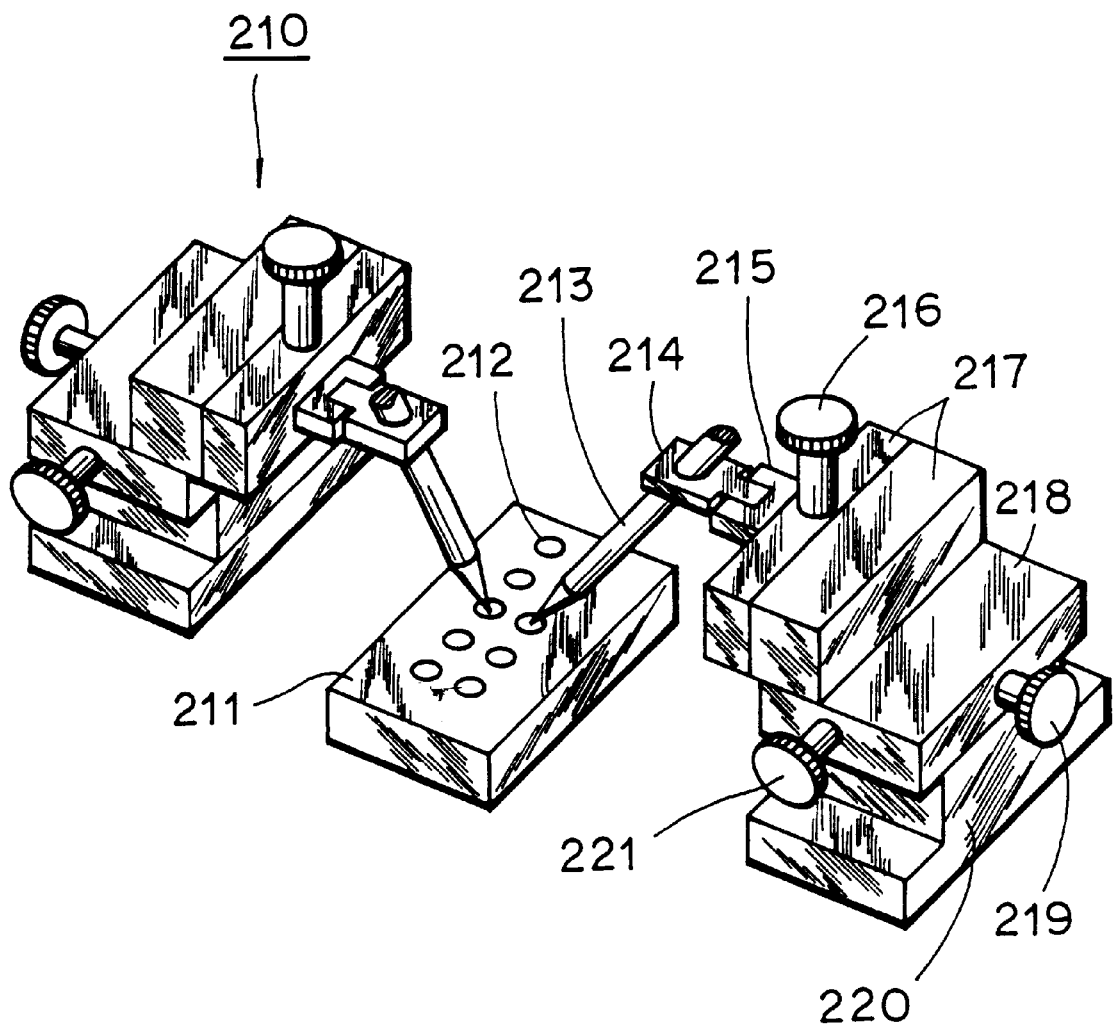
FIG. 105 is a perspective view showing a state in which a performance evaluating device having a prover is used for evaluating a performance of a resin seal semiconductor package having protruded electrodes for external connection.

Embodiments of the invention will be described below with reference to FIGS. 1–94.

First Embodiment

Figure 1:
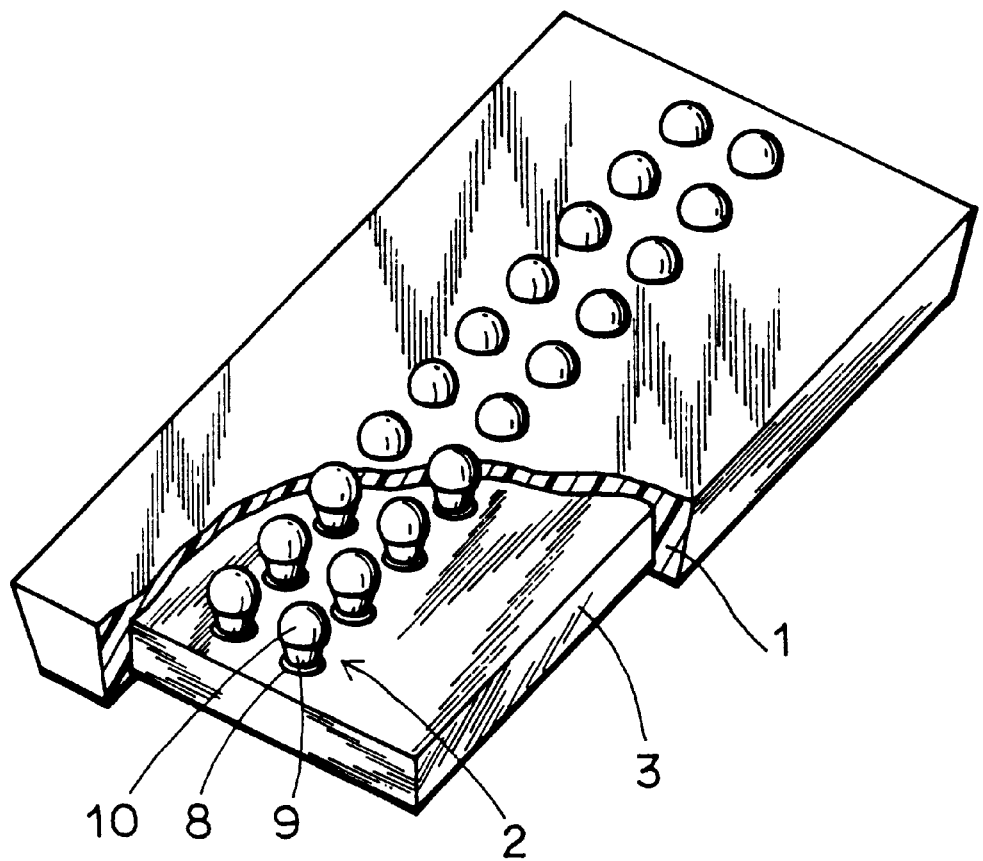
FIG. 1 is a perspective view partially in section of a resin seal semiconductor package of a first embodiment of the invention.
Figure 2:
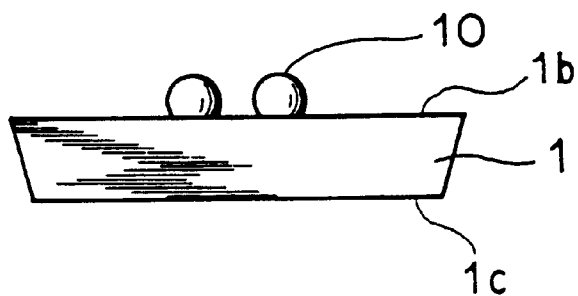
FIG. 2 is a side view of the resin seal semiconductor package shown in FIG. 1.
Figure 3:
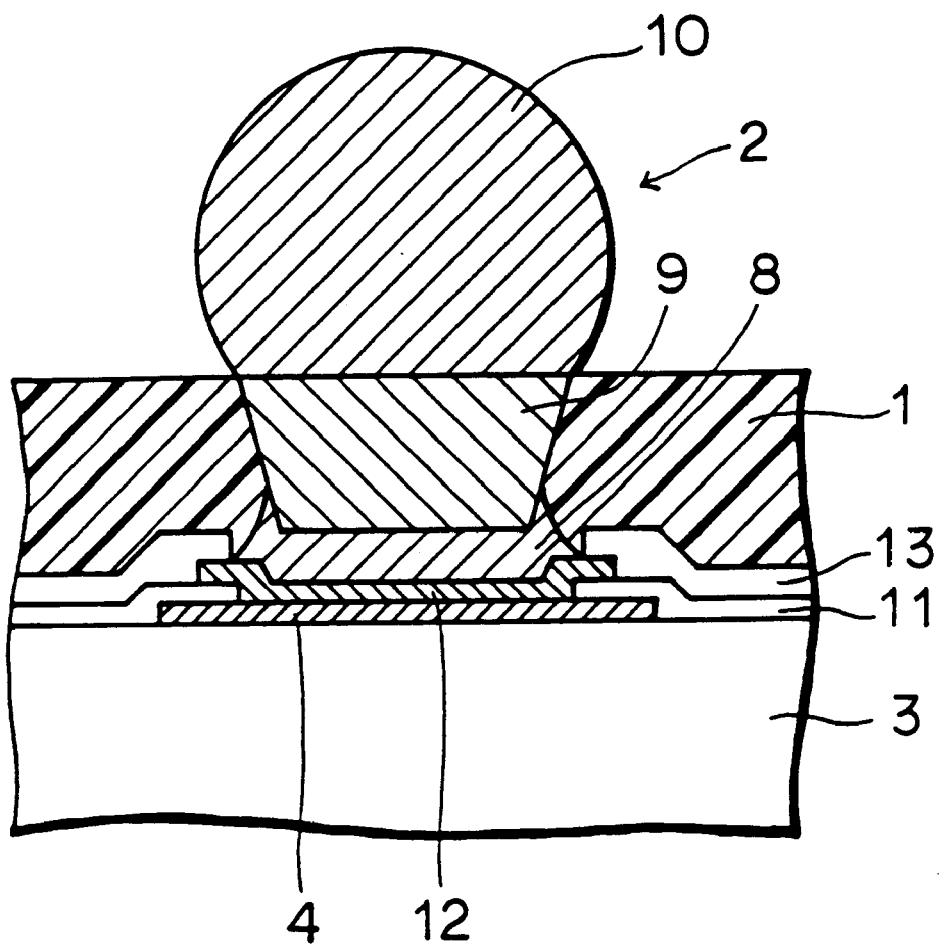
FIG. 3 is a partially enlarged cross section of an electrode part of the resin seal semiconductor package shown in FIG. 1.

FIG. 1 is a perspective view partially in section showing a resin seal semiconductor package (will be simply referred to also as "semiconductor package" hereinafter) of a first embodiment of the invention. FIG. 2 is a side view of the semiconductor package of the first embodiment shown in FIG. 1. FIG. 3 is an enlarged cross section of a portion of and around an electrode of a semiconductor package of the first embodiment shown in FIG. 1.

Referring to FIG. 1, a semiconductor chip 3 is provided at its main surface with a plurality of electrodes 2. In this example, the electrodes 2 are arranged in two rows extending near the center of the main surface of the semiconductor chip 3. Each electrode 2 includes a connection layer 8, a first conductor 9 and a second conductor 10. The surface of the semiconductor chip 3 is covered with a seal resin 1 which exposes only a portion of the surface of each second conductor 10.

Referring to FIG. 2, a side structure of the semiconductor chip of the first embodiment of the invention will be described below. Referring to FIG. 2, the semiconductor package of the first embodiment of the invention has a tapered side configuration which converges from a main surface 1b of the semiconductor package, in which the electrodes 2 are provided, toward a bottom surface 1c.

This configuration is employed in view of a direction of removing a die for molding the seal resin 1. More specifically, since the semiconductor chip has the tapered configuration described above, the die for molding the seal resin 1 can be removed in the direction in which the side configuration converges, i.e., in the direction directed from the main surface 1b of the semiconductor chip to the bottom surface 1c.

Referring to FIG. 3, a structure around the electrode 2 of the semiconductor chip of the first embodiment of the invention will be described below in detail. In FIG. 3, the semiconductor chip 3 is provided at its main surface with bonding pads 4 (only one is shown in FIG. 3). A peripheral portion of the bonding pad 4 is covered with an insulating layer 11 having an opening located on a portion of a surface of the bonding pad 4. The insulating layer 11 may be made of silicon nitride or the like. The bonding pad 4 may be made of aluminum (Al) or the like.

A base metal layer 12 is formed on the bonding pad 4. The base metal layer 12 may have a single-layer structure on a multilayer structure formed of at least one kind of material selected from the group consisting of Cr, Ti, TiN, TiW, W, Cu, Ni, Pd and Au. Preferably, the multilayer structure may be TiN/Ni/Au, Cr/Cu/Au, TiN/Pd or the like. The base metal layer 12 functions as a barrier layer which prevents diffusion of material of the bonding pad 4 and material of the connection layer 8 located on the base metal layer 12.

The base metal layer 12 is made of material having a good adhesion to the bonding pad 4 and connection layer 8. A peripheral portion of the base metal layer 12 is covered with a buffer coat film 13 which has an opening located on a portion of a surface of the base metal layer 12. The buffer coat film 13 may be formed of polyimide or the like.

The connection layer 8, which may be made of Sn—Pb solder, In—Pb solder or the like, is formed on the base metal layer 12. If the connection layer 8 is made of the solder, a thickness thereof is preferably 5 $\mu$m to 30 $\mu$m. The thickness of the connection layer 8 is determined in view of the productivity.

The reason of the above will be described below. A vapor deposition method is a typical method of forming the connection layer 8. If the vapor deposition is used, a thick connection layer 8 is not preferable because it takes a long time to form the same, resulting in a low productivity. Therefore, the connection layer 8 is relatively thin as described before.

The connection layer 8 has a tapered cross section converging toward the top surface from the bottom surface contacting the base metal layer 12. Therefore, the connection layer 8 is held more firmly by the seal resin 1 compared with the case where it has a columnar form.

The first conductor 9 is formed on the connection layer 8. The first conductor 9 is provided in view of the fact that the relatively thin connection layer 8 is employed for improving the productivity. The thickness of the first conductor 9 is preferably about 70 $\mu$m to 145 $\mu$m.

The first conductor 9 is preferably made of copper (Cu). Thus, the first conductor 9 is made of the material of which melting point is higher than that of the connection layer 8. Therefore, the first conductor 9 and the connection layer 8 can be joined together by melting the connection layer 8.

Therefore, only a small load is required for joining the first conductor 9 and the connection layer 8. Consequently, other structural components are not adversely affected by the load which is applied for joining the first conductor 9 and the connection layer 8.

The first conductor 9 has a tapered section which converges from the top surface toward the bottom surface contacting the connection layer 8. Similarly to the case of the connection layer 8, this enables the first conductor 9 to be held more firmly by the seal resin 1 compared with the case where the first conductor 9 has a straight columnar form.

Further, as shown in FIG. 3, the bottom of the first conductor 9 is buried in the connection layer 8. Therefore, the diameter of the connected portion of the first conductor 9 and connection layer 8 is nearly equal to the minimum diameter of the first conductor 9 or connection layer 8. Thus, a narrow portion is formed in the electrode 2. This further increases the holding force by the seal resin 1 which is increased owing to the tapered configuration. It is preferable that the top surface of the first conductor 9 is substantially flat. This facilitates the formation of the second conductor 10 on the first conductor 9.

The seal resin 1 sealing the semiconductor chip 3 exposes only the top surface of the first conductor 9. The thickness of the seal resin 1 is preferably about 100 $\mu$m to 150 $\mu$m. Thereby, the sizes of the semiconductor package can be made nearly equal to those of the semiconductor chip 3. This brings about the compact semiconductor package.

The second conductor 10 formed on the first conductor 9 may be made of solder or the like. The second conductor 10 in this embodiment has a substantially spherical form, but may have other lumpish form. The lumpish second conductor 10 can absorb a shearing stress caused in the semiconductor package by a difference in a coefficient of thermal expansion between the semiconductor package and the printed board. This effect is increased as the sizes of the second conductor 10 increase.

The surface of the second conductor 10 other than a portion contacting the first conductor 9 is exposed on the surface of the seal resin 1. Thus, a volume of the second conductor 10 is larger than that in the case where it is formed of a plating layer. This provides the following effect.

Figure 35:
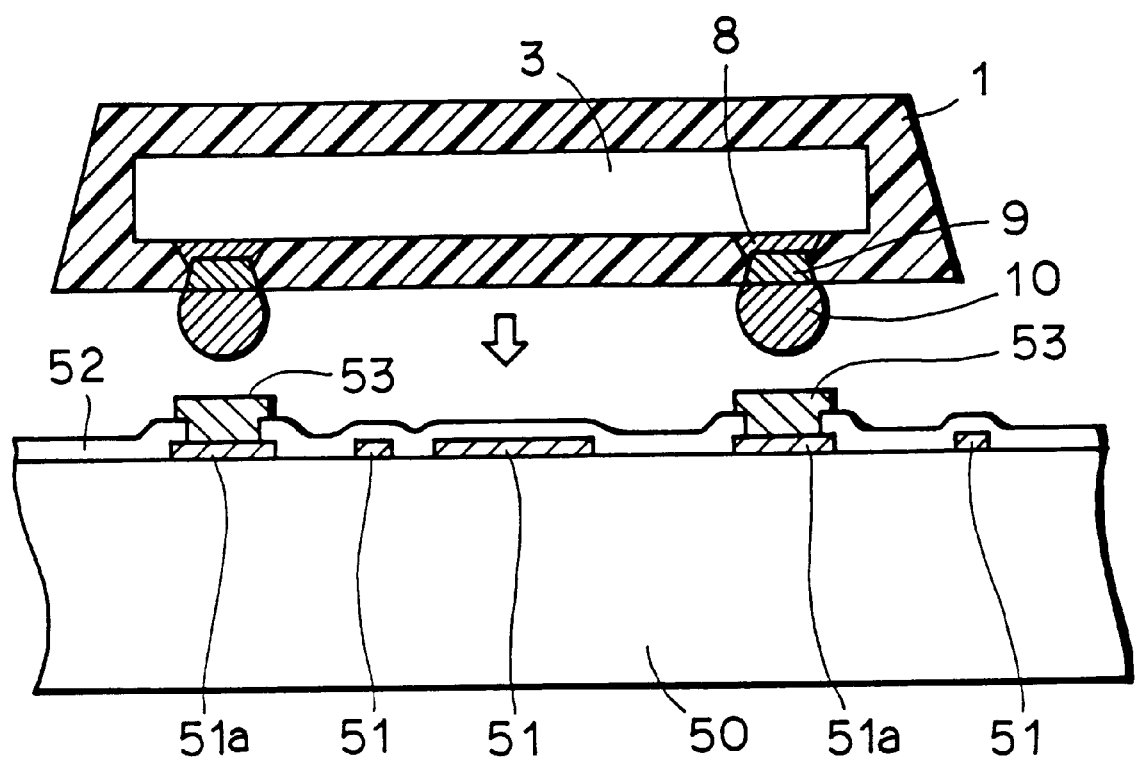
FIG. 35 is a cross section schematically showing a state in which the resin seal semiconductor package of the first embodiment of the invention is being mounted on a printed board.

The effect will be described below with reference to FIGS. 35 and 36. FIG. 35 is a cross section schematically showing a state in which the semiconductor package of the first embodiment of the invention is being mounted on a printed board 50. FIGS. 36A and 36B are fragmentary enlarged cross sections showing different steps in which electrodes of the semiconductor chip are being connected to interconnection layers 51 on the printed board 50.

Referring first to FIG. 35, interconnection layers 51 and 51a, of, for example, copper (Cu) are formed on the printed board 50. A solder resist 52 covering the interconnection layers 51 and 51a is formed on the main surface of the printed board 50. The solder resist 52 is provided with openings located on the predetermined interconnection layers 51a. Solder pastes 53 are formed in the openings for connecting the interconnection layers 51 to the electrodes of the semiconductor package.

The solder pastes 53 are formed by a screen printing. The electrodes of the semiconductor package are connected to the interconnection layers 51 on the printed board 50 through the solder pastes 53. In this example, the second conductors 10 are connected to the solder pastes 53.

Figure 36A:
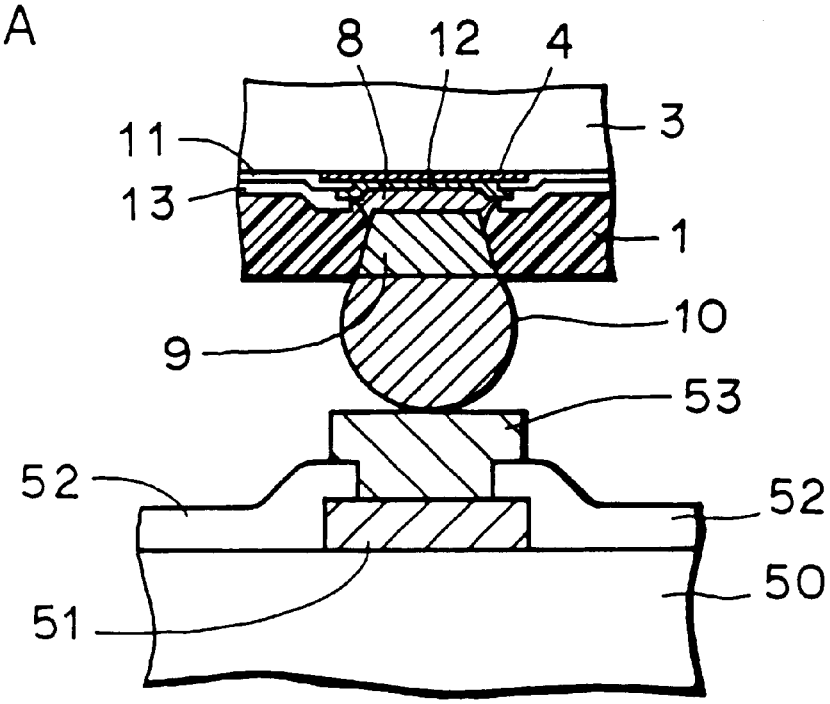
FIG. 36A is a partially enlarged cross section showing a state in which the second conductor of the resin seal semiconductor package of the first embodiment is disposed on a predetermined solder past.
Figure 36B:
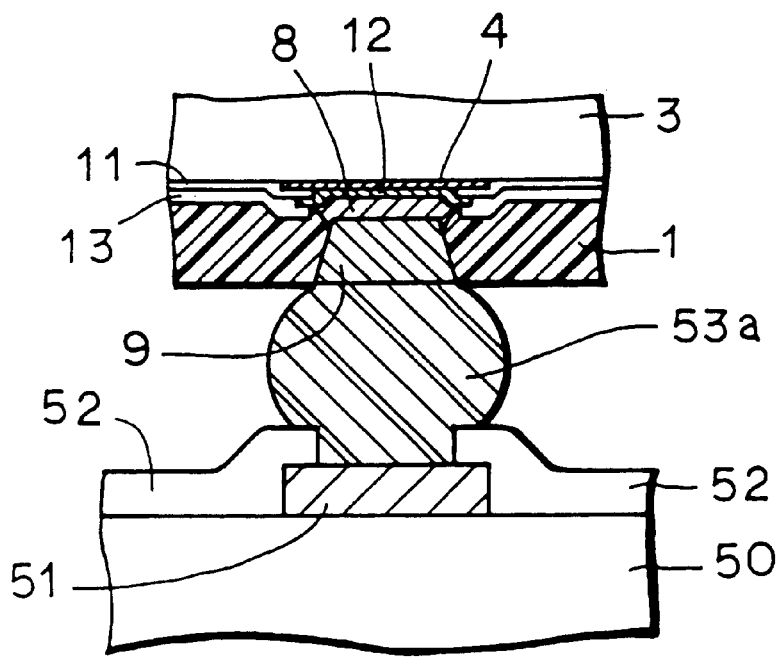
FIG. 36B is a fragmentary enlarged cross section showing a state in which the second conductor and the solder paste shown in FIG. 36A are welded together.

Referring to FIG. 36A, the second conductor 10 is first disposed above the solder paste 53. Referring to FIG. 36B, the second conductor 10 and the solder paste 53 are heated and melted to form a connection layer 53a. Since the second conductor 10 has a relatively large volume, components of the connection layer 53a are determined by components of both the solder paste 53 and second conductor 10. Therefore, different from the prior art, the components of the connection layer 53a is not dependent on the components of the solder paste 53.

Therefore, it is possible to increase fatigue strength of the connection between the electrode of the semiconductor package and the interconnection layer 51 of the printed board 50. For this increase, the amount of lead (Pb) contained in the second conductor 10 may be increased. This results in increase of an amount of lead contained in the connection layer 53a.

As described above, the fatigue strength of the connection layer 53a (connection) can be increased by increasing the amount of lead contained in the connection layer 53a. As a result, it becomes possible to improve the reliability of the connection between the electrode of the semiconductor package and the interconnection layer 51 on the printed board 50, which has been desired.

The melting point of the second conductor 10 is lower than that of the connection layer 8. Thereby, the second conductor 10 is melted and connected to the interconnection layer 51 on the printed board 50 without melting the connection layer 8. This prevents a problem that reaction between the base metal layer 12 and the connection layer 8 is promoted, which may be caused if the connection layer 8 melts.

If the second conductor 10 is made of solder, the ratio of lead (Pb) in the second conductor 10 is preferably about 40% to 90%. In this case, if the connection layer 8 is made of solder, the ratio of lead (Pb) in the connection layer 8 is about 70% to 100%.

Referring now to FIGS. 4–24, a method of manufacturing the semiconductor package of the first embodiment will be described below. FIGS. 4–12 are perspective views and fragmentary cross sections which show different steps of manufacturing the semiconductor package of the first embodiment of the invention. FIGS. 13–24 particularly show an electrode part of the semiconductor package, and are fragmentary cross sections showing 1st to 12th steps in the manufacturing process of the semiconductor package of the first embodiment, respectively.

Figure 4:
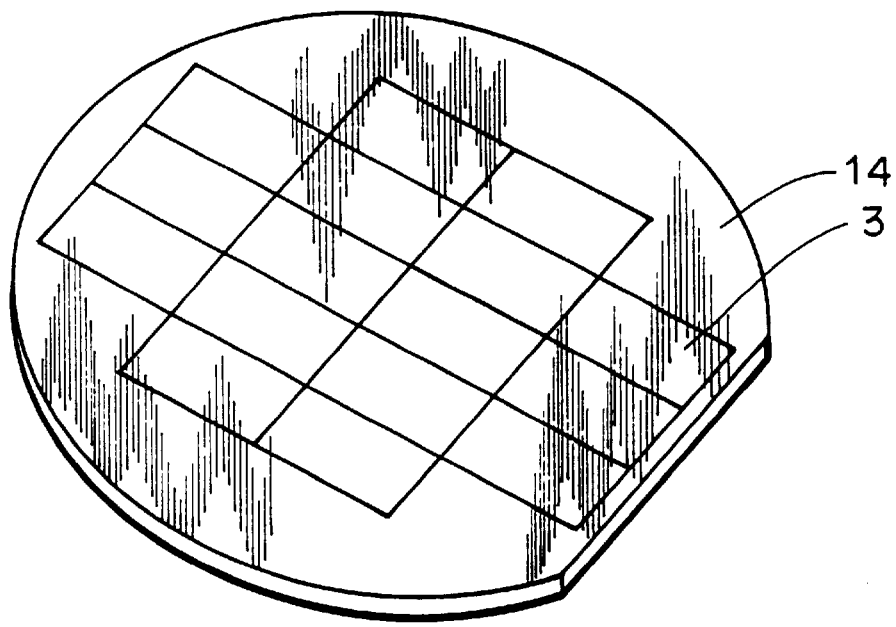
FIG. 4 is a perspective view showing a state in which elements are formed on semiconductor chips in a step of manufacturing the resin seal semiconductor package of the first embodiment of the invention.
Figure 13:
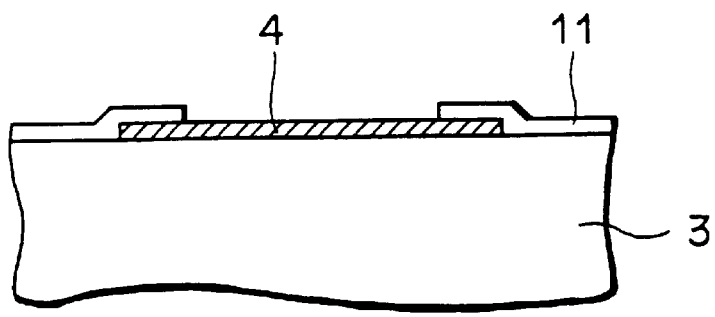
FIGS. 13–24 are fragmentary cross sections showing 1st to 12th steps of in a process of manufacturing the resin seal semiconductor package of the first embodiment of the invention, respectively.

Referring to FIG. 4, a plurality of semiconductor chips 3 each provided with a predetermined number of elements are formed on a semiconductor wafer 14. Sectional structures of and around the electrode in this step are shown in FIG. 13. Referring to FIG. 13, the bonding pad 4, made of aluminum (Al), for example, is formed on the main surface of the semiconductor chip 3. Further, the insulating layer 11 having the opening located on a predetermined portion of the bonding pad 4 is formed on the main surface of the semiconductor chip 3.

Figure 5:
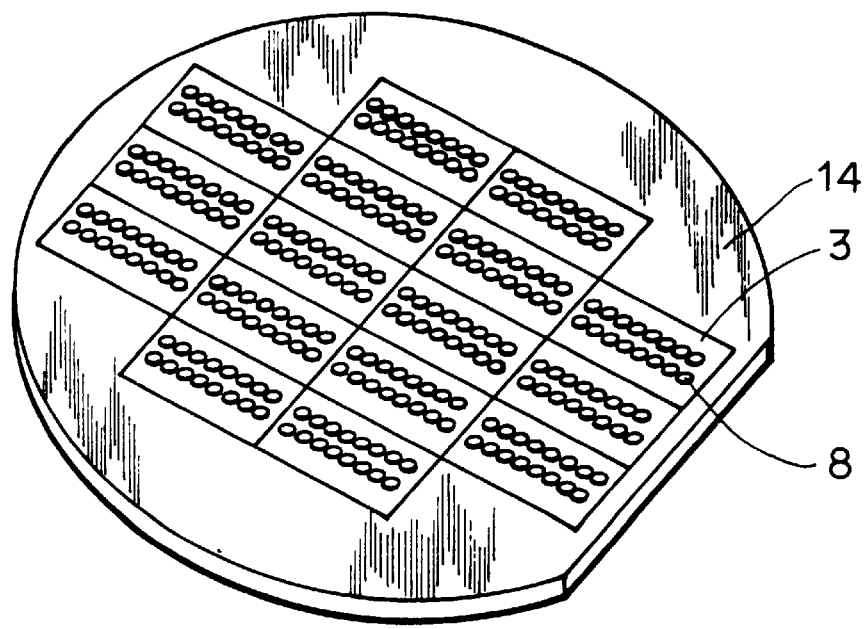
FIG. 5 is a perspective view showing a state in which connection layers are formed in a step of manufacturing the resin seal semiconductor package of the first embodiment of the invention.

Referring to FIG. 5, the base metal layers 12 and the connection layers 8 are formed on the bonding pads 4. Sectional structures of and around the electrode of the semiconductor package in the state are shown in FIGS. 14–18. This step will be described below in greater detail with reference to FIGS. 14–18.

Figure 14:
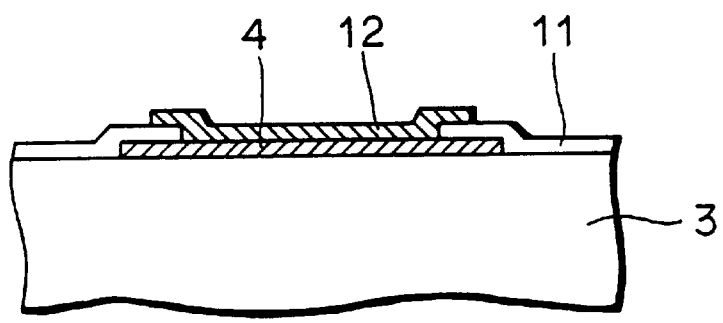

In FIG. 14, a spattering method or the like is used to form, for example, a Cr/Cu/Au layer at least on the bonding pad 4. By photolithography or etching, the Cr/Cu/Au layer is patterned to form the base metal layer 12 on the bonding pad 4. Cr/Cu/Au layer may have a single-layer structure on a multilayer structure formed of at least one kind of material selected from the group consisting of Cr, Ti, TiN, TiW, W, Cu, Ni, Pd and Au. Preferably, the multilayer structure may be TiN/Ni/Au, Cr/Cu/Au, TiN/Pd or the like.

The base metal layer 12 thus formed has an end laid on the insulating layer 11. In a subsequent step of forming the seal resin 1, this structure prevents moisture contained in the seal resin material from flowing into the elements formed in the main surface of the semiconductor chip 3.

Figure 15:
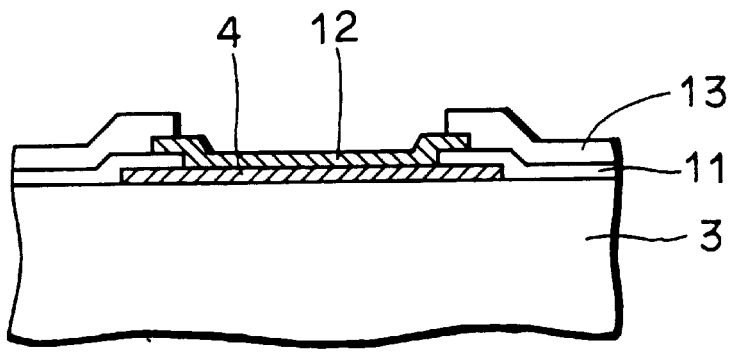

Referring to FIG. 15, a spin-coat method is used to deposit a buffer coat film 13, made of polyimide, for example, entirely on the main surface of the semiconductor chip 3. By the photolithography and etching, the buffer coat film 13 is patterned to expose a portion of the surface of the base metal layer 12. The buffer coat film 13 is preferably formed to have an end laid on the end of the base metal layer 12.

Figure 16:
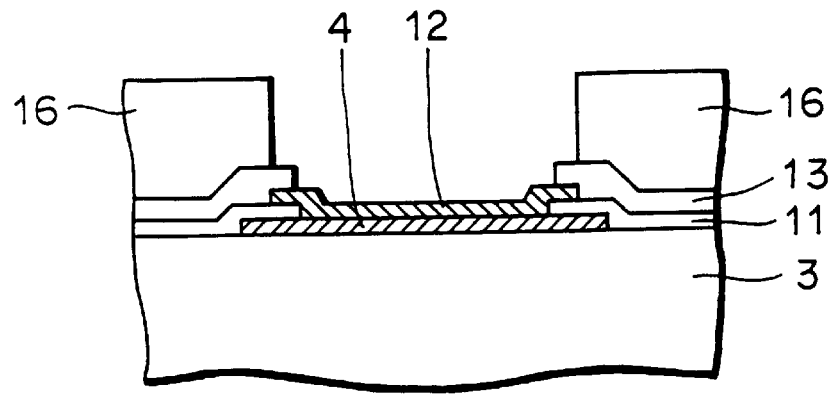
Figure 17:
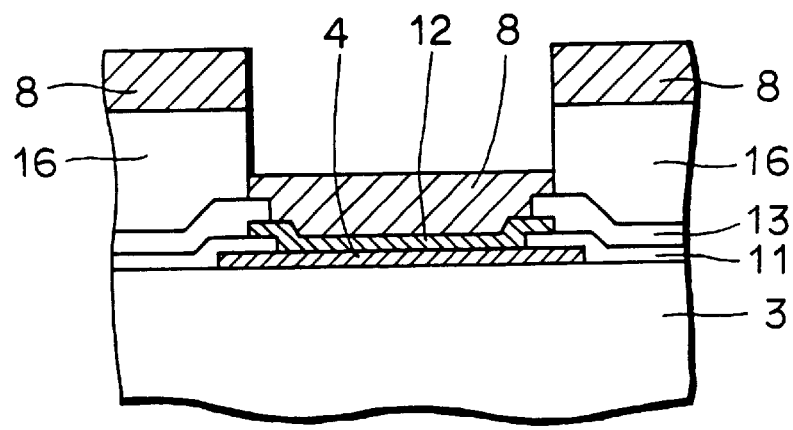

Referring to FIG. 16, a resist 16 is applied to the main surface of the semiconductor chip 3. The resist 16 is patterned to expose a portion of the surface of the base metal layer 12. Referring to FIG. 17, a vacuum deposition is carried out to deposit material of connection layer 8 such as solder. The material of connection layer 8 is located mainly on the resist. 16 and the base metal layer 12. The thickness of the connection layer 8 is set at a relatively small value of about 5 µm to 30 µm. Therefore, the productivity is not reduced.

Figure 18:
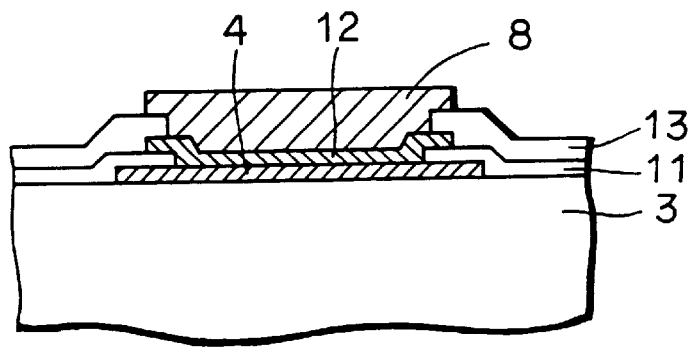

Referring to FIG. 18, a lift-off method is used to remove the resist 16 together with the material of connection layer 8 formed on the resist 16. As a result, the connection layer 8 remains only on the base metal layer 12. Preferably, the connection layer 8 is formed on the entire surface of the base metal layer 12.

Figure 6:
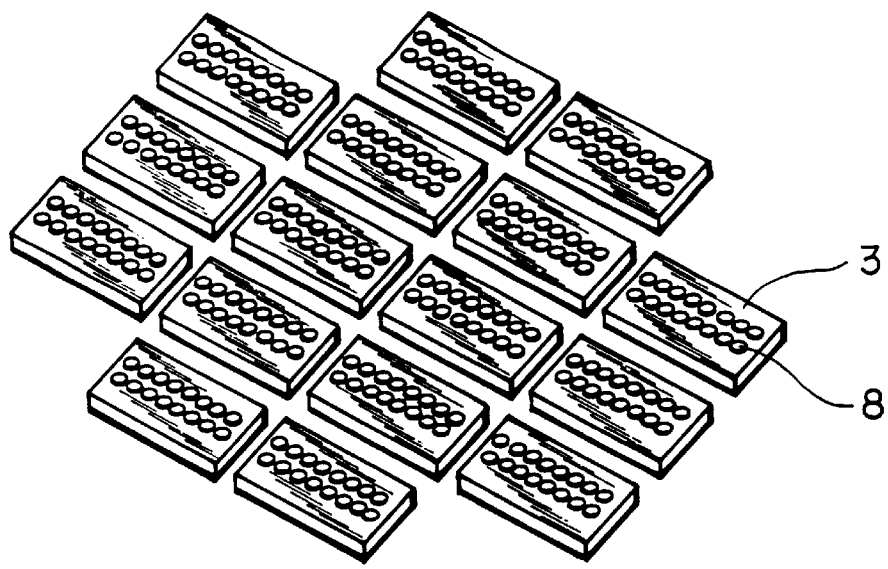
FIG. 6 is a perspective view showing a state in which a plurality of semiconductor chips are separated from each other in a step of manufacturing the resin seal semiconductor package of the first embodiment of the invention.
Figure 7:
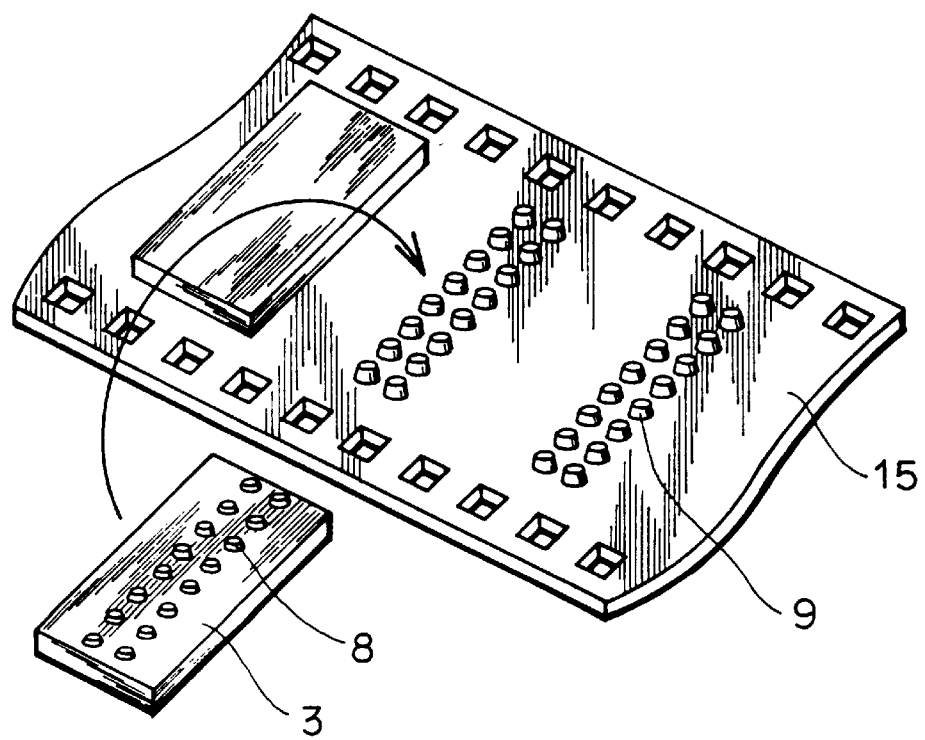
FIG. 7 is a perspective view showing a state in which first conductors are being laid on connection layers in a step of manufacturing the resin seal semiconductor package of the first embodiment of the invention.

Referring to FIG. 6, the semiconductor wafer 14 is cut into a plurality of semiconductor chips 3, with, for example, a diamond cutter. Referring to FIG. 7, materials of the first conductors 9, made of copper (Cu), for example, are formed on an elongate insulating base plate (tape carrier or the like) 15, made of polyimide, for example.

Figure 19:
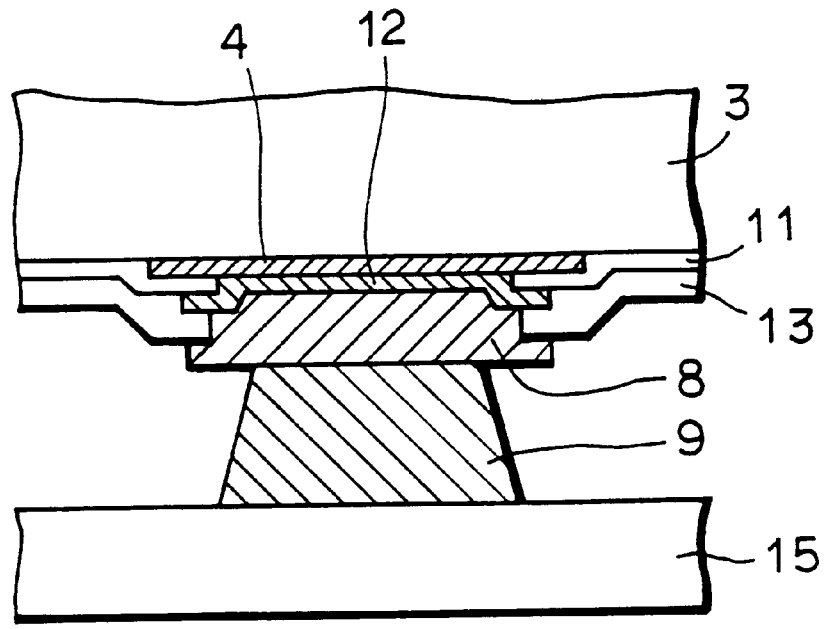

The materials of first conductors 9 are located at positions corresponding to positions of the connection layers 8 formed on the main surface of the semiconductor chip 3. As indicated by arrow in FIG. 7, the semiconductor chip 3 is turned over so that the connection layers 8 are disposed on the materials of first conductors 9. Sectional structures of and around the electrode in this stage are shown in FIG. 19.

Figure 8:
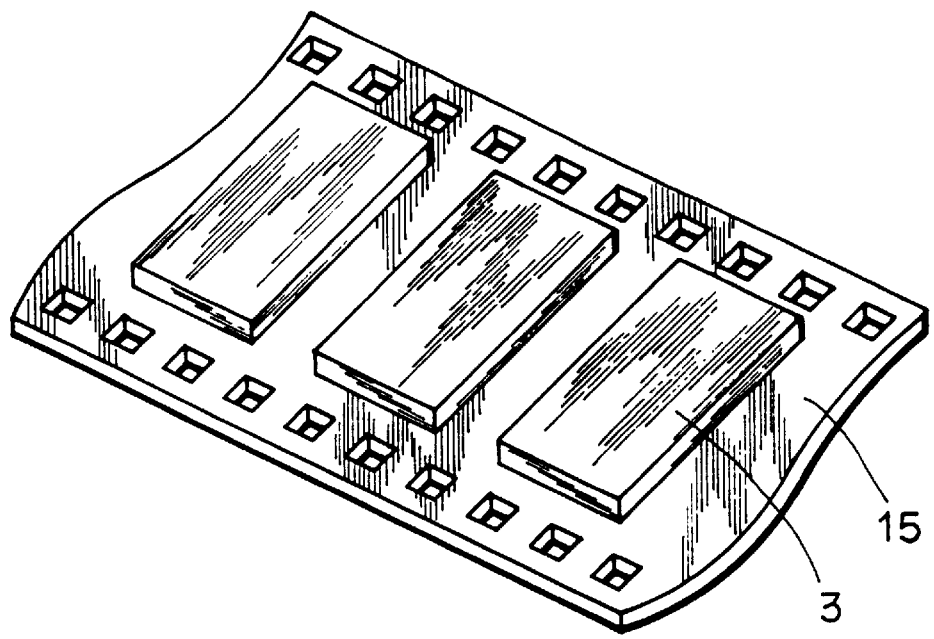
FIG. 8 is a perspective view showing a state in which the first conductors are being welded to the connection layers in a step of manufacturing the resin seal semiconductor package of the first embodiment of the invention.
Figure 20:
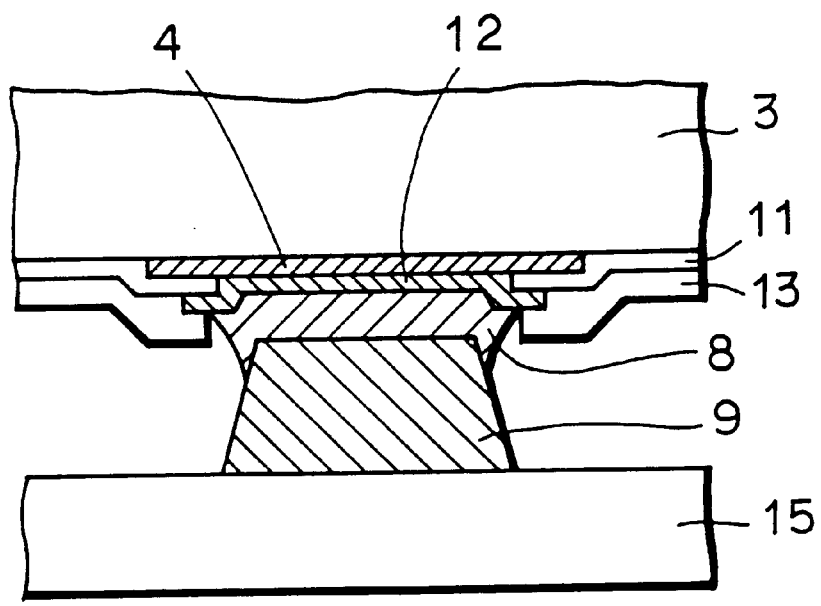

Referring to FIG. 8, the materials of first conductors 9 are bonded to the connection layers 8 by applying heat to the semiconductor chips 3 disposed on the insulating base plate 15. Sectional structures of and around the electrode of the semiconductor package in this stage are shown in FIG. 20. Referring to FIG. 20, the connection layer 8 is melted to bond the material of first conductor 9 and the connection layer 8 together. Thereby, the bottom of the first conductor 9 is buried in the connection layer 8.

Since the wettability between the materials of connection layer 8 and base metal layer 12 is good, the melted connection layer 8 spreads over the whole surface of the base metal layer 12. Thereby, the connection layer 8 has the section which converges toward its top surface from its bottom surface contacting the base metal layer 12.

Figure 9:
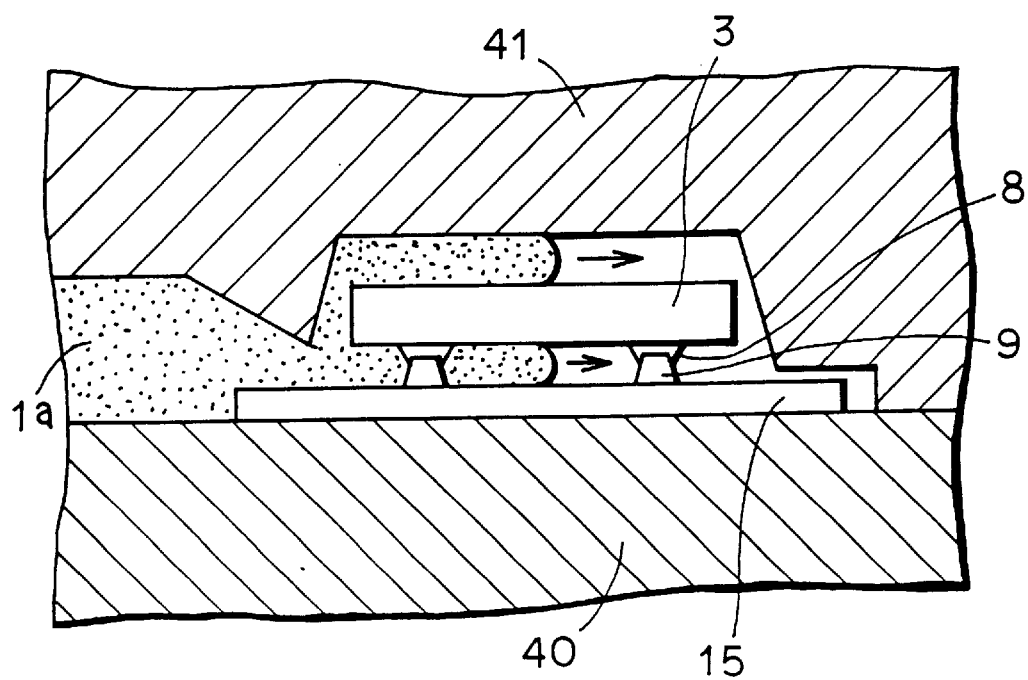
FIG. 9 is a cross section showing a state in which an insulating base plate and a semiconductor chip laid thereon are disposed within dies and resin is being supplied thereinto.

Referring to FIG. 9, first and second molding dies 40 and 41 are arranged around the insulating base plate 15 and the semiconductor chip 3 disposed thereon. Resin la is supplied into the first and second molding dies 40 and 41 to form the seal resin 1.

Figure 10:
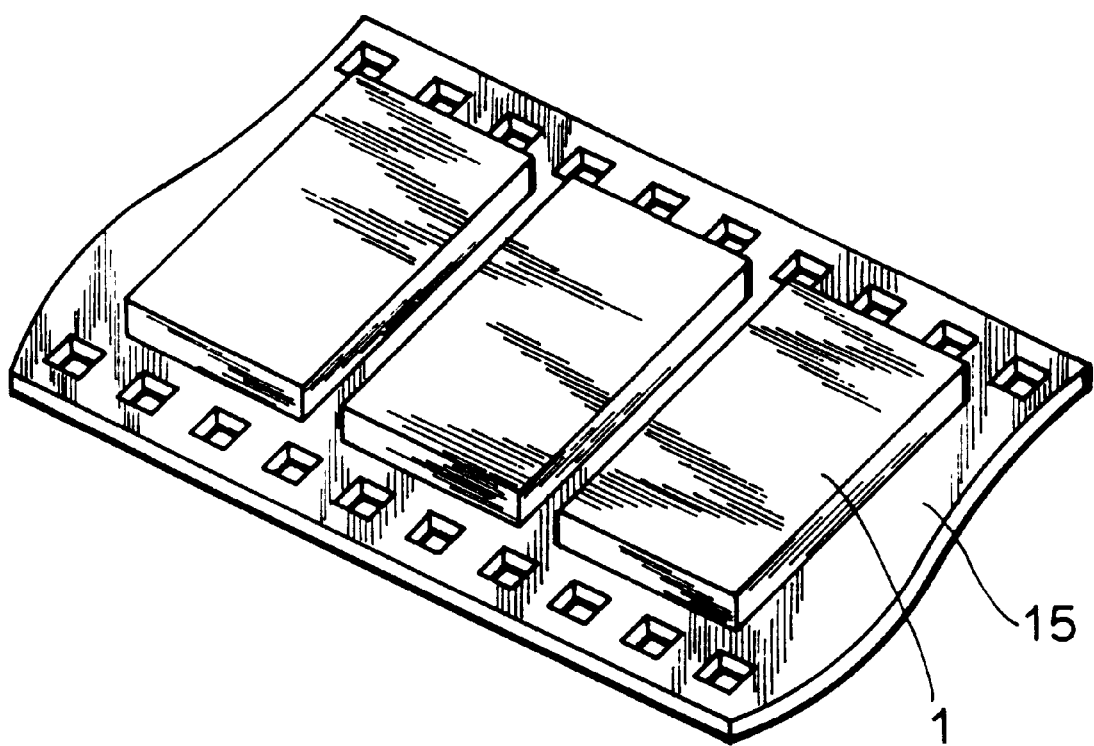
FIG. 10 is a perspective view showing a state in which a seal resin is formed in a step of manufacturing the resin seal semiconductor package of the first embodiment of the invention.
Figure 21:
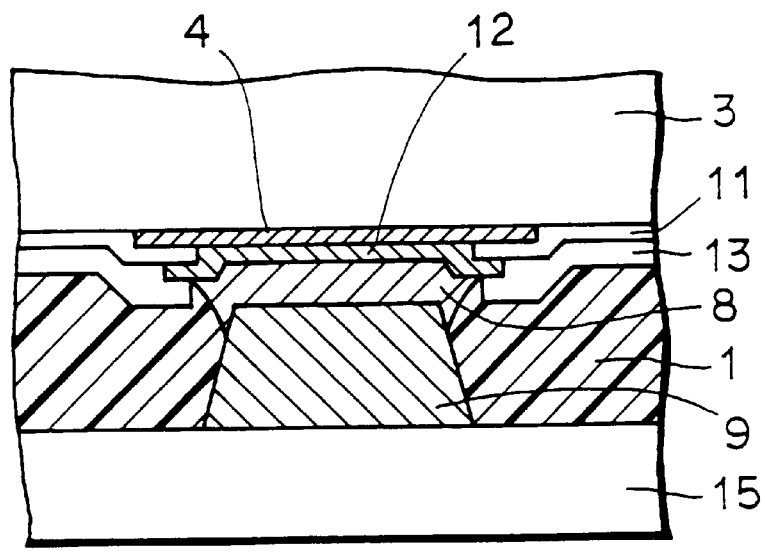

Then, the first and second molding dies 40 and 41 are removed from the seal resin 1 as shown in FIG. 10. Structures of and around the electrode of the semiconductor package in this stage are shown in FIG. 21. Referring to FIG. 21, hermetic seal resin 1 can be formed by supplying the resin after forming the connection layer 8 and the first conductor 9. Since the first conductor 9 and the connection layer 8 each have a tapered form, the holding forces applied thereto by the seal resin 1 are larger than those in the case where the first conductor 9 and the connection layer 8 have straight columnar forms.

Figure 11:
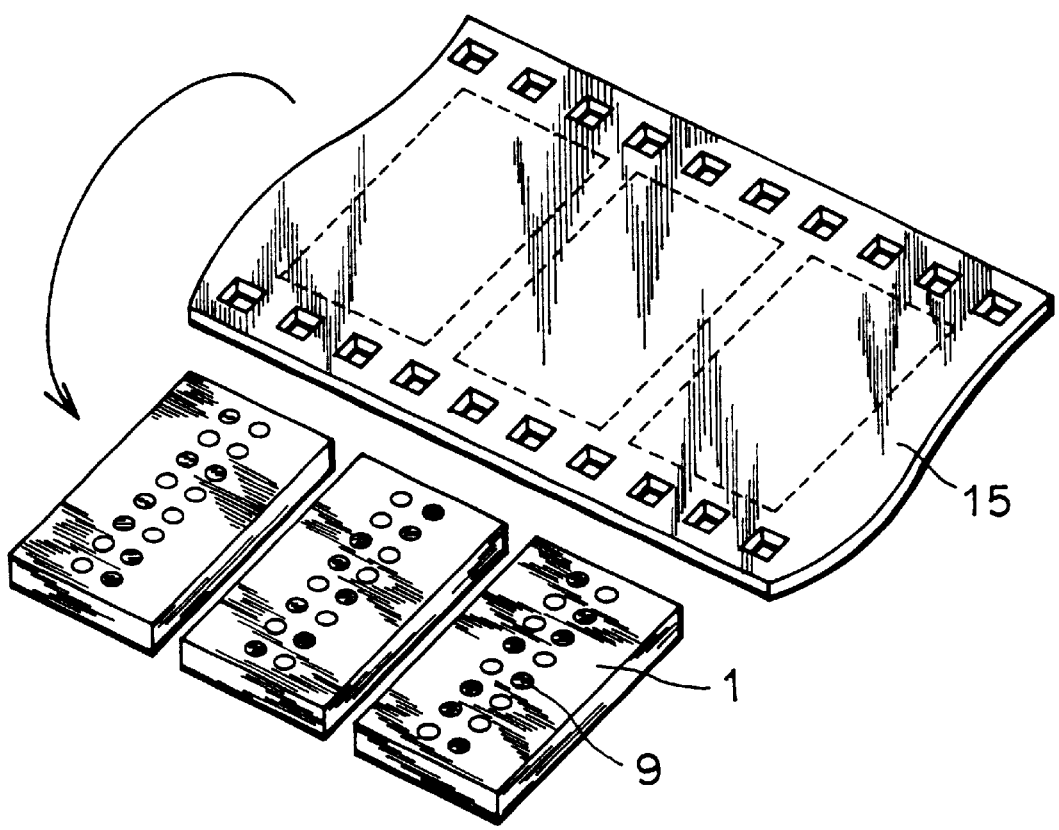
FIG. 11 is a perspective view showing a state in which the semiconductor chips are separated from the insulating base plates after forming the seal resin in a step of manufacturing the resin seal semiconductor package of the first embodiment of the invention.
Figure 22:
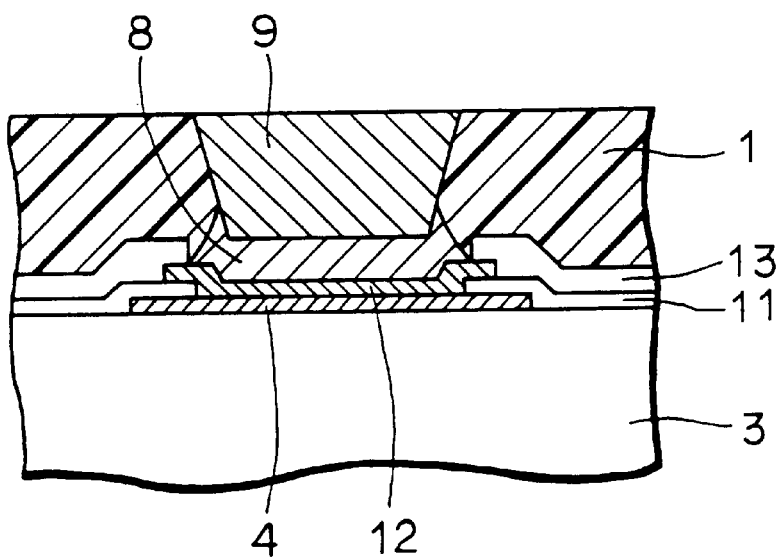

Referring to FIG. 11, the top surfaces of the first conductors 9 and the seal resin 1 are separated from the insulating base plate 15. Sectional structures of and around the electrode of the semiconductor package are shown in FIG. 22. Referring to FIG. 22, the top surface of the first conductor 9 was substantially flattened by the insulating base plate 15 which is removed after forming the seal resin 1 as described above. Also, the top surface of the first conductor 9 is substantially coplanar with the surface of the seal resin 1. Thereby, the material of second conductor 10 can be easily formed on the top surface of the first conductor 9 in a subsequent step.

Figure 12:
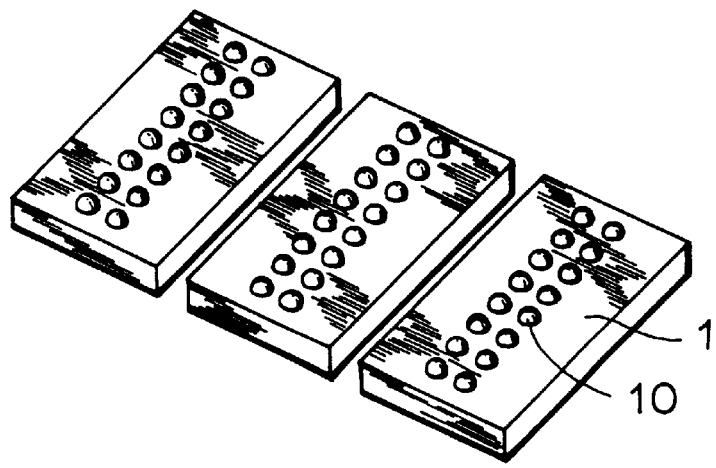
FIG. 12 is a perspective view showing a state in which second conductors are being formed on top surfaces of first conductors in a step of manufacturing the resin seal semiconductor package of the first embodiment of the invention.
Figure 23:
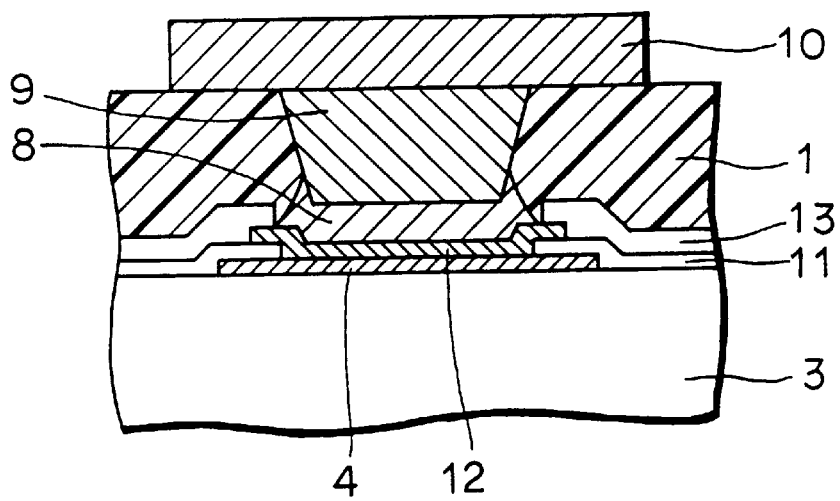

Referring to FIG. 12, the second conductors 10 are formed on the exposed top surfaces of the first conductors 9. Sectional structures of and around the electrode of the semiconductor package in this stage are shown in FIGS. 23 and 24. In FIG. 23, the material of second conductor 10 is deposited on the top surface of the first conductor 9 by a screen printing method.

Figure 24:
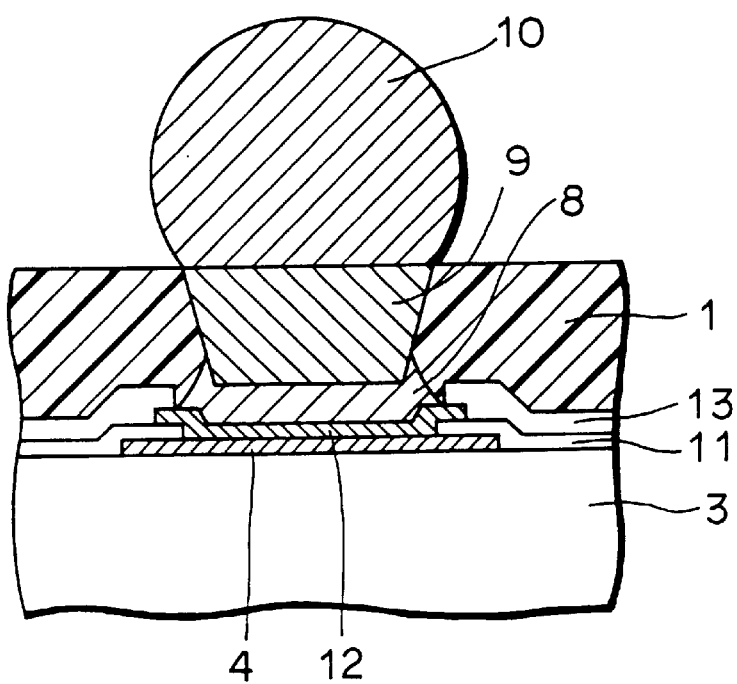

Referring to FIG. 24, the material of second conductor 10 shown in FIG. 23 is heated to melt, so that the second conductor 10 in a lumpish form is formed on the top surface of the first conductor 9. In this example, the second conductor 10 is nearly spherical. Owing to the provision of the lumpish second conductor 10, it is possible to improve the reliability of the connection between the printed board 50 and the semiconductor package as described before.

Second Embodiment

Figure 25:
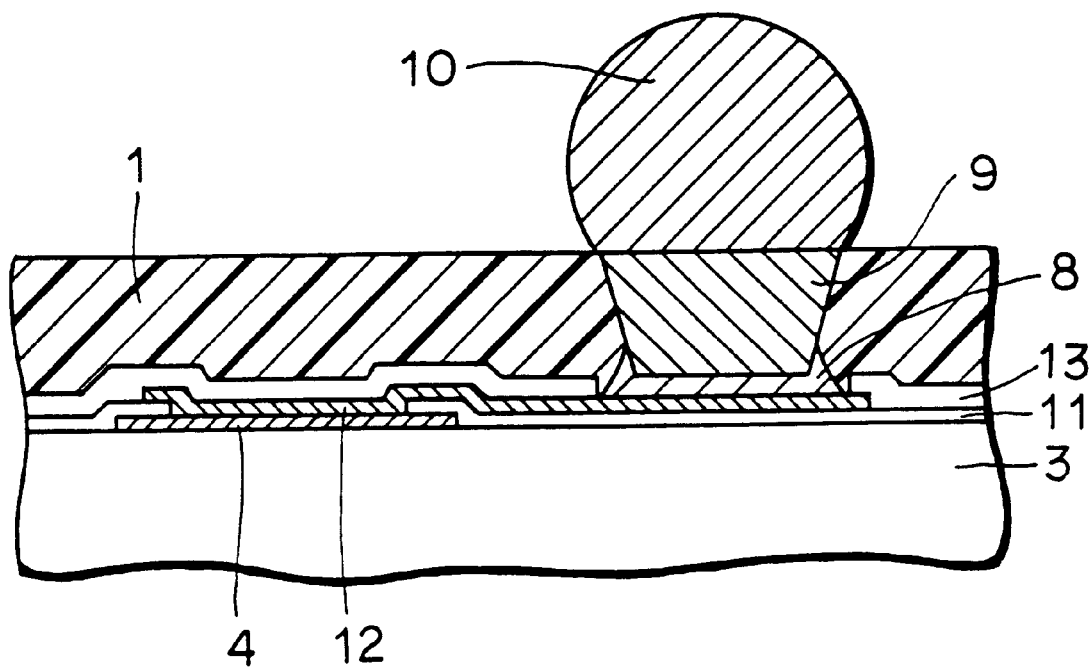
FIG. 25 is a fragmentary cross section showing a resin seal semiconductor package of a second embodiment of the invention.

Referring to FIG. 25, a semiconductor package of a second embodiment of the invention will be described below. FIG. 25 is a fragmentary cross section showing the semiconductor package of the second embodiment. In the embodiment shown in FIG. 25, the base metal layer 12 extends from a position on the bonding pad 4 to a position shifted therefrom in the main surface direction of the semiconductor chip 3. In other words, the base metal layer 12 has an extended portion located over a region of the main surface of the semiconductor chip 3 on which the bonding pad 4 is not formed. The connection layer 8, first conductor 9 and second conductor 10 are formed on the extended portion.

Since the base metal layer 12 is thus extended, it becomes not essential to form an electrode for connection to an external equipment on the bonding pad 4 as in the prior art. An area of the bonding pad 4 can therefore be reduced. Consequently, it becomes possible to promote high integration of elements formed in the main surface of the semiconductor chip 3.

Since the electrodes can be selectively formed in various positions, such an advantage is also obtained that the degree of freedom of the layout of elements on the semiconductor chip as well as the degree of freedom of connection between external equipments and the semiconductor package are improved. Further, the connection layer 8 in this embodiment may be formed on the element formed in the main surface of the semiconductor chip. Only small loads are required for joining the connection layer 8 and the first conductor 9 and bonding the first and second conductors 9 and 10. Therefore, even if the connection layers 8 as well as the first and second conductors 9 and 10 are formed on the elements, the loads for forming them do not adversely affect the elements located under them.

Third Embodiment

Figure 26:
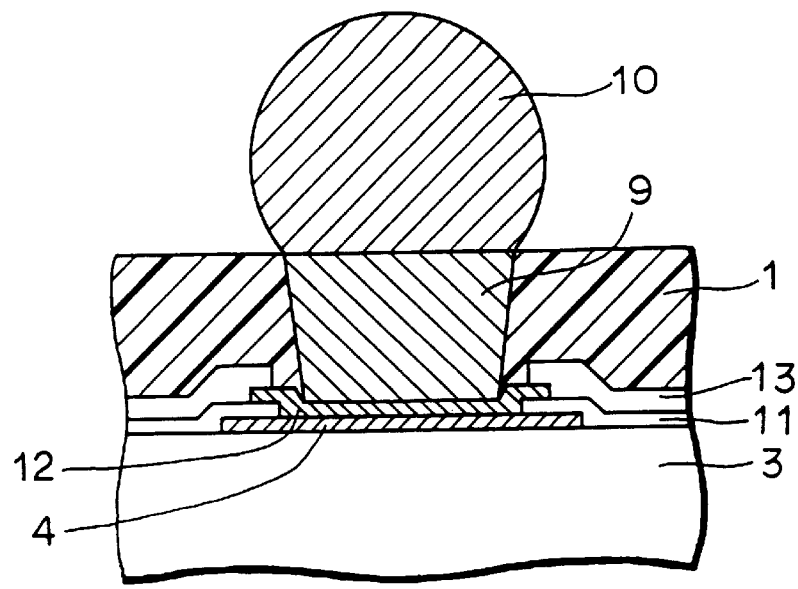
FIG. 26 is a fragmentary cross section showing a resin seal semiconductor package of a third embodiment of the invention.
Figure 27:
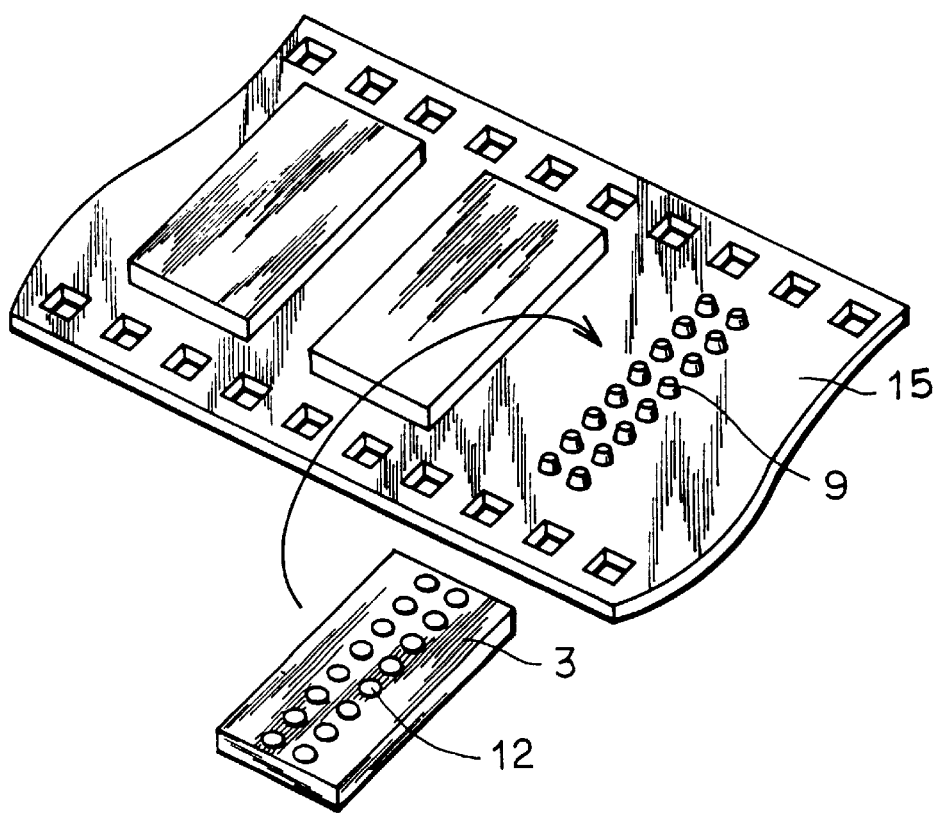
FIG. 27 is a perspective view showing a distinctive step of manufacturing the resin seal semiconductor package of the third embodiment shown in FIG. 26.

Referring to FIGS. 26 and 27, a third embodiment of the invention will be described below. FIG. 26 is a fragmentary cross section showing a semiconductor package of the third embodiment. FIG. 27 is a perspective view showing a distinctive manufacturing method of the semiconductor package of the third embodiment shown in FIG. 26.

In the embodiment shown in FIG. 26, the first conductor 9 is formed on the base metal layer 12 with a thin film (not shown) such as a solder plating layer interposed therebetween. Structures other than this are similar to those of the first embodiment. Therefore, the second embodiment achieves substantially the same effect as the semiconductor package of the first embodiment.

In a method of manufacturing this embodiment, the first conductors 9 are formed on the insulating base plate 15 in a manner similar to that of the first embodiment as shown in FIG. 27. The solder plating layers (not shown) are formed on the top surfaces of first conductors 9.

The base metal layers 12 formed on the main surface of the semiconductor chip 3 are disposed on the first conductors 9 bearing the solder plating layers. The solder plating layers on the first conductors 9 are melted and simultaneously a small load is applied thereto, so that the first conductors 9 are bonded to the base metal layers 12. Manufacturing steps other than the above are similar to those of the first embodiment.

Fourth Embodiment

Figure 28:
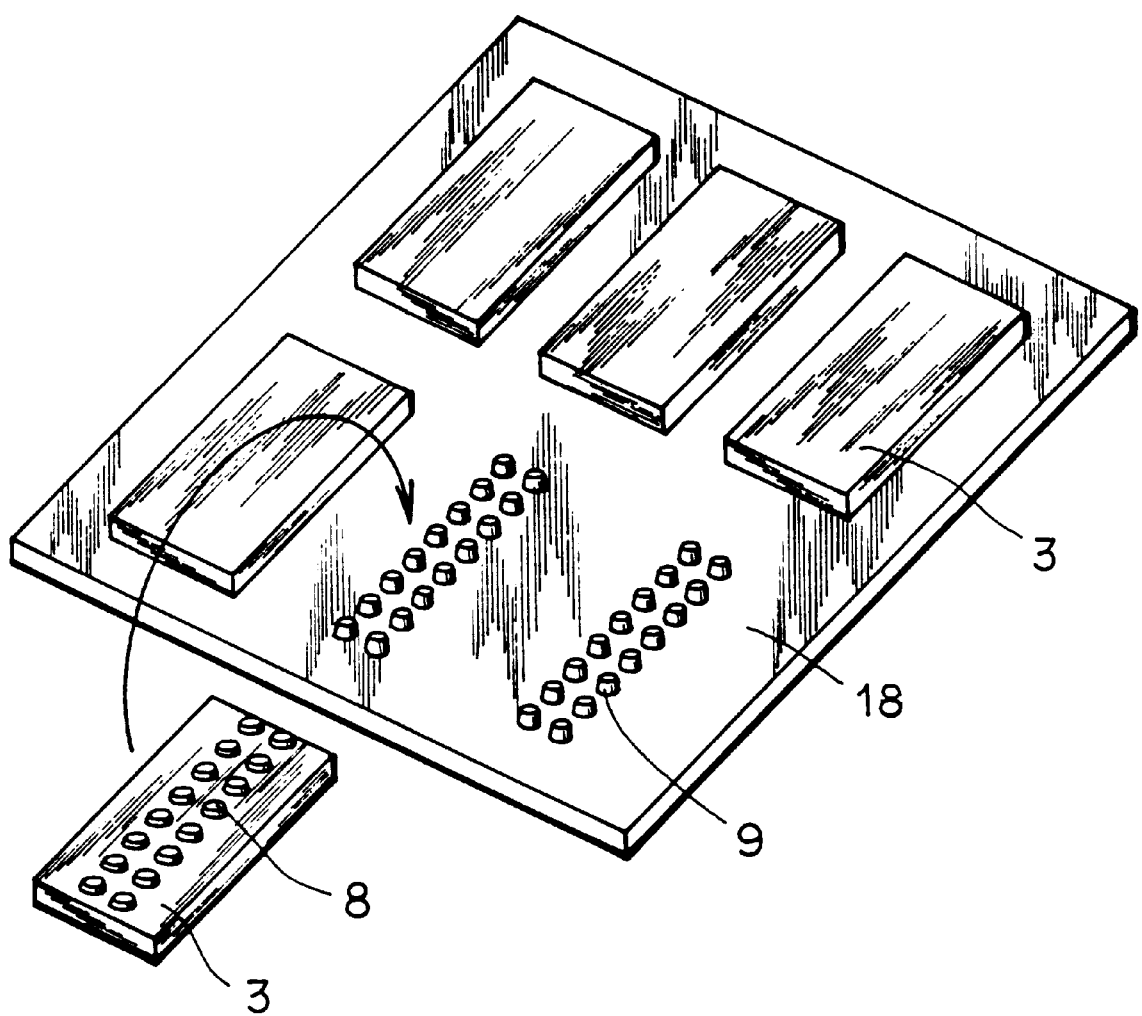
FIG. 28 is a perspective view showing a distinctive step in a method of manufacturing the resin seal semiconductor package of a fourth embodiment of the invention.

Referring to FIG. 28, a method of manufacturing a semiconductor package of a fourth embodiment of the invention will be described below. FIG. 28 is a perspective view showing a distinctive step in this embodiment. In the embodiment shown in FIG. 28, materials of the first conductors 9 are formed on a base plate 18 made of glass or the like. Manufacturing steps other the above are similar to those of the first embodiment.

Fifth Embodiment

Figure 29:
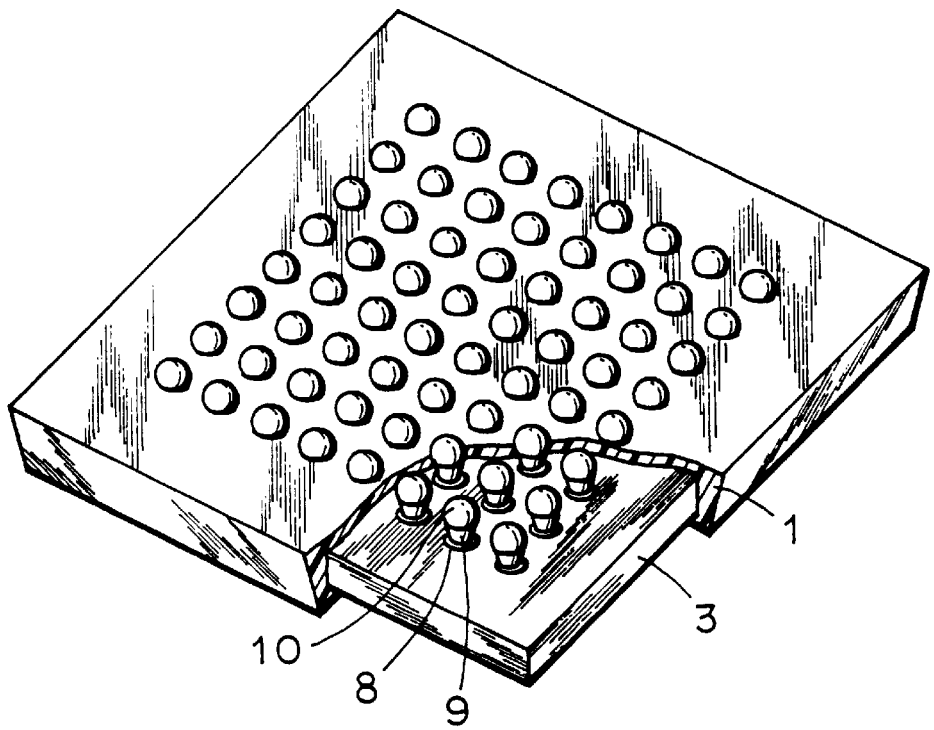
FIGS. 29–34 are perspective views partially in section showing 5th to 10th embodiments of the invention.

Referring to FIG. 29, a semiconductor package of a fifth embodiment of the invention will be described below. FIG. 29 is a perspective view partially in section showing a semiconductor package of the fifth embodiment of the invention. In the respective embodiments already described, the second conductors 10 are arranged in two rows extending near the center of the main surface of the semiconductor package. In FIG. 29, however, the second conductors 10 are arranged in a matrix form on the main surface of the semiconductor package.

Sixth Embodiment

Figure 30:
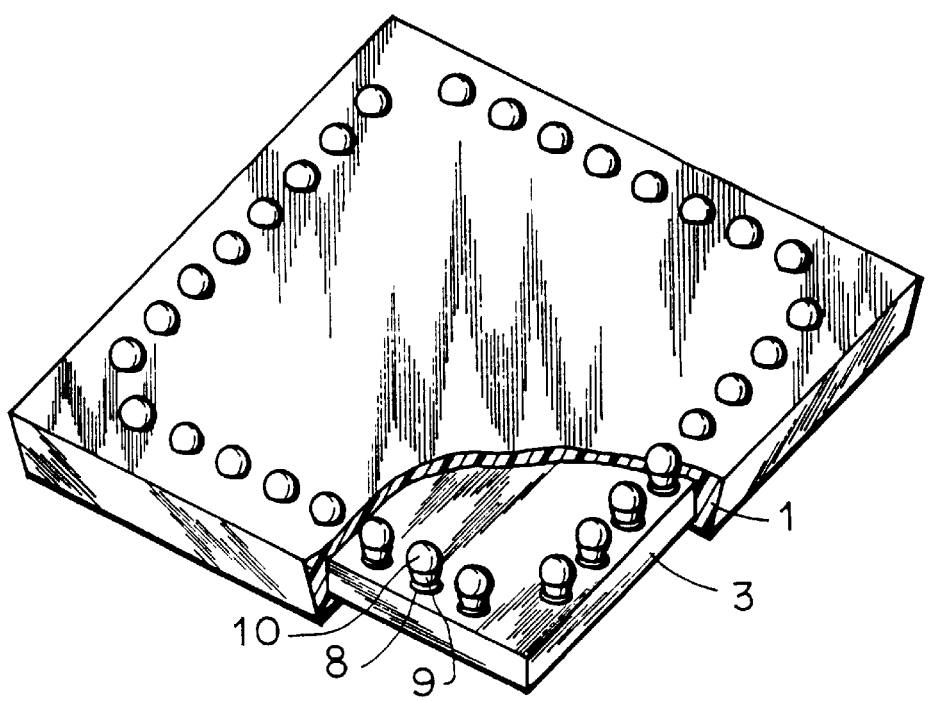

Referring to FIG. 30, a sixth embodiment of the invention will be described below. FIG. 30 is a perspective view partially in section showing a semiconductor package of the sixth embodiment of the invention. In this embodiment, the second conductors 10 are arranged in one row extending along four sides defining the main surface of the semiconductor package.

Seventh Embodiment

Figure 31:
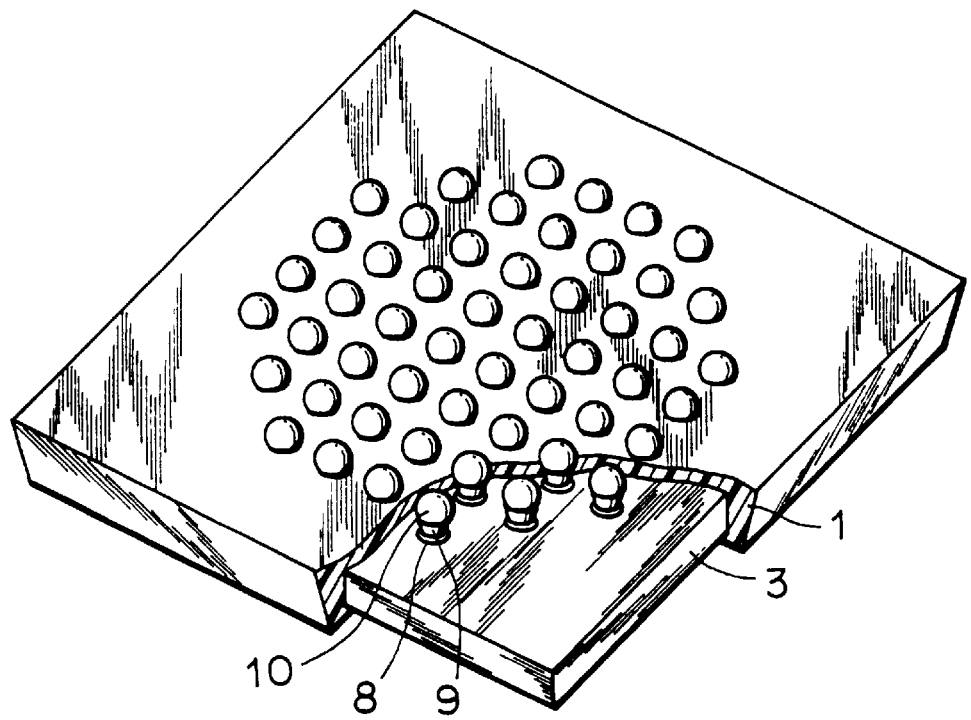

Referring to FIG. 31, a seventh embodiment of the invention will be described below. FIG. 31 is a perspective view partially in section showing a semiconductor package of the seventh embodiment of the invention. The semiconductor package of this embodiment is a modification of the semiconductor package of the fifth embodiment shown in FIG. 29. As shown in FIG. 31, the second conductors 10 are arranged substantially in a matrix form.

Eighth Embodiment

Figure 32:
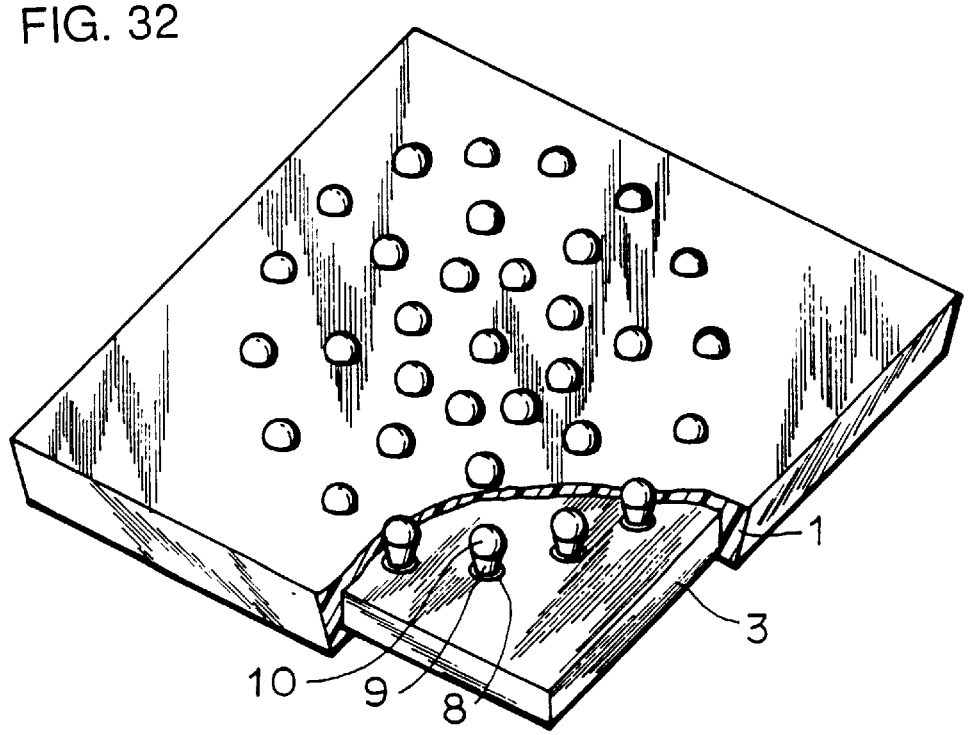

Referring to FIG. 32, an eighth embodiment of the invention will be described below. FIG. 32 is a perspective view partially in section showing a semiconductor package of an eighth embodiment of the invention. As shown in FIG. 32, the second conductors 10 may be disposed substantially along concentric circles on the main surface of the semiconductor package.

Ninth Embodiment

Figure 33:
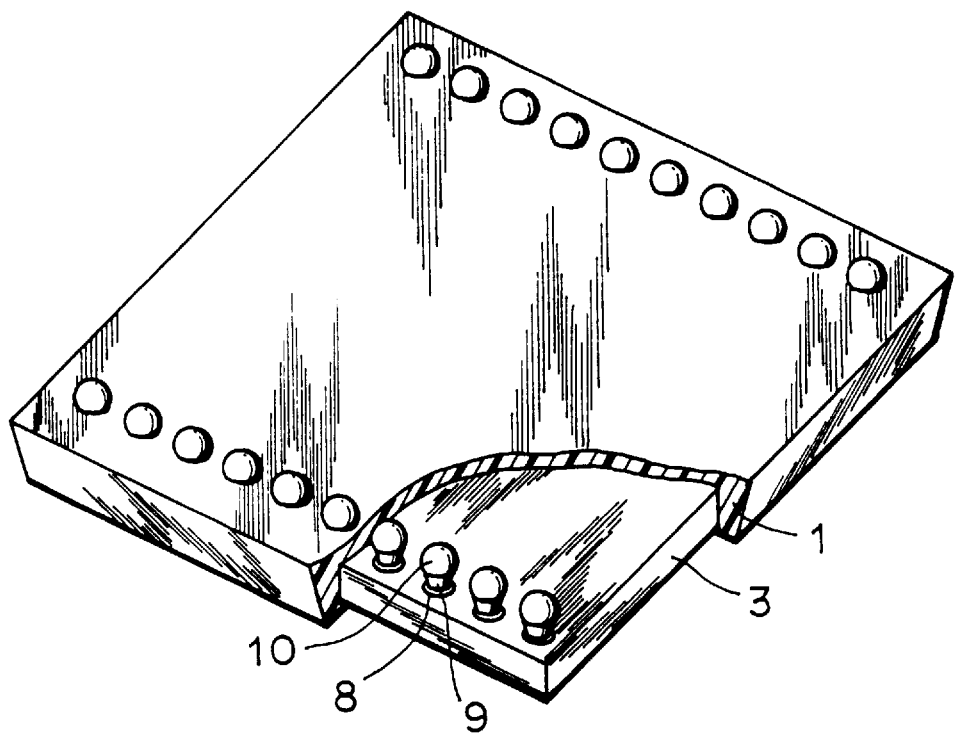

Referring to FIG. 33, a ninth embodiment of the invention will be described below. FIG. 33 is a perspective view partially in section showing a semiconductor package of the ninth embodiment of the invention. In the semiconductor package of the embodiment shown in FIG. 33, the second conductors 10 arranged on the main surface of the semiconductor package are aligned in two rows extending along opposite two sides among four sides defining the main surface.

Tenth Embodiment

Figure 34:
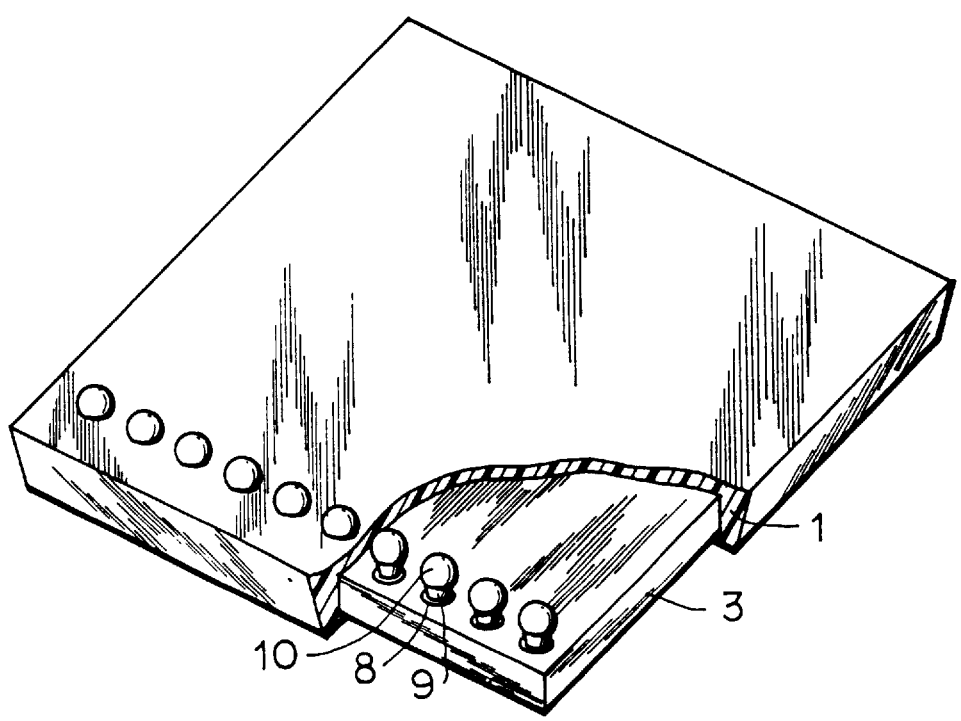

Referring to FIG. 34, a tenth embodiment of the invention will be described below. FIG. 34 is a perspective view partially in section showing a semiconductor package of the tenth embodiment of the invention. In this embodiment shown in FIG. 34, the second conductors 10 arranged on the main surface of the semiconductor package are aligned in one row extending along one side among four sides defining the main surface.

The fifth to tenth embodiments already described with reference to FIGS. 29–34 relate to various forms of arrangement of the second conductors 10 on the main surface of the semiconductor package. Since the second conductors 10 can be arranged in various forms as described above, the degree of freedom of connection to external equipments can be increased.

Although the fifth to tenth embodiments described above show various forms of arrangement of the second conductors, they may be arranged in other forms. The structure of the second embodiment described above in which the base metal layers 12 are extended can be effectively utilized for arranging the second conductors 10 in various manners.

Eleventh Embodiment

Figure 37A:
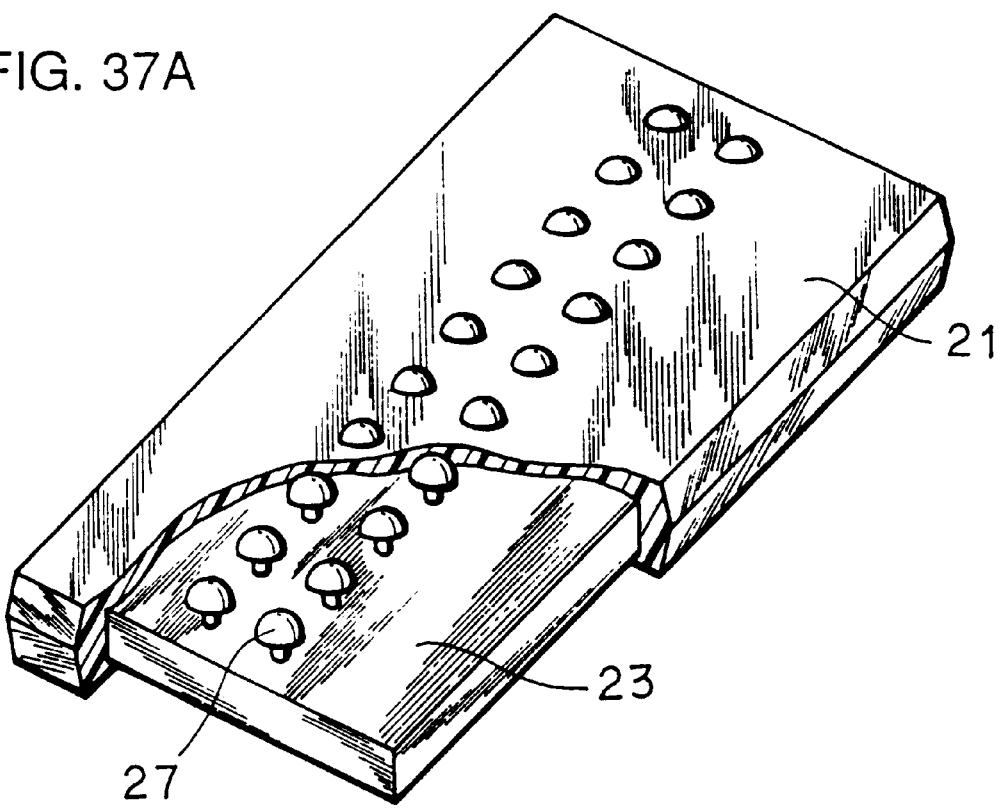
FIG. 37A is a perspective view showing a resin seal semiconductor package of an eleventh embodiment of the invention with certain parts cut away.
Figure 37B:
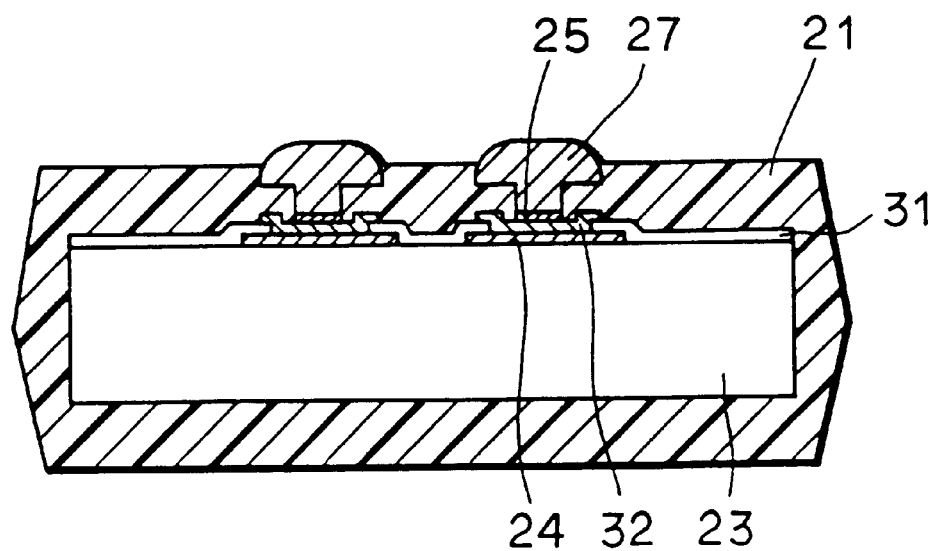
FIG. 37B is a cross section of the resin seal semiconductor package shown in FIG. 37A.

Referring to FIGS. 37A and 37B to 42, an eleventh embodiment of the invention will be described below. FIG. 37A is a perspective view showing a semiconductor package obtained by a manufacturing method of the eleventh embodiment of the invention with certain parts cut away. FIG. 37B is a cross section of a semiconductor package shown in FIG. 37A.

Referring to FIG. 37A, protruded electrodes 27 functioning as electrodes for external connection are formed on a main surface of a semiconductor chip 23. There is also provided a seal resin 21 exposing a portion of a surface of each protruded electrode 27.

Referring to FIG. 37B, bonding pads 24 are formed on the main surface of the semiconductor chip 23. Peripheral portions of the bonding pads 24 are covered with an insulating layer 31 which has openings located on the bonding pads 24. A base metal layer 32 is formed on each bonding pad 24.

Electrode layers 25 remain on the base metal layers 32. The metal layers 25 are used when forming the protruded electrodes 27 as will be described later. The protruded electrodes 27 are formed on the electrode layers 25. A configuration of the protruded electrode will be described in detail below.

The protruded electrode 27 has a columnar portion and a conical or truncated conical portion located thereon as shown in FIG. 37(B). The columnar portion forms a lower portion of the protruded electrode 27, and the conical portion is formed integrally on the columnar portion. The conical portion has a bottom bordering on the columnar portion. The diameter of the conical portion is largest at the bottom, and decreases upward. The seal resin 21 exposes a portion of the surface of each conical portion and covers the surface of the semiconductor chip 23.

The semiconductor package in this embodiment having the above structures can be manufactured by a method which will be described below with reference to FIGS. 38 to 42. FIGS. 38–42 are cross sections showing 1st to 5th steps of manufacturing the semiconductor package of the eleventh embodiment of the invention, respectively.

Figure 38:
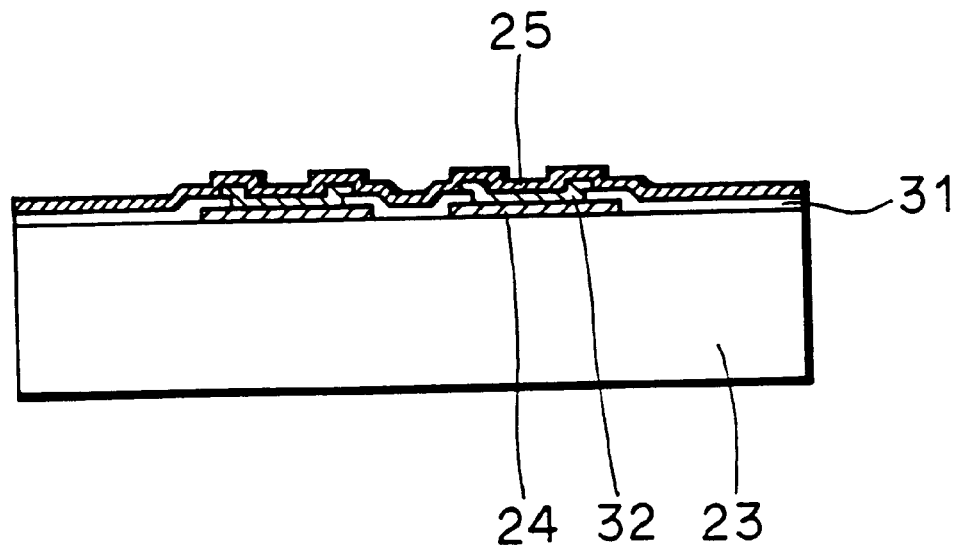
FIGS. 38–42 are cross sections showing 1st to 5th steps in a process of manufacturing the resin seal semiconductor package of the eleventh embodiment of the invention, respectively.

Referring to FIG. 38, the bonding pads 24, insulating layer 31 and base metal layers 32 are formed on the semiconductor chip 23 through steps similar to those of the embodiment already described. Then, material of the electrode layer 25 is deposited on the main surface of the semiconductor chip 23. The material of electrode layer 25 will function as an electrode in electrolytic plating performed in a later step.

Figure 39:
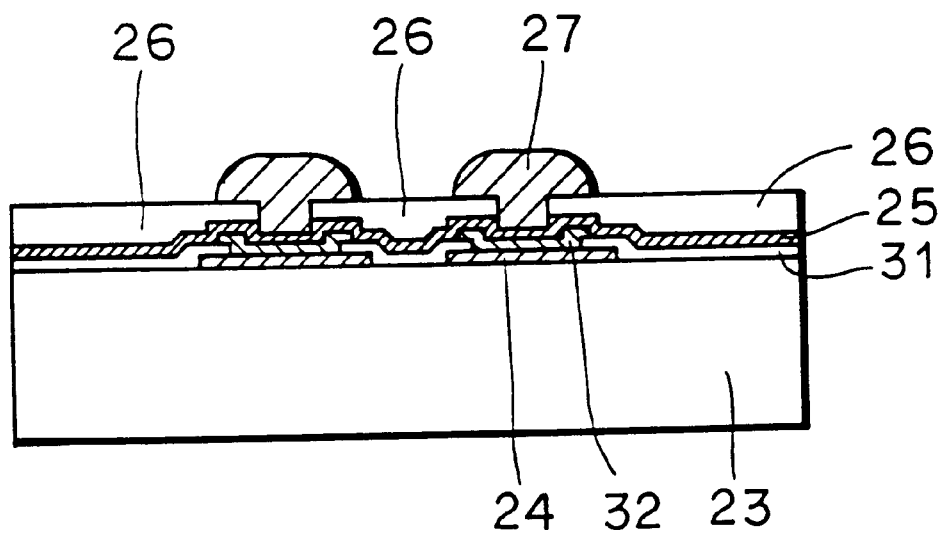
Figure 40:
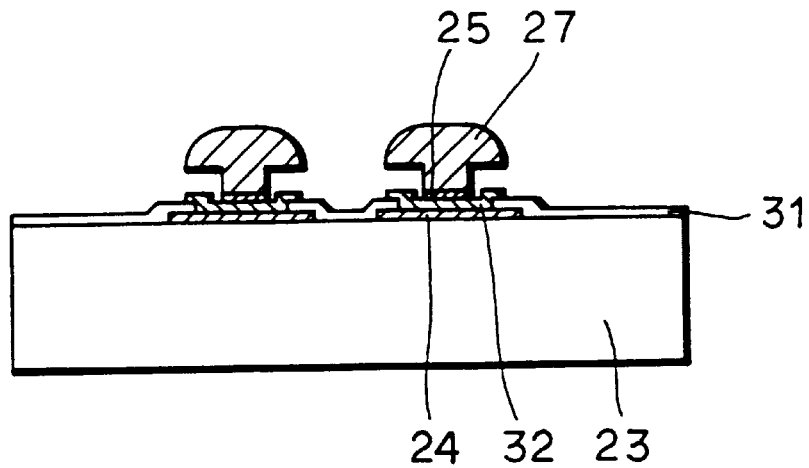

Referring to FIG. 39, there is formed a resist 26 having openings located at positions, at which the protruded electrodes 27 are to be formed. The protruded electrodes 27 made of gold (Au), copper (Cu), nickel (Ni) or the like are formed by the electrolytic plating. Referring to FIG. 40, the resist 26 is removed, and then the electrode layer 25 is removed by the etching. Through the steps described above, the protruded electrodes 27 having the upper conical portions and lower columnar portions are formed.

Figure 41:
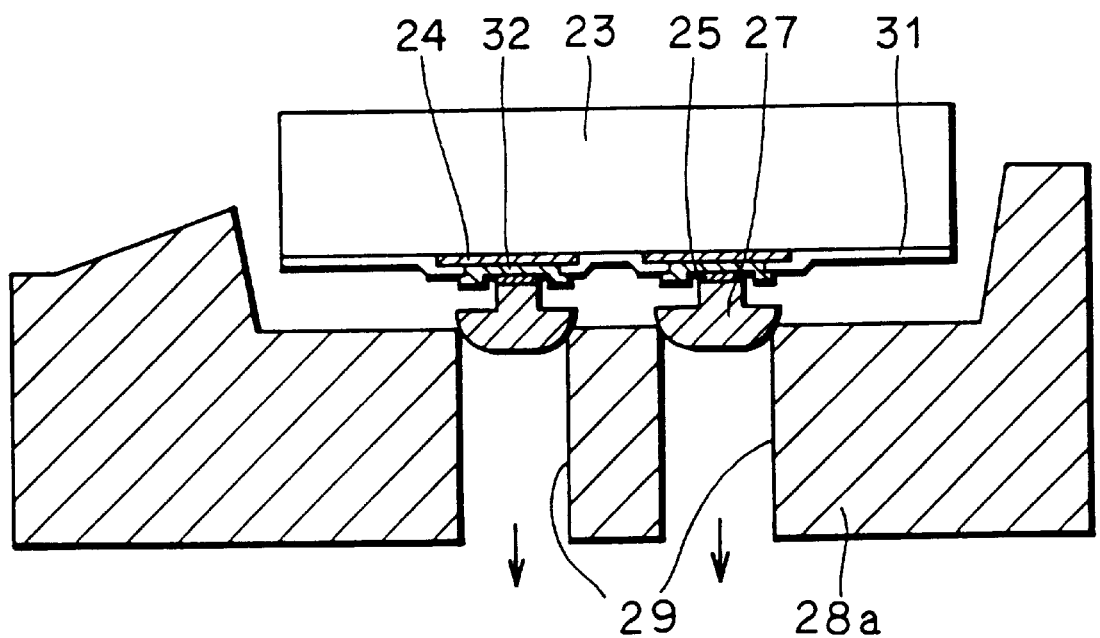

Referring to FIG. 41, a first molding die 28a which has through holes 29 at positions corresponding to those of the protruded electrodes 27 is prepared. The diameter of the through hole 29 is smaller than the maximum diameter of the conical portion of the protruded electrode 27. The conical portions of the protruded electrodes 27 are positioned with respect to the through holes 29. Thereafter, a vacuum suction in a direction shown by arrow in FIG. 41 is effected on the protruded electrodes 27 through the through holes 29. In this manner, the semiconductor chip 23 is fixed to the first molding die 28a.

Figure 42:
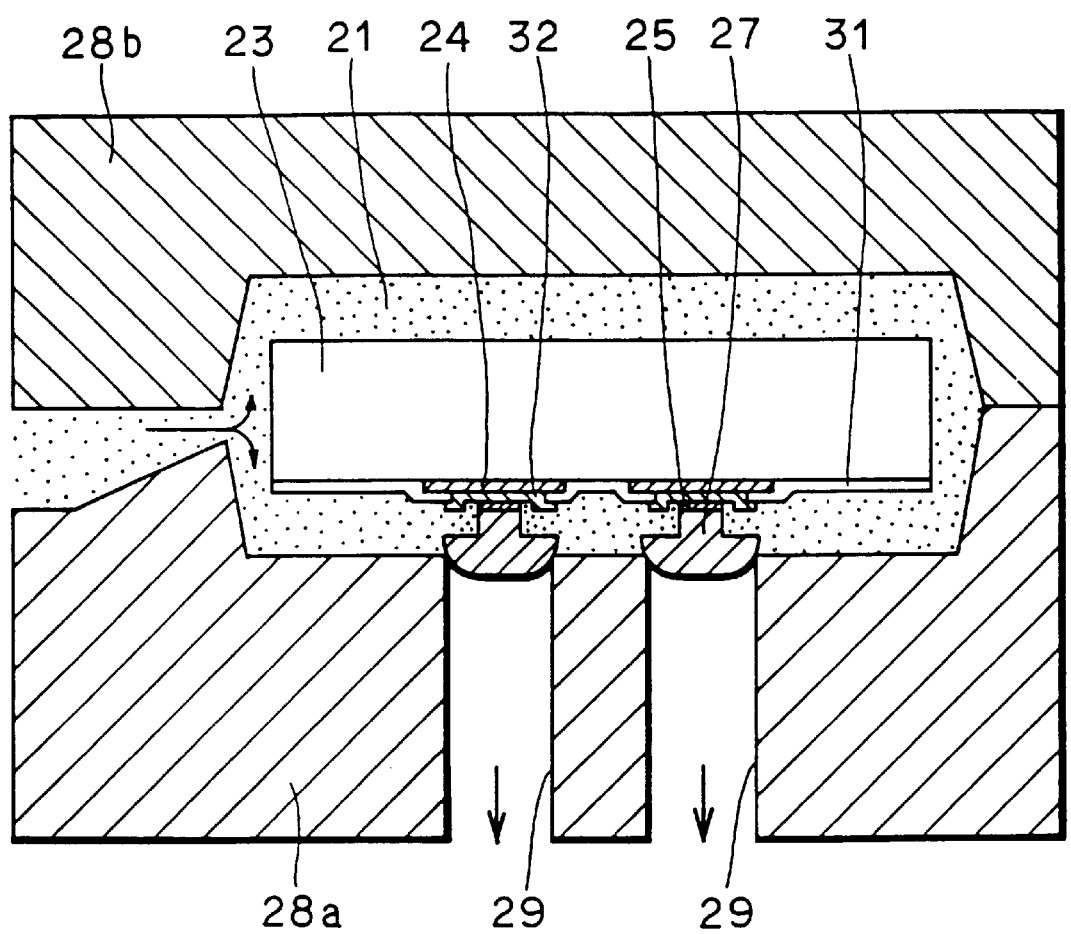

Referring to FIG. 42, a second molding die 28b to be mated with the first molding die 28a is arranged above the first molding die 28a to which the semiconductor chip 23 has been already fixed. As shown in FIG. 42, resin is supplied through an inlet defined by the first and second molding dies 28a and 28b into a space defined by them. Then, the first and second molding dies 28a and 28b are removed from the seal resin 21. A portion of the seal resin 21 corresponding to the inlet of resin is removed. In this manner, the semiconductor package shown in FIGS. 37A and 37B are completed.

Figure 43:
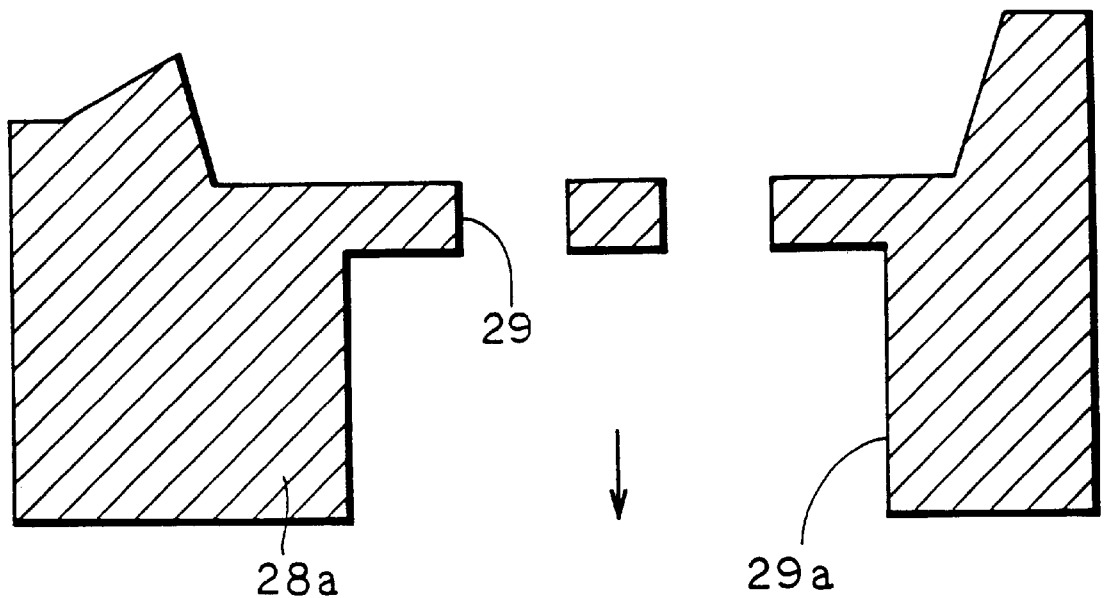
FIG. 43 is a cross section showing a first modification of a first molding die used in a method of manufacturing the resin seal semiconductor package of the eleventh embodiment of the invention.
Figure 44:
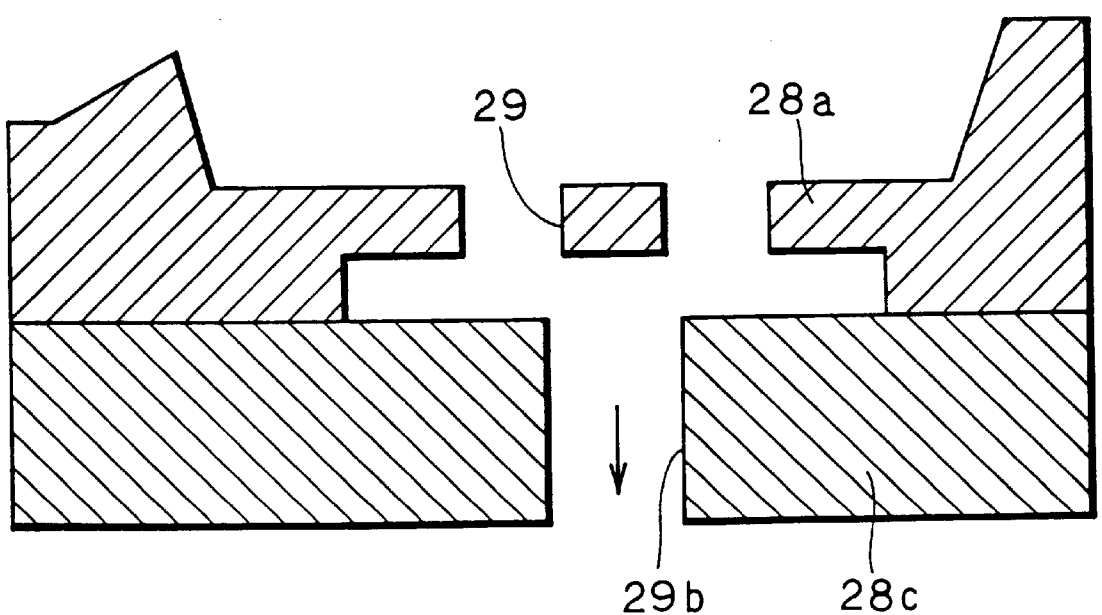
FIG. 44 is a cross section showing a second modification of a first molding die used in a method of manufacturing the resin seal semiconductor package of the eleventh embodiment of the invention.
Figure 45:
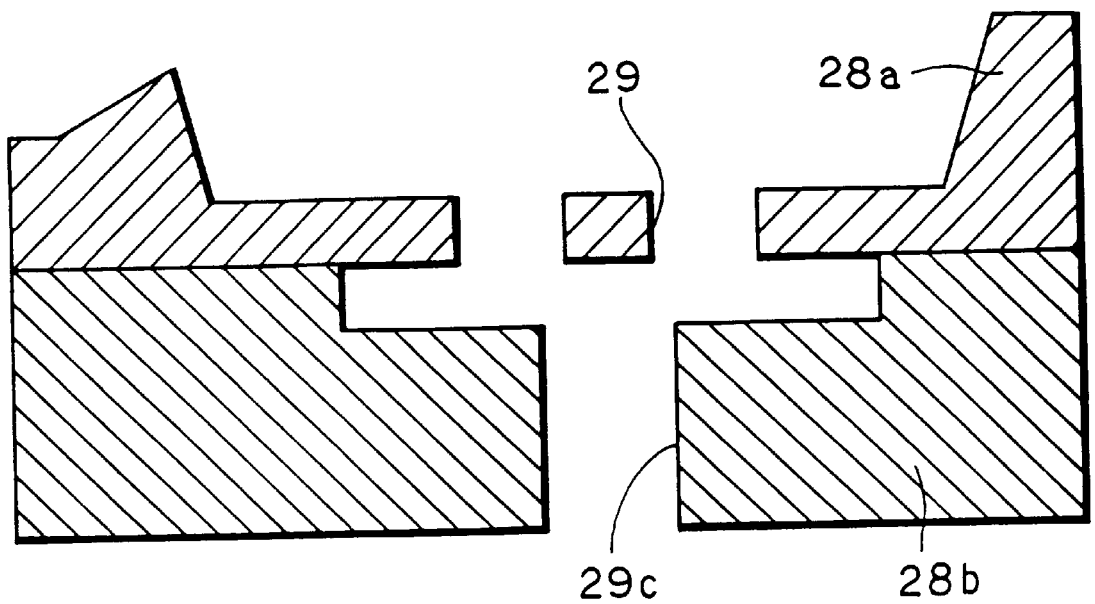
FIG. 45 is a cross section showing a third modification of a first molding die used in a method of manufacturing the resin seal semiconductor package of the eleventh embodiment of the invention.

Referring to FIGS. 43 to 45, description will be made on a modification of the first molding die 28a used in the method of manufacturing the semiconductor package of the eleventh embodiment. FIG. 43 is a cross section showing a first modification of the first molding die 28a. In FIG. 43, the first molding die 28a of the first modification is provided at a portion under the through holes 29 with an opening 29a communicated with them. Owing to provision of the opening 29a, the through holes 29 can be easily formed.

Referring to FIG. 44, a second modification of the first molding die 28a will be described below. FIG. 44 is a cross section showing the second modification of the first molding die 28a. In the second modification in FIG. 44, a third molding die 28c is attached to the lower side of the first molding die 28a.

Owing to this structure, the through hole 29 can be easily formed by the reason similar to that of the first modification. Since the third molding die 28c is provided with a through hole 29b communicated with the through hole 29, the vacuum suction of the protruded electrode 27 can be effected more easily than the first modification.

Referring to FIG. 45, a third modification of the first molding die 28a will be described below. FIG. 45 shows a cross section showing the third modification of the first molding die. In the second modification described before, the first molding die 28a is provided with a concavity connecting the through holes 29 and 29b together. Meanwhile, a third molding die 28c in the third modification is provided with a concavity connecting the through holes 29 and 29b together. This third modification also provides the effect similar to that of the second modification.

Twelfth Embodiment

Figure 46:
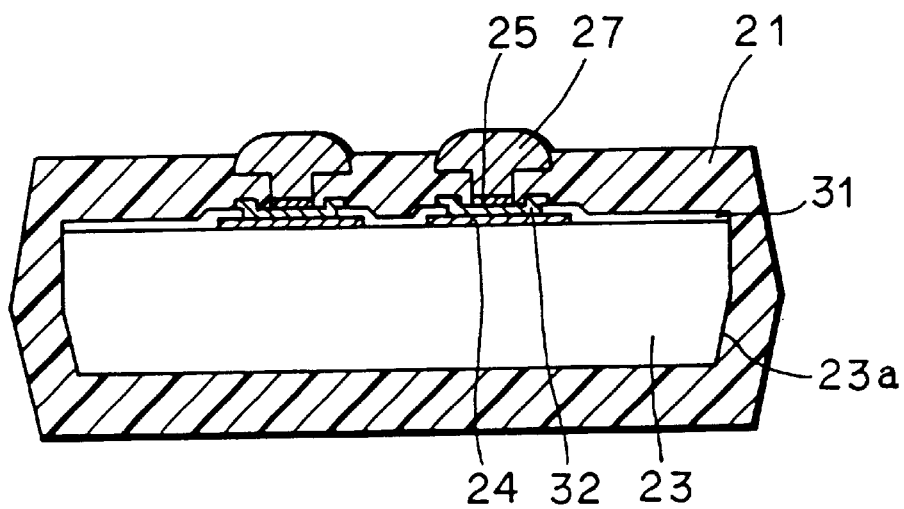
FIG. 46 is a cross section showing a resin seal semiconductor package of a twelfth embodiment of the invention.

Referring to FIG. 46, a twelfth embodiment of the invention will be described below. FIG. 46 is a cross section showing a semiconductor package of the twelfth embodiment of the invention. In this embodiment, the semiconductor chip 23 is provided at its sides with inclined surfaces 23a.

Provision of the inclined surfaces 23a at the sides of the semiconductor chips 23 can reduce mechanical stress generated in the semiconductor package. Although the inclined surfaces 23a are provided at the side surface portions of the semiconductor chip 23 in the embodiment shown in FIG. 46, an inclined surface(s) may be formed in a portion(s) other than the portions described above.

Concept of the invention is summarized as follows. In a resin seal semiconductor package, when there is generated a mechanical stress due to particular shape of the semiconductor chip 23, the stress can be reduced by appropriately changing the particular shape of the portion of the semiconductor chip 23.

Thirteenth Embodiment

Referring to FIGS. 47–51, a thirteenth embodiment of the invention will be described below. FIGS. 47–51 are cross sections showing distinctive 1st to 5th steps in a process of manufacturing the resin seal semiconductor package of the thirteenth embodiment of the invention, respectively.

This embodiment relates to details of the step of forming the second conductors 10 in the resin seal semiconductor package of the first embodiment described before. Also fourteenth to nineteenth embodiments which will be described later relate to specific steps of forming the second conductors, similarly to this embodiment. In FIGS. 47–94 used in the following descriptions, structures of electrodes in the resin seal semiconductor package are omitted appropriately for the sake of illustration. The structures of electrodes in the resin seal semiconductor package in the respective embodiments, however, are basically the same as those shown in FIG. 3.

Figure 47:
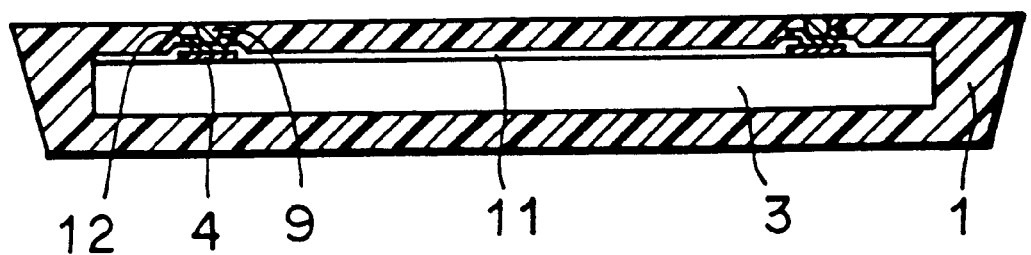
FIGS. 47–51 are cross sections showing distinctive 1st to 5th steps in a process of manufacturing a resin seal semiconductor package of a thirteenth embodiment of the invention, respectively.
Figure 48:
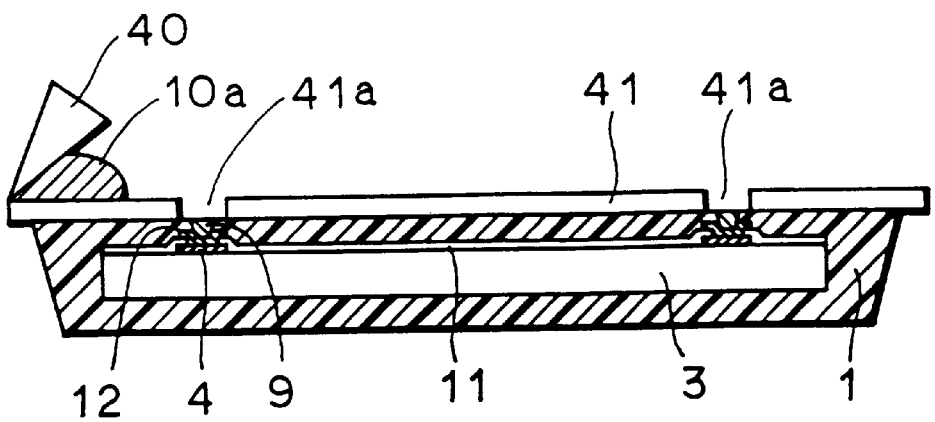

Referring first to FIG. 47, the seal resin 1 exposing a portion of the surface of each first conductor 9 is formed through steps similar to those in the first embodiment. In FIG. 48, a mask 41 having openings 41a is prepared. The openings 41a are formed at positions corresponding to the first conductors 9. The mask 41 is disposed on the main surface of the seal resin 1 and is positioned such that the openings 41 are located on the first conductors 9.

Second conductor materials are laid at predetermined positions on the mask 41. Metal paste 10a of low melting point such as solder is disposed at the predetermined position on the mask 41. The metal paste (i.e., second conductor material) 10a is applied into the openings 41a in the mask 41 with a squeeze 40.

Figure 49:
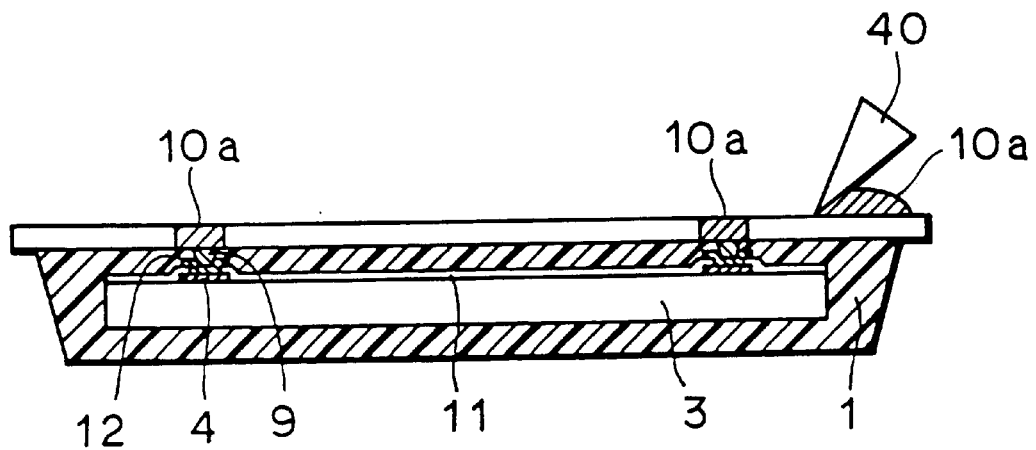

After the second conductor materials 10a were applied into the openings 41a in the mask 41 in this manner as shown in FIG. 49, the mask 41 is removed from the main surface of the seal resin 1.

Figure 50:
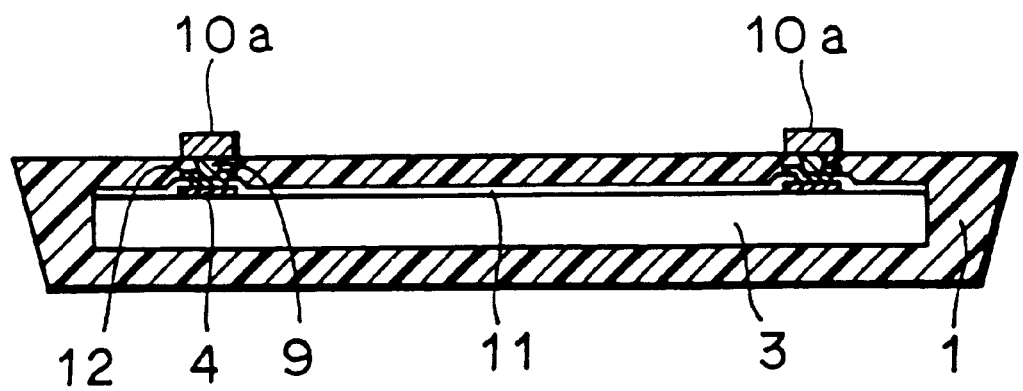
Figure 51:
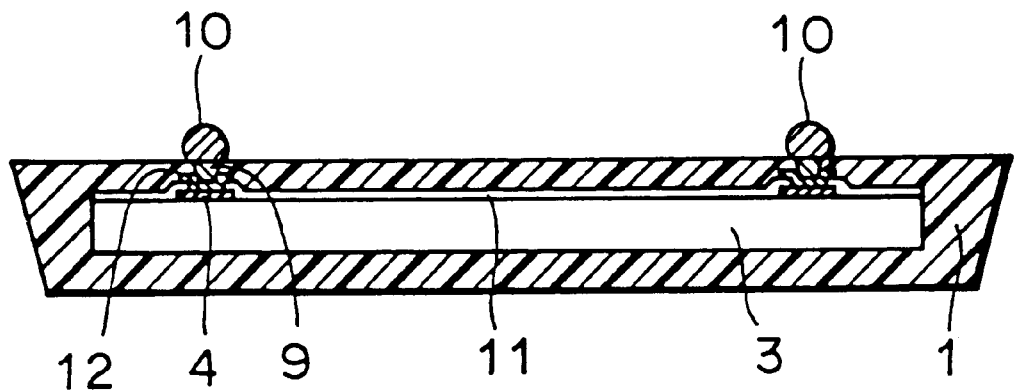

Thereby, the second conductor materials 10a are located only on the first conductors 9 as shown in FIG. 50. Referring to FIG. 51, the second conductors 10a thus formed are thermally treated at a temperature higher than the melting point of the second conductor materials 10a. From this viewpoint, a lower melting point of the second conductor materials 10a is preferable.

The heat treatment causes the second conductors 10a to melt. Since the adhesion between the seal resin 1 and the second conductors 10a is not good, the melted second conductors 10a are joined only to the first conductors 9. As a result, the lumpish second conductors 10 can be formed on the first conductors 9. The mask 41 described above may be a mask generally used in a screen printing process or may be a metal mask.

Fourteenth Embodiment

Referring to FIGS. 52–55, a fourteenth embodiment of the invention will be described below. FIGS. 52–55 are cross sections showing distinctive 1st to 4th steps of a process of manufacturing the resin seal semiconductor package of the fourteenth embodiment of the invention, respectively.

Figure 52:
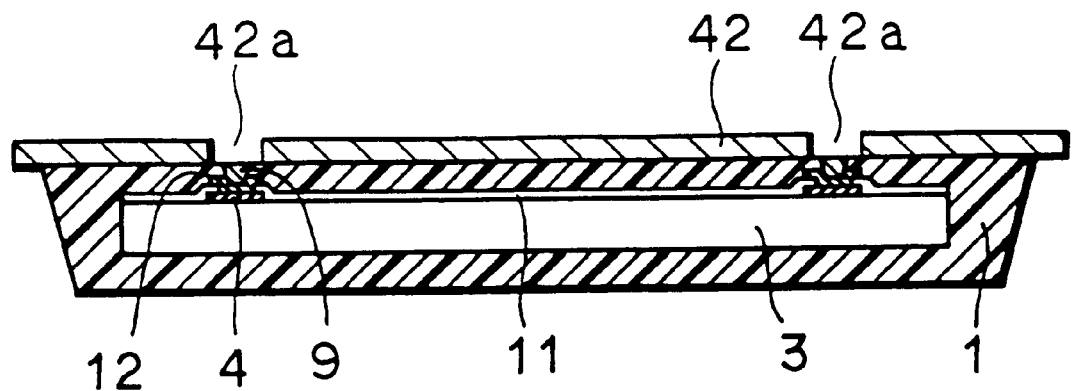
FIGS. 52–55 are cross sections showing distinctive 1st to 4th steps in a process of manufacturing a resin seal semiconductor package of a fourteenth embodiment of the invention, respectively.

Referring to FIG. 52, the seal resin 1 is formed through steps similar to those of the first embodiment. A mask 42 having openings 42a at predetermined positions is prepared. The mask 42 is preferably made of metal and is positioned on the main surface of the resin seal semiconductor package with the openings 42a located on the first conductors 9.

Figure 53:
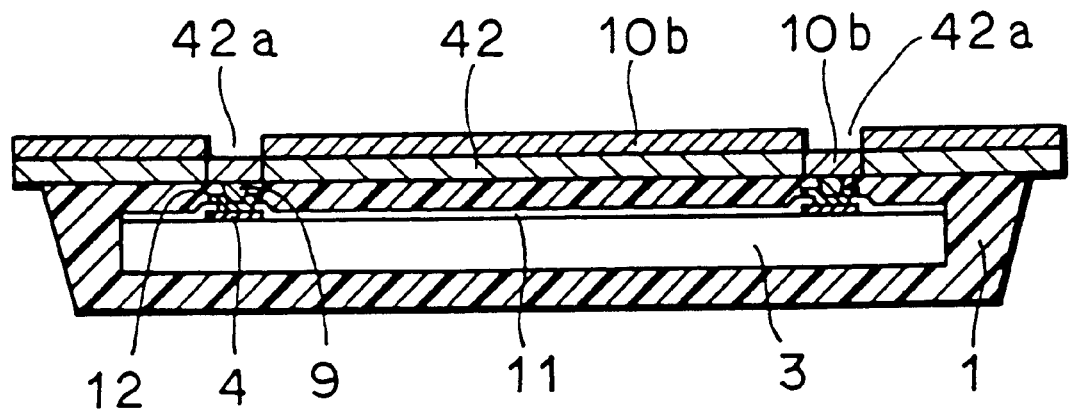

Referring to FIG. 53, the second conductor materials 10b are deposited on the mask 42 and on the first conductors 9 by the vapor deposition method or sputtering method. The second conductor materials 10b are preferably made of metal of a low melting point, such as solder.

Figure 54:
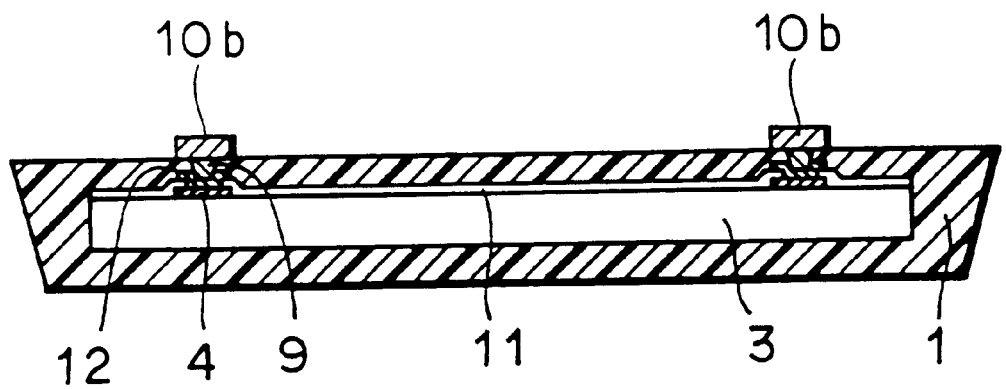

Referring to FIG. 54, the mask 42 is removed from the main surface of the resin seal semiconductor package, so that the second conductor materials 10b are left only on the first conductors 9.

Figure 55:
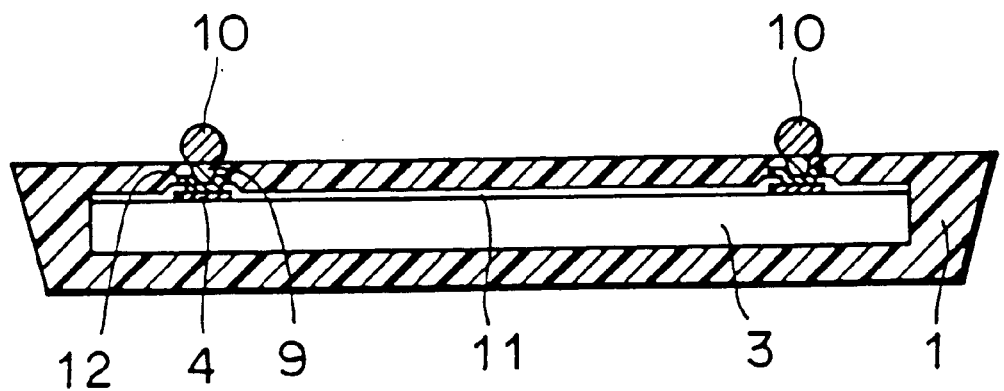

Referring to FIG. 55, the second conductor materials 10b thus left are thermally treated at a heating temperature higher than the melting point of the second conductor materials 10b. Thereby, the second conductor materials 10b melt and are bonded to the first conductors 9 similarly to the thirteenth embodiment.

Fifteenth Embodiment

Referring to FIGS. 56–59, a fifteenth embodiment of the invention will be described below. FIGS. 56–59 are cross sections showing distinctive 1st to 4th steps in a process of manufacturing the resin seal semiconductor package of the fifteenth embodiment, respectively.

Figure 56:
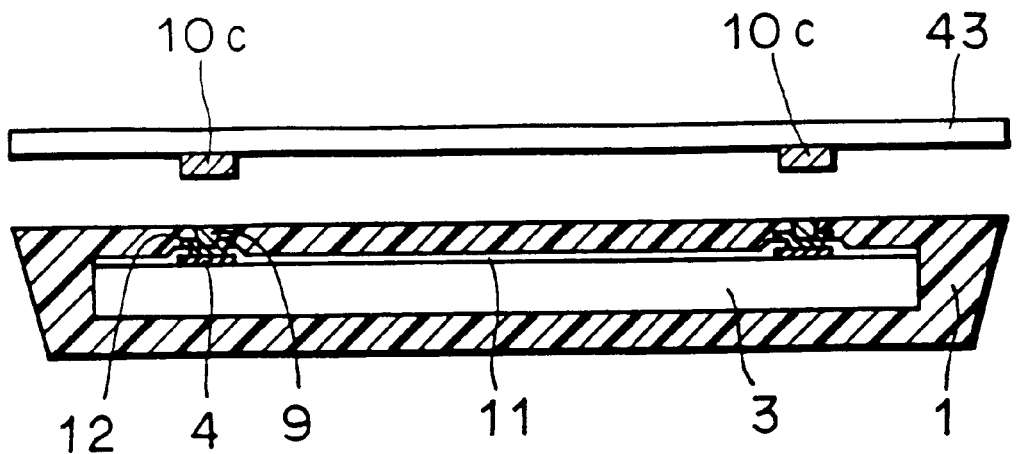
FIGS. 56–59 are cross sections showing distinctive 1st to 4th steps in a process of manufacturing a resin seal semiconductor package of a fifteenth embodiment of the invention, respectively.

Referring to FIG. 56, the seal resin 1 is formed through steps similar to those of the first embodiment. A base plate 43 is prepared, and second conductor materials 10c are laid on the base plate 43, for example, with adhesive interposed therebetween. The second conductor materials 10c are located at positions corresponding to the first conductors 9. The base plate 43 may be made of adhesive material.

Figure 57:
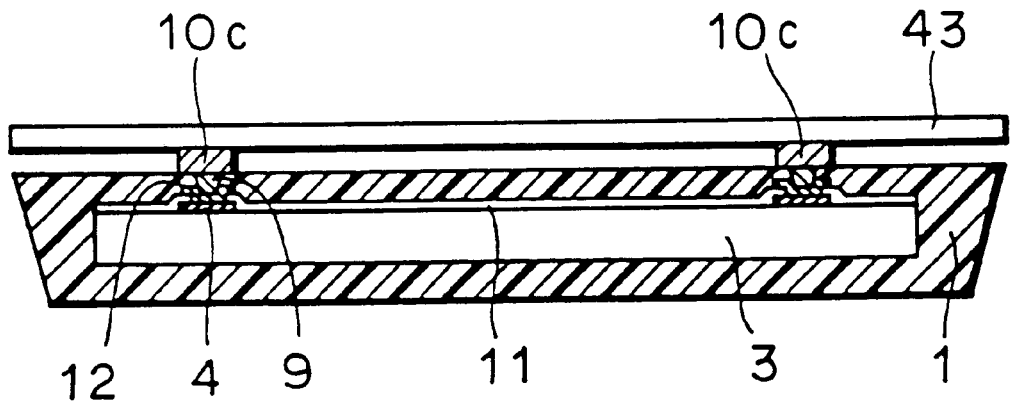

Referring to FIG. 57, the base plate 43 is disposed over the main surface of the resin seal semiconductor package so that the second conductor materials 10c are disposed on the first conductors 9. Pressure is applied to the base plate 43 in this state for compressingly joining the second conductor materials 10c to the first conductors 9.

As for the junction of the second conductor materials 10c and the first conductors 9, the junctional strength of the second conductor materials 10c and the first conductors 9 is required only to be larger than the adhesion strength of the base plate 43 and the second conductor materials 10c. Thereby, the base plate 43 can be separated from the second conductor materials 10c.

The second conductor materials 10c and the first conductors 9 may be joined or bonded together, for example, by heating them or applying ultrasonic to them (ultrasonic bonding method). The second conductors 10c and the first conductor 9 may be joined together by combination of the compression bonding method, heating method and/or ultrasonic bonding method.

Figure 58:
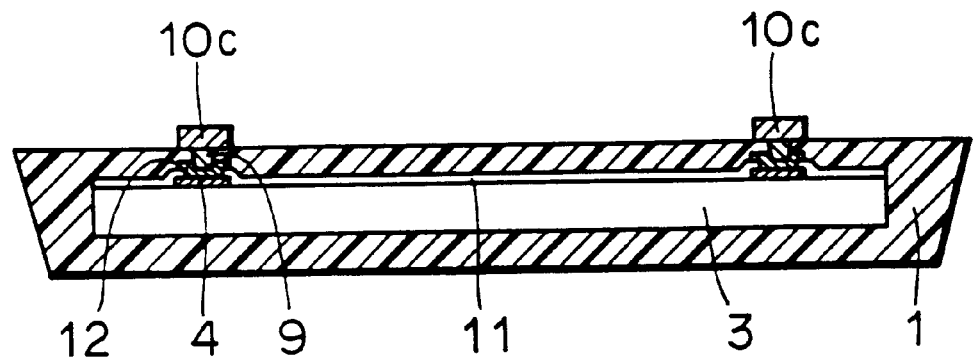
Figure 59:
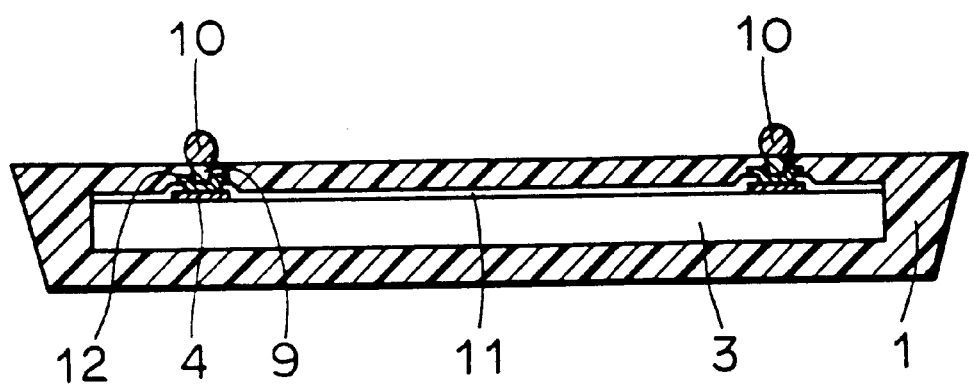

After joining the second conductors 10c and the first conductors 9 together, the base plate 43 is removed from the second conductors 10c as shown in FIG. 58. Thereby, the second conductor materials 10c leave only on the first conductors 9. Thereafter, the lumpish second conductors 10 are formed on the first conductors 9 in manners similar to those of the thirteenth embodiment, as shown in FIG. 59.

In this embodiment, the second conductor materials 10c are laid on the base plate 43. Instead of the base plate 43, an elongate insulating tape may be used. The second conductor materials 10c are arranged along the elongate insulating tape, so that high-speed automatic feeding is allowed. This improves the productivity of the resin seal semiconductor package.

Sixteenth Embodiment

Referring to FIGS. 60–63, a sixteenth embodiment of the invention will be described below. FIGS. 60–63 are cross sections showing distinctive 1st to 4th steps in the process of manufacturing the resin seal semiconductor package of the sixteenth embodiment of the invention, respectively.

Figure 60:
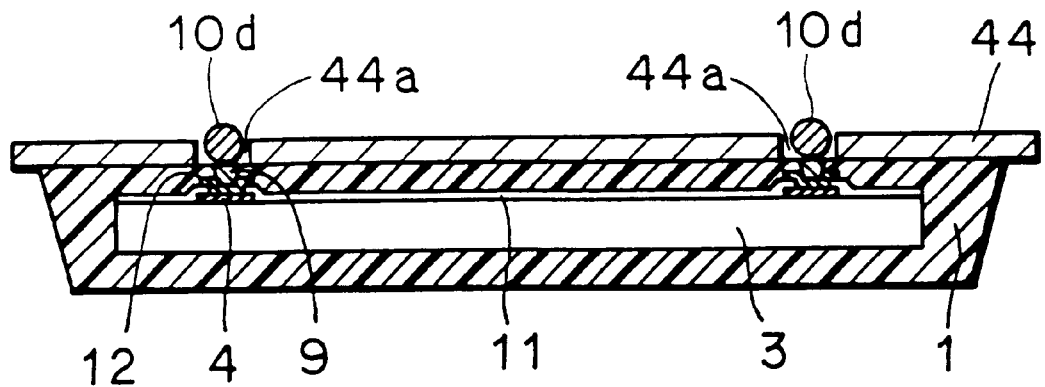
FIGS. 60–63 are cross sections showing distinctive 1st to 4th steps in a process of manufacturing a resin seal semiconductor package of a sixteenth embodiment of the invention, respectively.

Referring to FIG. 60, the seal resin 1 is formed through steps similar to those in the first embodiment. A mask 44 having openings 44a is prepared. The openings 44a are formed at positions corresponding to those of the first conductors 9. The mask 44 is disposed on the main surface of the resin seal semiconductor package and is positioned so that the openings 44a are located on the first conductors 9.

Second conductor materials 10d are disposed in the openings 44a. The second conductor materials 10d are spherical pieces in this example, but may be small pieces of other shapes.

Figure 61:
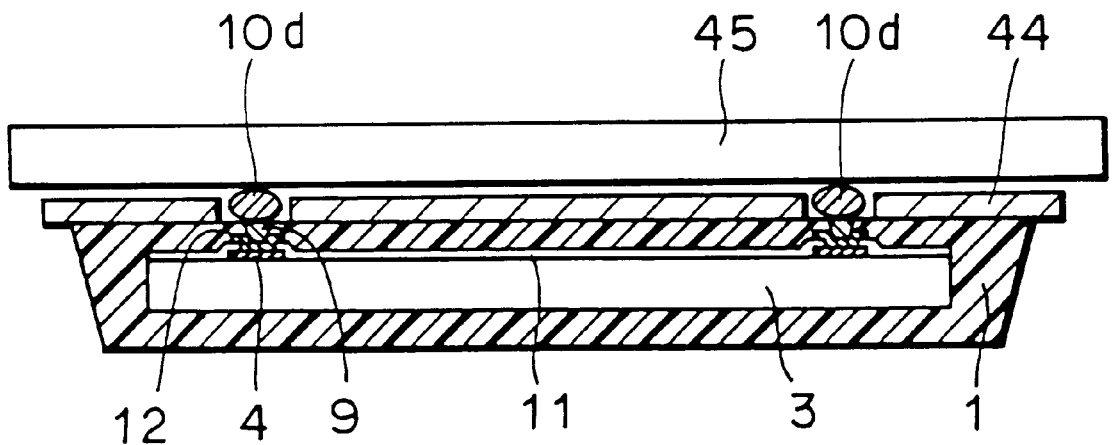

Referring to FIG. 61, a load is applied to the second conductor materials 10d by a press plate 45 to compressingly join the second conductor materials 10d and the first conductors 9 together. Similarly to the fifteenth embodiment, the second conductor materials 10d and the first conductors 9 may be joined together by the heating method and/or ultrasonic bonding method.

Figure 62:
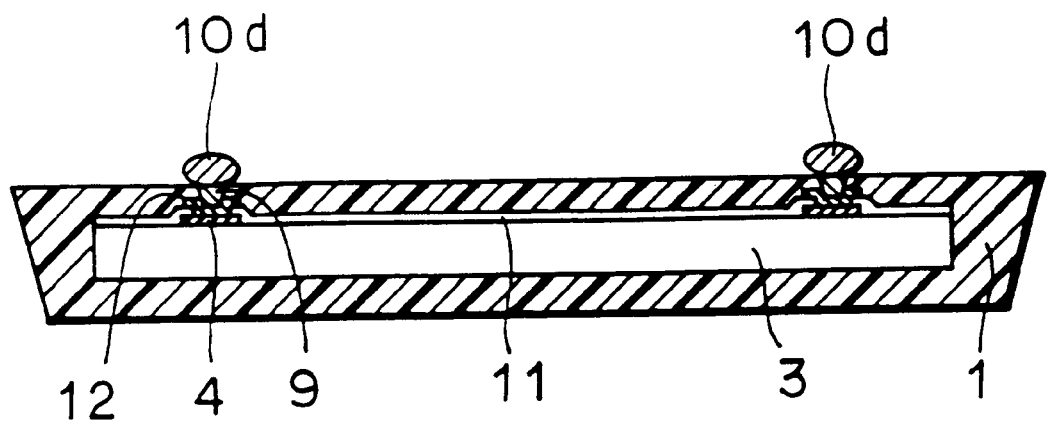
Figure 63:
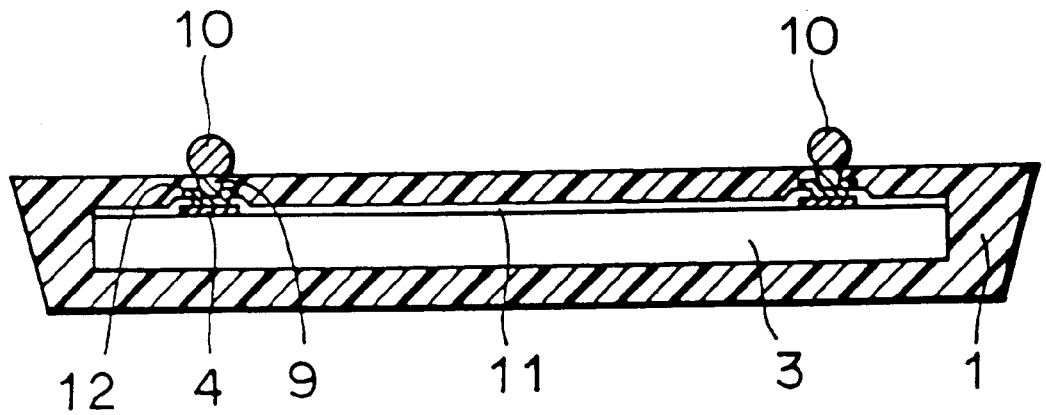

Referring to FIG. 62, the press plate 45 and mask 44 are removed to leave only the second conductor materials 10d on the first conductors. Then, the lumpish second conductors 10 are formed on the first conductors 9 in a manner similar to that of the thirteenth embodiment, as shown in FIG. 63.

Seventeenth Embodiment

Referring to FIGS. 64A–67, a seventeenth embodiment of the invention will be described below. FIGS. 64A–67 are cross sections showing distinctive 1st to 4th steps in a process of manufacturing the resin seal semiconductor package of the seventeenth embodiment, respectively.

Figure 64A:
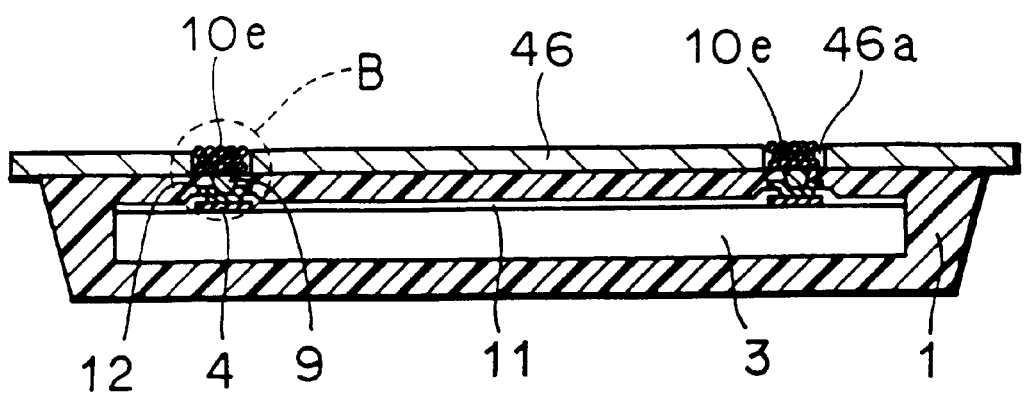
FIG. 64A is a cross section showing a distinctive 1st step in a process of manufacturing a resin seal semiconductor package of a seventeenth embodiment of the invention.

Referring to FIG. 64A, the seal resin 1 is prepared through steps similar to those of the first embodiment. A mask 46 having openings 46a is prepared. The openings 46a are located at positions in the mask 46 corresponding to the positions of the first conductors 9. The mask 46 is disposed on the main surface of the resin seal semiconductor package, so that the openings 46a are positioned on the first conductors 9. Second conductor materials 10e are disposed in the openings 46a.

Figure 64B:
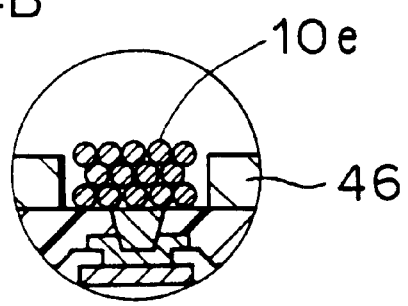
FIG. 64B is an enlarged cross section showing a region "B" in FIG. 64A.

FIG. 64B is a fragmentary enlarged cross section showing a region B in FIG. 64A, and particularly showing a state where the second conductor materials 10e are disposed in the openings 46a in the mask 46. In this. embodiment, the second conductor materials 10e in the form of a plurality of small pieces, are disposed is each opening 46a. By employing the second conductor materials 10e in the form of plural small pieces, composition of the second conductor 10 can be easily changed. Also, the size of the completed second conductor 10 can be easily adjusted.

Figure 65A:
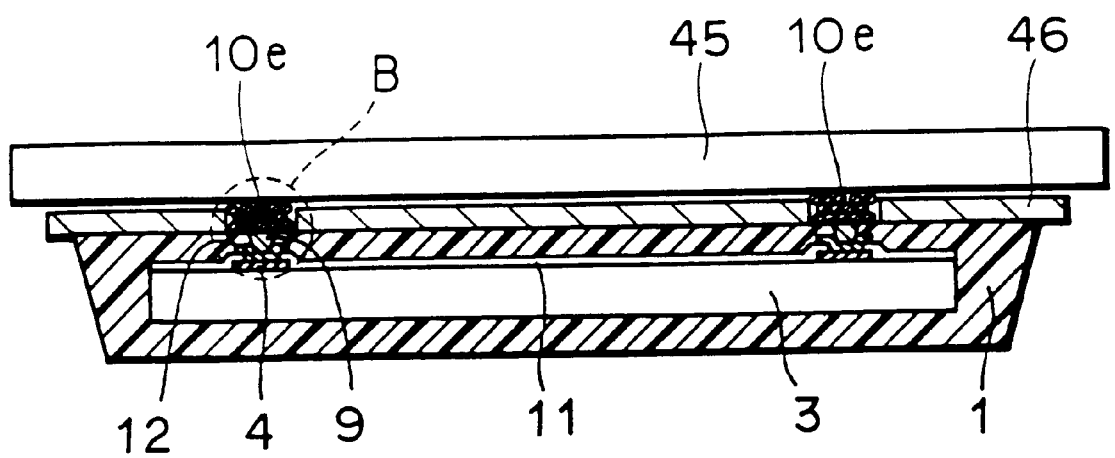
FIG. 65A is a cross section showing a distinctive 2nd step in a process of manufacturing the resin seal semiconductor package of the seventeenth embodiment of the invention.
Figure 65B:
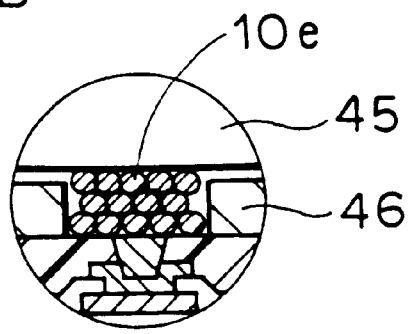
FIG. 65B is an enlarged cross section showing a region "B" in FIG. 65A.

Referring to FIG. 65A, pressure is applied to the second conductor materials 10e by the press plate 45 to join the first conductors to the second conductor materials 10e. The state of the second conductor materials being joined is shown in FIG. 65B, which is an enlarged view of a region B in FIG. 65A.

Similarly to the fifteenth embodiment, the second conductor materials 10e may be joined to the first conductors 9 by the heating method and/or ultrasonic bonding method.

Figure 66A:
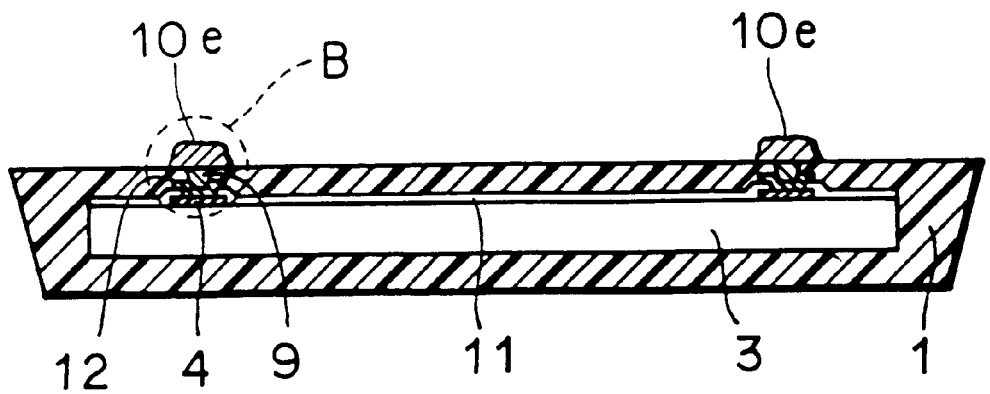
FIG. 66A is a cross section showing a distinctive 3rd step in a process of manufacturing the resin seal semiconductor package of the seventeenth embodiment of the invention.
Figure 66B:
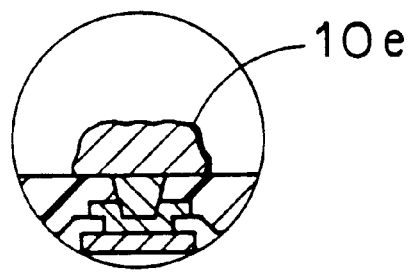
FIG. 66B is an enlarged cross section showing a region "B" in FIG. 66A.
Figure 67:
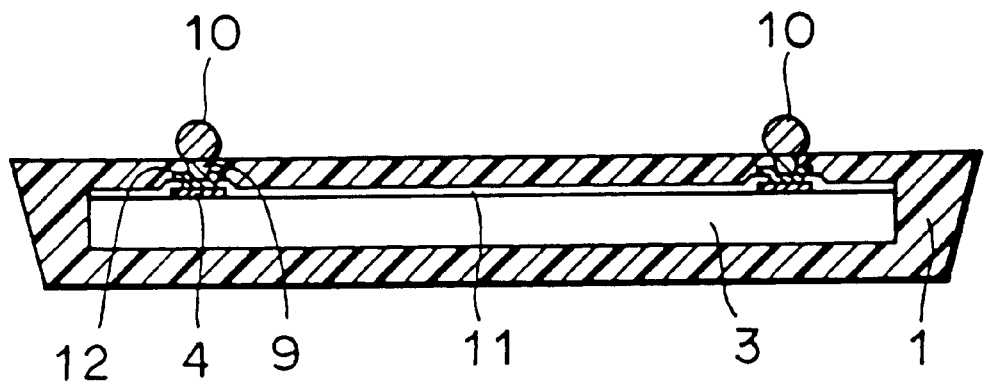
FIG. 67 is a cross section showing a distinctive 4th step in a process of manufacturing the resin seal semiconductor package of the seventeenth embodiment of the invention.

After joining the second conductor materials 10e to the first conductors 9, the press plate 45 and mask 46 are removed. Thereby, the second conductor materials 10e leave only on the first conductors 9 as shown in FIGS. 66A and 66B. Then, the second conductors 10 are formed on the first conductors 9 in a manner similar to the thirteenth embodiment, as shown in FIG. 67.

Eighteenth Embodiment

Figure 68:
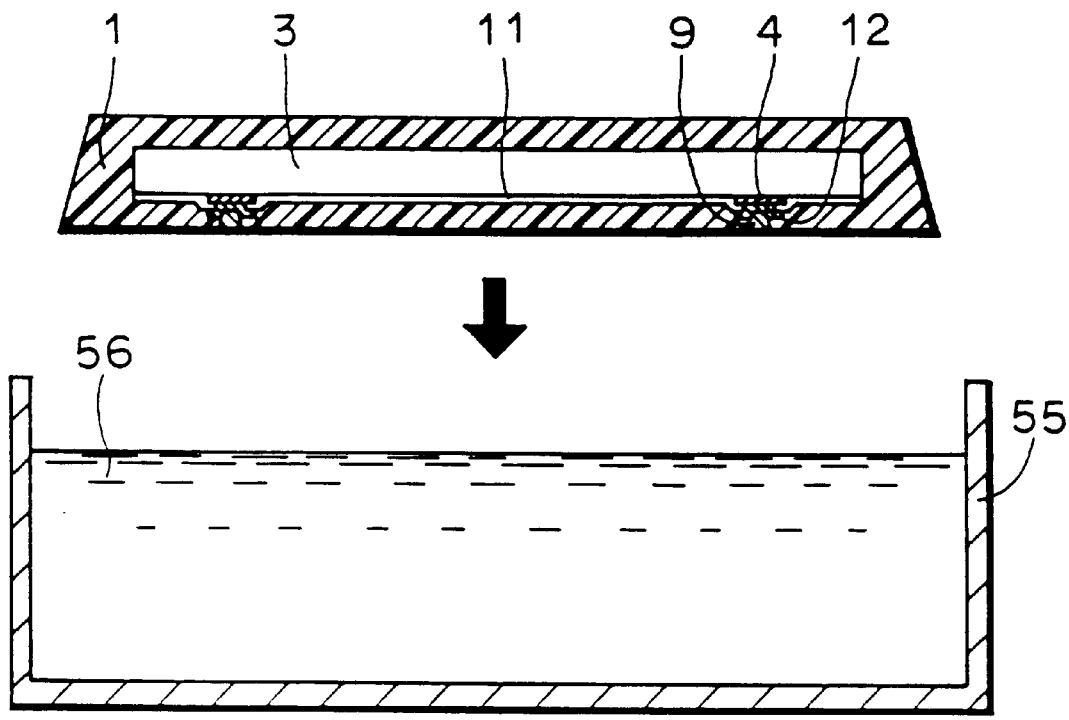
FIG. 68 is a cross section schematically showing a distinctive step of manufacturing the resin seal semiconductor package of an eighteenth embodiment of the invention.

Referring to FIG. 68, an eighteenth embodiment of the invention will be described below. FIG. 68 is a cross section schematically showing a distinctive step in the eighteenth embodiment of the invention.

In the manufacturing methods of the thirteenth to seventeenth embodiments already described, the second conductors 10 have the substantially uniform shapes and sizes. This requires relatively complicated steps. This embodiment, however, is effective if the size of the second conductor 10 is not very much restricted or reduction of cost is given high priority.

Referring to FIG. 68, a container 55 is filled with second conductor material 56 in a liquid phase. The resin seal semiconductor package of which seal resin 1 has been completed is immersed in the second conductor material 56 in the liquid state.

Then, the resin seal semiconductor package is taken out of the second conductor material 56 in the liquid phase. Since the second conductor material is made of metal, the adhesion thereof to resin is poor. Therefore, the second conductor material 56 in the liquid phase is left only on the first conductors, whereby the second conductors 10 are formed.

Since the second conductors 10 can be formed only by immersing the resin seal semiconductor package in the second conductor material 56 in the liquid state, the manufacturing process is simplified.

In the above example, the resin seal semiconductor package is entirely immersed in the second conductor material 56 in the liquid phase. Alternatively, only the main surface of the resin seal semiconductor package, in which surfaces of the first conductors 9 are partially exposed, may be immersed in the second conductor material 56 in the liquid phase. This can reduce a thermal stress applied to the resin seal semiconductor package, compared with the case where the resin seal semiconductor package is entirely immersed in the second conductor material 56 in the liquid phase.

Nineteenth Embodiment

Figure 69:
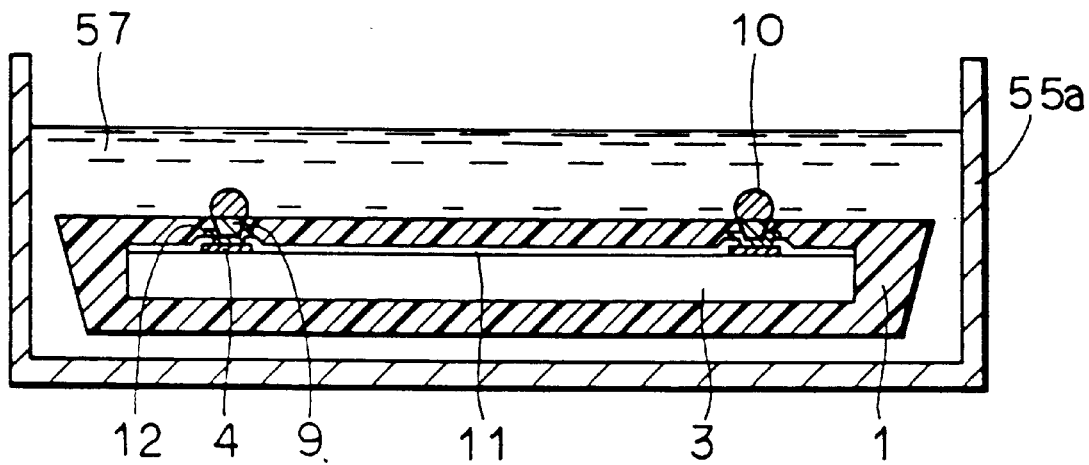
FIG. 69 is a cross section schematically showing a distinctive step of manufacturing the resin seal semiconductor package of a nineteenth embodiment of the invention.

Referring to FIG. 69, a nineteenth embodiment of the invention will be described below. FIG. 69 is a cross section schematically showing a concept of a distinctive step of manufacturing the resin seal semiconductor package of the nineteenth embodiment.

In the eighteenth embodiment described above, the resin seal semiconductor package is immersed in the second conductor material 56 in the liquid phase. Alternatively, the second conductors 10 may be formed by immersing the resin seal semiconductor package in plating solution containing the second conductor material in the form of ions.

Referring to FIG. 69, the seal resin 1 is formed through steps similar to those of the first embodiment. A container 55a is filled with plating solution 57 containing the second conductor material in the form of ions. The resin seal semiconductor package of which seal resin 1 has been completed is immersed in the plating solution 57. Thereby, the second conductor material is deposited on the first conductors 9, so that the second conductors 10 are formed on the first conductors 9.

In the embodiments of the thirteenth to seventeenth embodiments already described, the second conductor 10 is substantially spherical. The second conductor 10 may be of other shapes. In the thirteenth to seventeenth embodiments, the second conductors 10 are formed by effecting the heat treatment on the second conductor materials. This heat treatment, however, may be omitted. The second conductor materials and the first conductors 9 may be initially maintained only in a temporarily fixed state, and they may be fixed together by melting the second conductor materials when mounting the resin seal semiconductor package on a circuit board.

Twentieth Embodiment

This embodiment is relevant to the second embodiment. In the second embodiment, the base metal layer 12 is extended in the main surface direction of the semiconductor chip 3 so that the positions of the bonding pads 4 are shifted in the main surface direction of the semiconductor chip 3 from the positions of the second conductors 10. However, the positions of the second conductors 10 and the bonding pads 4 may be shifted in the main surface direction of the semiconductor chip 3 by using other interconnection layers. This concept is employed in this embodiment and the following twenty-first to twenty-eighth embodiments.

Figure 70:
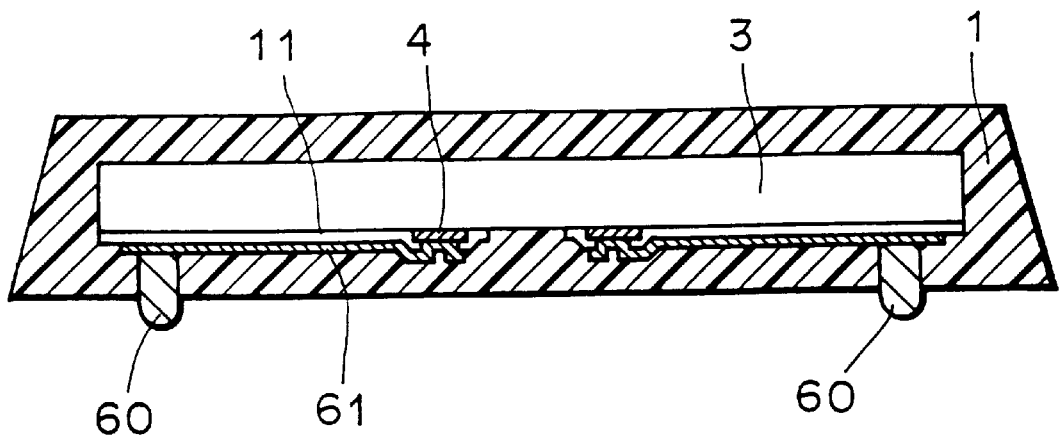
FIG. 70 is a cross section showing a resin seal semiconductor package of a twentieth embodiment of the invention.
Figure 71:
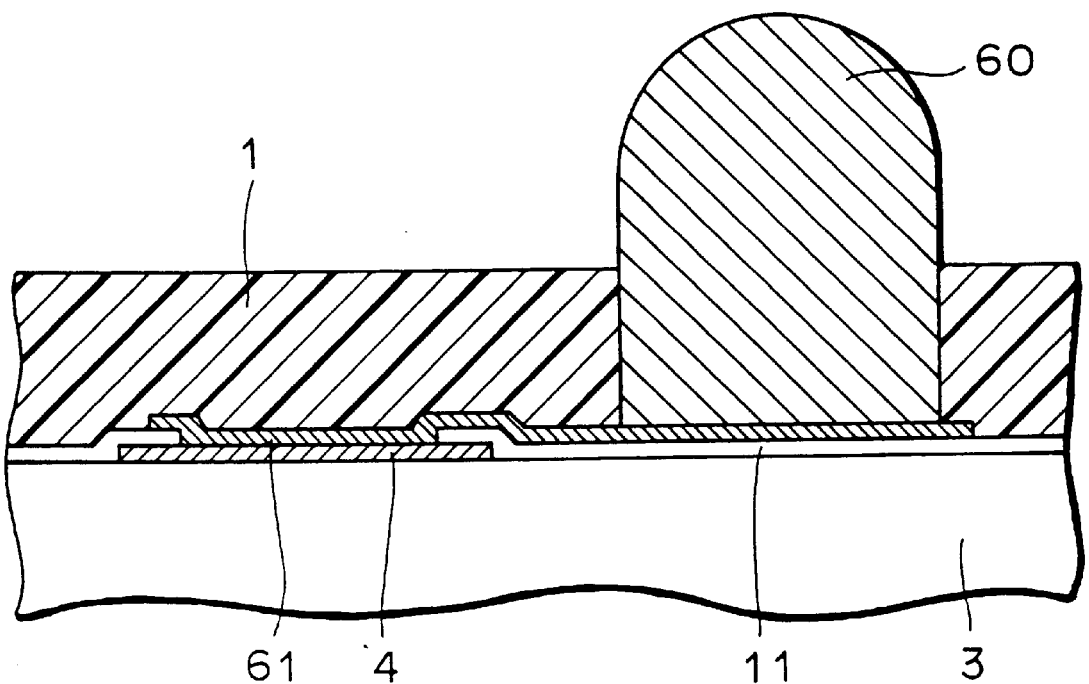
FIG. 71 is a partially enlarged cross section showing the resin seal semiconductor package of the twentieth embodiment of the invention.

FIG. 70 is a cross section showing a resin seal semiconductor package of the twentieth embodiment of the invention. FIG. 71 is a partially enlarged cross section of the resin seal semiconductor package of the twentieth embodiment of the invention. This embodiment will be described below with reference to FIGS. 70 and 71.

Referring to FIG. 70, the bonding pads 4 are formed at the predetermined positions on the main surface of the semiconductor chip 3. Interconnection layers 61 which are electrically connected to the bonding pads 4 are formed on the main surface of the semiconductor chip 3. The interconnection layers 61 may have a single-layer structure on a multilayer structure formed of at least one kind of material selected from the group consisting of Cr, Ti, TiN, TiW, W, Cu, Ni, Pd and Au. Preferably, the multilayer structure may be TiN/Ni/Au, Cr/Cu/Au, TiN/Pd or the like.

Protruded electrodes 60 for external connection are formed on portions of the interconnection layers 61 on which the bonding pads 4 are not formed. The protruded electrodes 60 may be made of solder, copper or the like.

As described above, the positions of the bonding pads 4 are shifted from the protruded electrodes 60 in the main surface direction of the semiconductor chip 3, resulting in the following effects.

The positions of the protruded electrodes 60 functioning as electrodes for external connection can be easily standardized by the following reason. Even if the positions of the protruded electrodes 60 for external connection are standardized by the provision of the interconnection layers 61, the positions of the bonding pads 4 can be selected freely.

Owing to the high degree of freedom of positions at which the bonding pads 4 are formed, it is possible to increase the degree of freedom of the layout of elements formed in the main surface of the semiconductor chip 3. Further, the area of the bonding pads can be made smaller than that in the prior art. These can contribute to high integration of elements in the main surface of the semiconductor chip 3.

Referring to FIG. 71, the insulating layer 11, which partially exposes the surface of the bonding pad 4, is formed on the main surface of the semiconductor chip 3. The insulating layer 11 may be formed of silicon oxide film, silicon nitride film or the like. The interconnection layer 61 extends from the position on the bonding pad 4 up to the position on the main surface of the semiconductor chip 3 at which the bonding pad 4 is not formed. The interconnection layer 61 may have a single-layer structure on a multilayer structure formed of at least one kind of material selected from the group consisting of Cr, Ti, TiN, TiW, W, Cu, Ni, Pd and Au. Preferably, the multilayer structure may be TiN/Ni/Au, Cr/Cu/Au, TiN/Pd or the like.

The interconnection layer 61 is formed as follows. A conductive layer made of the above material is formed entirely on the main surface of the semiconductor chip 3 by the sputtering method. This conductive layer may be formed of a single layer or multiple layers. The conductive layer thus formed is patterned by the wet etching method or dry etching method as well as the photolithography to form the interconnection layer 61.

After the interconnection layer 61 was formed, the protruded electrode 60 is formed, for example, by the plating. The protruded electrode 60 must be relatively high. Therefore, it is difficult to form the protruded electrode 60 by the plating method. Therefore, a multilayer structure is preferable in the protruded electrode 60, compared with the single layer structure shown in FIGS. 70 and 71.

After forming the protruded electrode 60 in this manner, the semiconductor chip 3 is sealed with the seal resin 1 partially exposing the surface of the protruded electrode 60. Thereby, the resin seal semiconductor package shown in FIG. 71 is completed.

Twenty-First Embodiment

Figure 72:
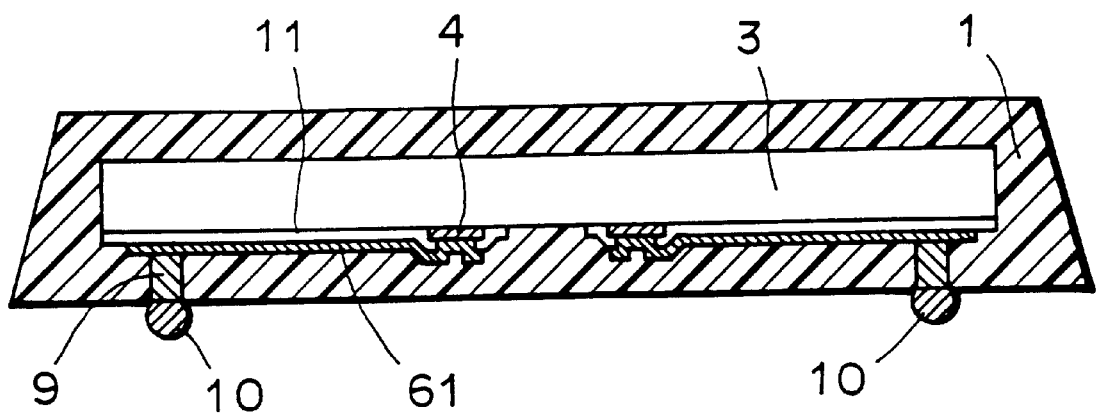
FIG. 72 is a cross section showing a resin seal semiconductor package of a twenty-first embodiment of the invention.

Referring to FIG. 72, a twenty-first embodiment of the invention will be described below. FIG. 72 is a cross section showing a resin seal semiconductor package of the twenty-first embodiment of the invention.

In this embodiment shown in FIG. 72, the first and second conductors 9 and 10 are formed in regions on the interconnection layer 61 on which the bonding pad 4 is not formed. The electrode for external connection can be easily formed owing to the multilayer structures of the same.

The second conductor 10 may be made of the same material as the second conductor 10 in the first embodiment. The second conductor 10 may also be made of In—Pb, in which case the first conductor 9 may be made of In—Pb. In this case, it is preferable that the second conductor 10 contains lead at a ratio of about 90 wt. % to 97 wt. %.

Meanwhile, it is preferable that the ratio of lead contained in the first conductor 9 is about 40 wt. % to 60 wt. %. Thereby, the melting point of the first conductor 9 can be made higher than that of the second conductor 10. As a result, the first conductor 9 does not melt when the second conductor 10 is melted for mounting the resin seal semiconductor package on the printed board. Thus, it is possible to prevent reduction of reliability, which may be caused when mounting the resin seal semiconductor package on the printed board.

The interconnection layer 61 may be made of copper (Cu), Ti alloy or the like.

Twenty-Second Embodiment

Figure 73:
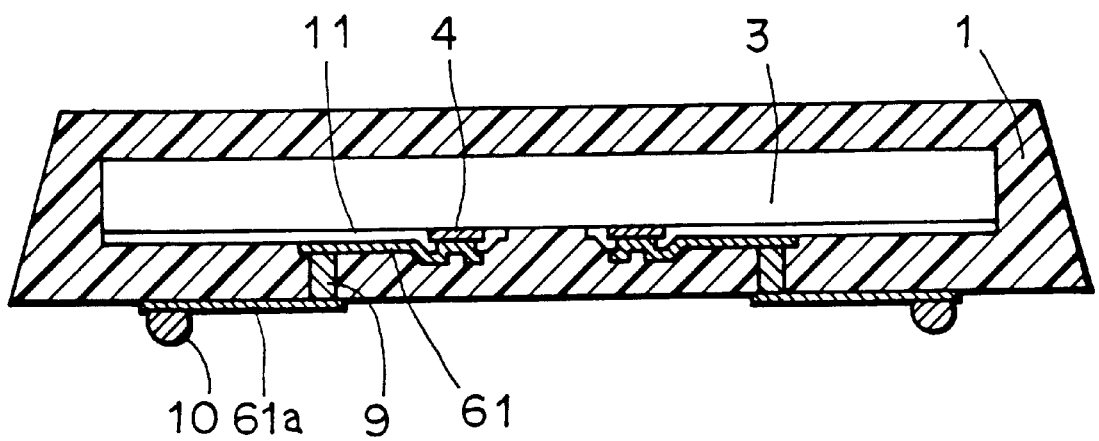
FIG. 73 is a cross section showing a resin seal semiconductor package of a twenty-second embodiment of the invention.

A twenty-second embodiment of the invention will be described below. FIG. 73 is a cross section showing a resin seal semiconductor package of the twenty-second embodiment of the invention.

In the embodiment in FIG. 73, the interconnection layers 61 and 61a are formed on the main surface of the semiconductor chip 3 and the main surface of the seal resin 1, respectively. This improves the degree of freedom of the layout of interconnection layers, because the interconnection layers can be formed utilizing regions on the main surface of the semiconductor chip 3 and regions on the main surface of the seal resin 1.

Thereby, the degree of freedom of the layout of electrodes for bonding pads 4 and second conductor 10 can be increased. Also high integration of the electrodes for external connection can be achieved. Further, there may be such a case that elements formed in a certain portion(s) of the main surface of the semiconductor chip 3 are electrically and adversely affected by the formation of the interconnection layers. In this case, the interconnection layers are formed on the main surface of the seal resin 1, so that such influence on the elements formed in the main surface of the semiconductor chip 3 can be prevented.

Twenty-Third Embodiment

A resin seal semiconductor package of the twenty-third embodiment of the invention will be described below with reference to FIG. 74, which is a fragmentary cross section of the resin seal semiconductor package of the twenty-third embodiment.

Figure 74:
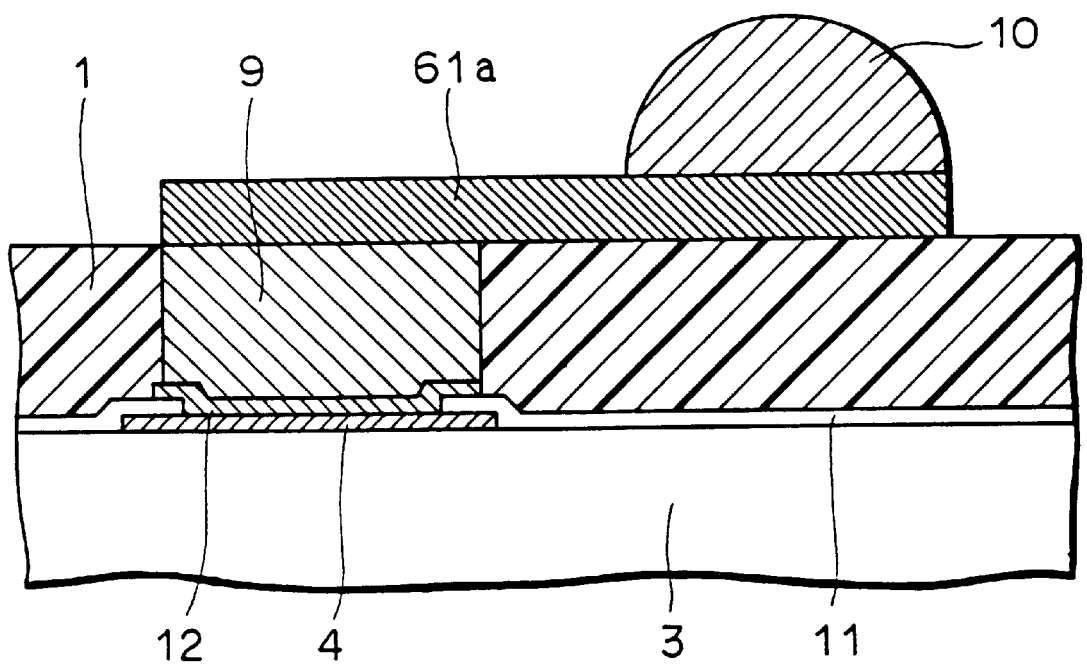
FIGS. 74–79 are fragmentary cross sections showing a resin seal semiconductor package of 23th to 28th embodiments of the invention.

In the embodiment shown in FIG. 74, the base metal layer 12 is formed on the bonding pad 4. The first conductor 9 is formed on the base metal layer 12. The first conductor 9 may be made of the same material as that in the first embodiment, or may be made of gold (Au), solder or the like.

The top surface of the first conductor 9 is coplanar with the main surface of the seal resin 1. The interconnection layer 61a, which is electrically connected to the first conductor 9, is extended up to a position on the main surface of the seal resin 1. The interconnection layer 61a may be made of the same material as the interconnection layer 61 in the twenty-first embodiment, or it may be made of 42-alloy (Fe-42 wt. % Ni alloy).

On the interconnection layer 61a, there is formed the second conductor 10 of which position is shifted in the main surface direction of the semiconductor chip 3 from the bonding pad 4. Owing to the above structures, an effect similar to that of the twentieth embodiment can be obtained. Also in this embodiment, the second conductor 10 may be formed in advance on the interconnection layer 61a, which somewhat facilitates formation of the electrode.

Twenty-Fourth Embodiment

A twenty-fourth embodiment of the invention will be described below with reference to FIG. 75, which is a fragmentary cross section showing a resin seal semiconductor package of the twenty-fourth embodiment of the invention.

Figure 75:
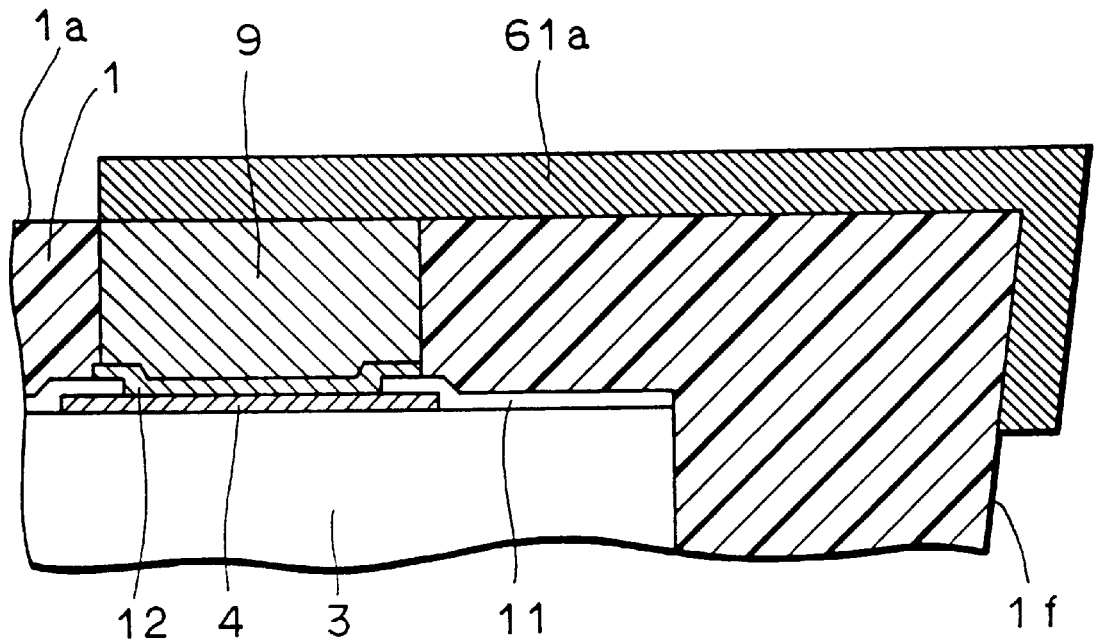

In the embodiment shown in FIG. 75, the interconnection layer 61a extends from a position on the main surface of the resin seal semiconductor package to a position on the side surface thereof. Thereby, the resin seal semiconductor package can be mounted on the printed board with a portion of the side surface 1f of the resin seal semiconductor package being in contact with the printed board.

This allows high integration of the resin seal semiconductor packages mounted on the printed board. Since the interconnection layer 61a extends up to the side surface 1f of the resin seal semiconductor package, it is easy to confirm whether the interconnection layer 61a is formed or not.

The interconnection layer 61a may be made of material similar to that of the interconnection layer 61a in the twenty-third embodiment. The interconnection layer 61a may be formed, for example, in such a manner than the interconnection layer 61a joined to the first conductor 9 is bent to extend along the side surface 1f of the seal resin 1. After bending the interconnection layer 61a, the first conductor 9 may be joined to the interconnection 61a.

Twenty-Fifth Embodiment

A twenty-fifth embodiment of the invention will be described below with reference to FIG. 76, which is a fragmentary cross section showing a resin seal semiconductor package of the twenty-fifth embodiment of the invention.

Figure 76:
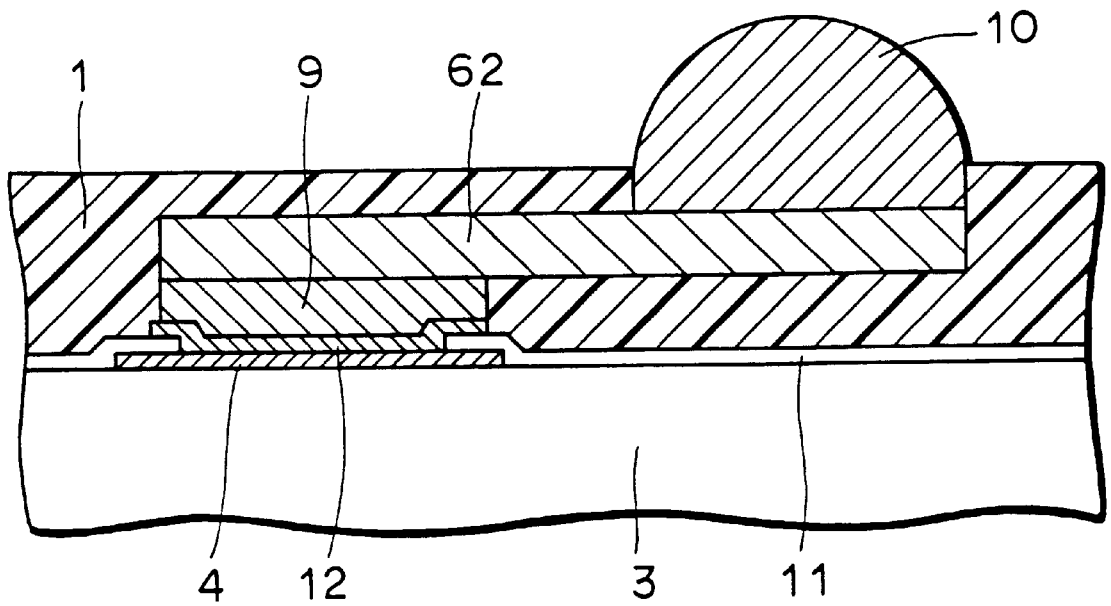

In the embodiment shown in FIG. 76, an interconnection layer 62 is disposed inside the seal resin 1. Part of the second conductor 10 is located inside the seal resin 1. Structures other than the above are similar to those of the resin seal semiconductor package of the twenty-third embodiment shown in FIG. 74. Therefore, an effect similar to that of the twenty-third embodiment can be achieved.

In this embodiment, since the interconnection layer 62 is formed inside the seal resin 1, there is no possibility of contact of the interconnection layer 62 with an electrode for external connection and others. Therefore, the reliability is further improved compared with the twenty-third embodiment.

Twenty-Sixth Embodiment

A twenty-sixth embodiment of the invention will be described below with reference to FIG. 77, which is a fragmentary cross section showing a resin seal semiconductor package of the twenty-sixth embodiment.

Figure 77:
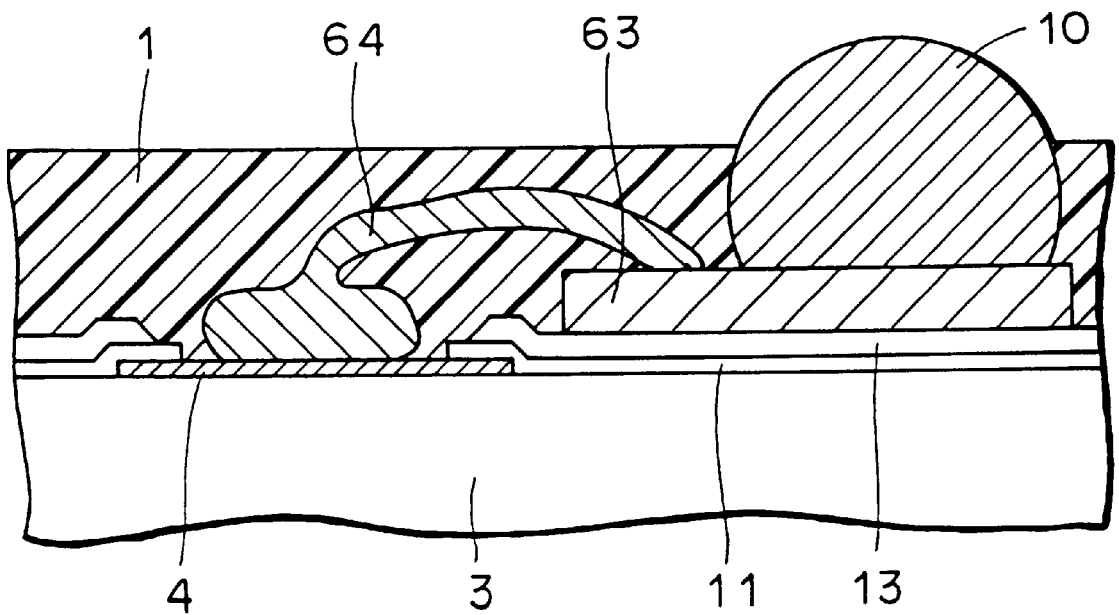

In the embodiment shown in FIG. 77, a protection film 13 made of polyimide or the like is formed on the insulating layer 11 formed on the main surface of the semiconductor chip 3. The interconnection layer 63 is formed on the protection film 13. The interconnection layer 63 is made of material similar to that of the interconnection layer 61 of the twentieth embodiment.

In this embodiment, the interconnection layer 63 and the bonding pad 4 are electrically connected together through a wire 64, which may be made of Au, Al or the like. Owing to the provision of the wire 64, the degree of freedom of the position of bonding pads 4 and interconnection layer 63 can be further improved compared with the twentieth to twenty-fifth embodiments.

The second conductor 10 is formed on the interconnection layer 63. Therefore, the degree of freedom of the positions of second conductors 10 can be increased owing to provision of the wire 64.

Twenty-Seventh Embodiment

A twenty-seventh embodiment of the invention will be described below with reference to FIG. 78, which is a fragmentary cross section showing a resin seal semiconductor package of the twenty-seventh embodiment of the invention.

Figure 78:
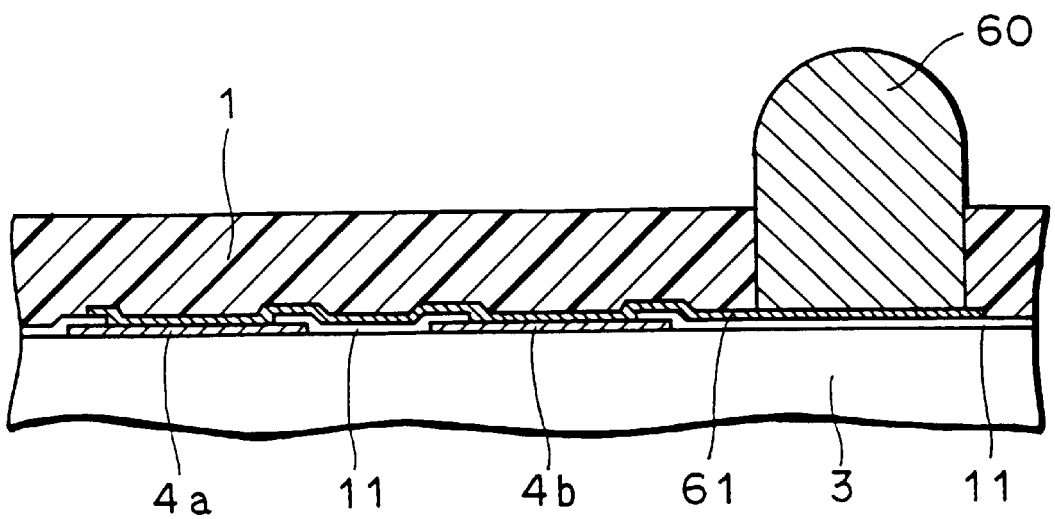

In the embodiment shown in FIG. 78, a plurality of bonding pads 4a and 4b, which are formed on the main surface of the semiconductor chip 3 and receive the same signal, are electrically connected together by the same interconnection layer 61. The protruded electrodes 60 is formed on a region of the interconnection layer 61 on which the bonding pads 4a and 4b are not formed.

A signal can be sent to and from the multiple bonding pads by the common protruded electrode 60 for external connection. Thereby, the protruded electrodes can be reduced in number, resulting in increase of the degree of freedom of positions of the bonding pads 4 and protruded electrodes 60.

In this embodiment, the interconnection layer 61 is formed on the surface of the semiconductor chip 3. However, the interconnection layer 61 may be formed inside or on the seal resin 1 similarly to the embodiments already described. The protruded electrode 60 may have a multilayer structure.

Twenty-Eighth Embodiment

A twenty-eighth embodiment of the invention will be described below with reference to FIG. 79, which is a fragmentary cross section showing a resin seal semiconductor package of the twenty-eighth embodiment.

Figure 79:
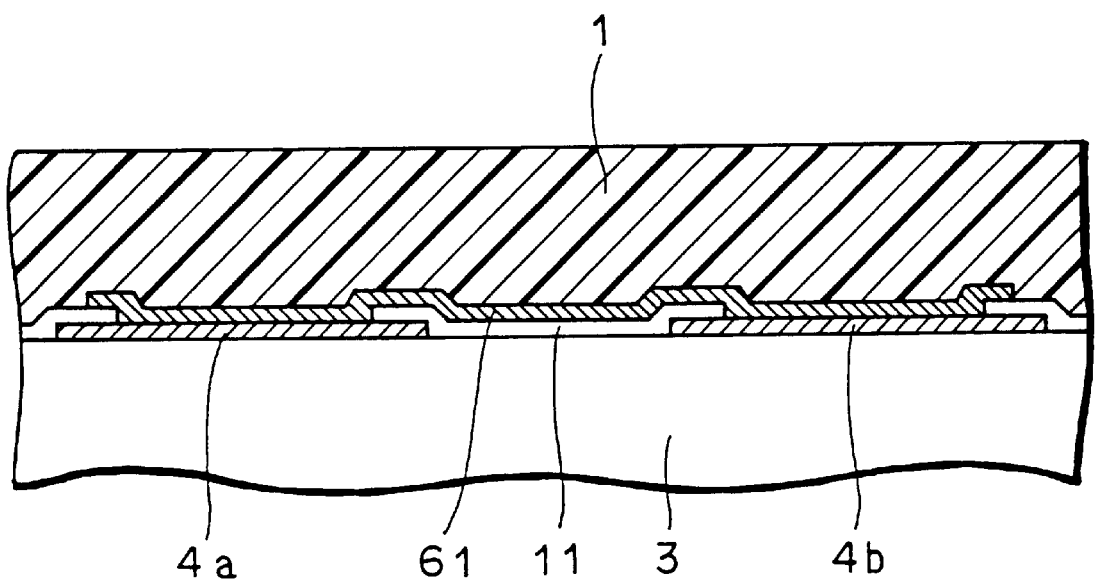

As shown in FIG. 79, only a plurality of bonding pads 4a and 4b receiving the same signal may be electrically connected together by the interconnection layer 61. Also in this case, an effect similar to that of the twenty-seventh embodiment can be obtained.

Twenty-Ninth Embodiment

Figure 81:
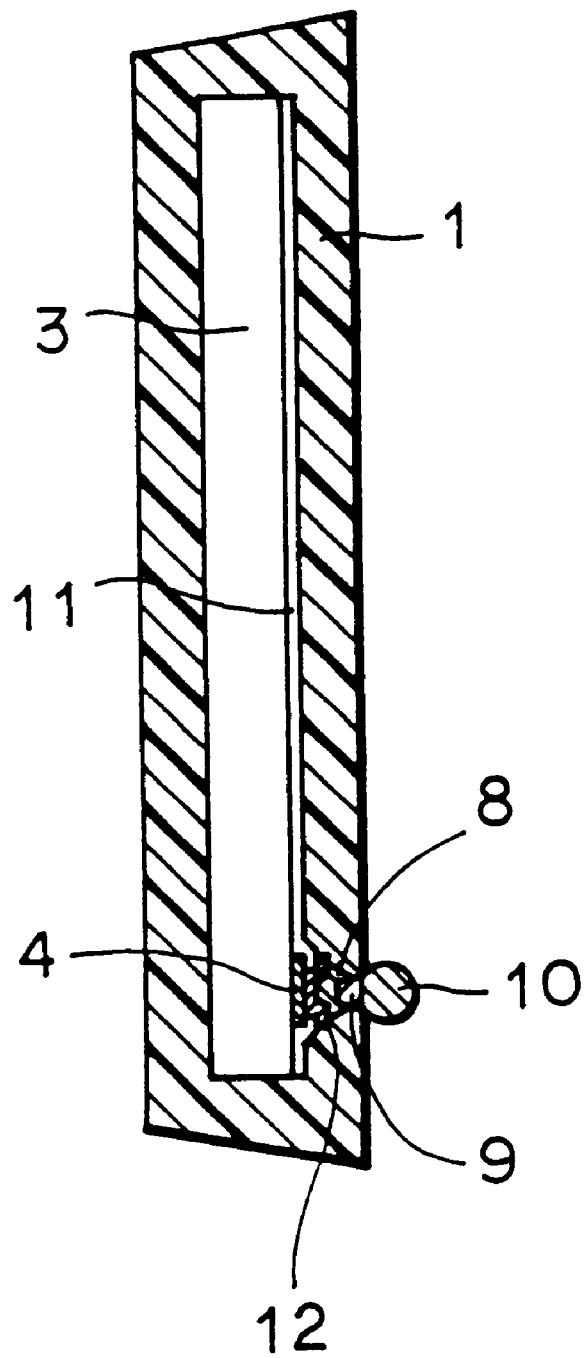
FIG. 81 is a cross section showing the resin seal semiconductor package shown in FIG. 80.
Figure 82:
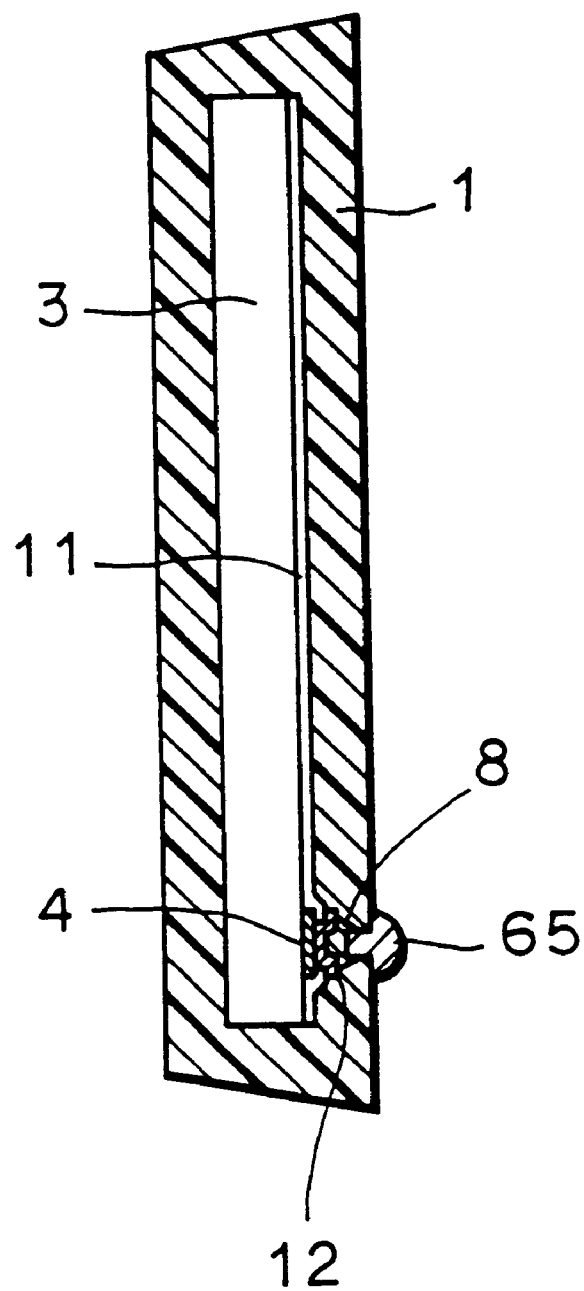
FIG. 82 is a cross section showing a modification of the resin seal semiconductor package of the twentieth-ninth embodiment of the invention.

A twenty-ninth embodiment of the invention will be described below with reference to FIG. 80, which is a perspective view partially in section showing a resin seal semiconductor package of the twenty-ninth embodiment. FIG. 81 is a cross section of the resin seal semiconductor package shown in FIG. 80. FIG. 82 is a cross section showing a modification of the resin seal semiconductor package of the twenty-ninth embodiment.

Figure 80:
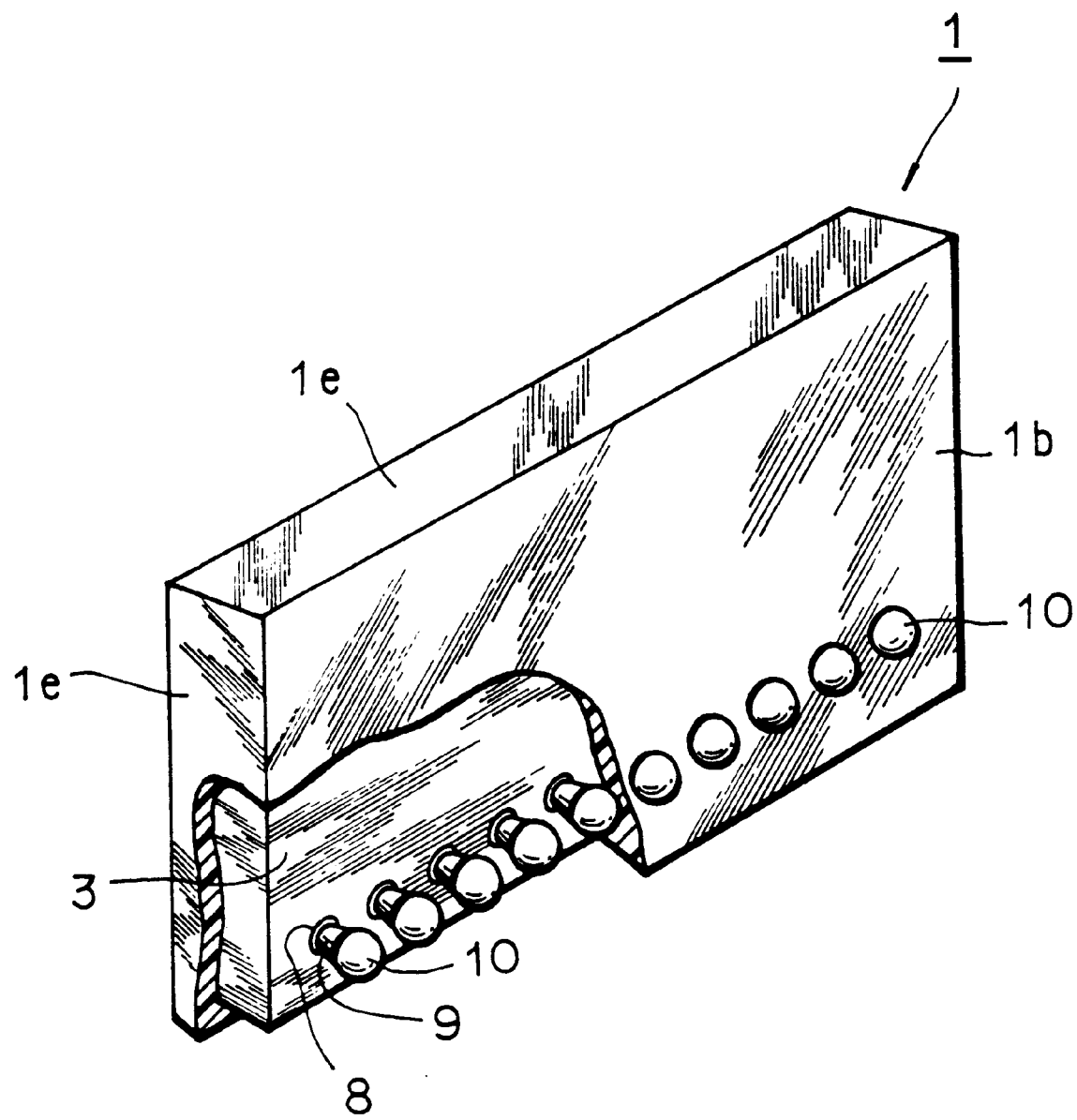
FIG. 80 is a perspective view partially in section showing a resin seal semiconductor package of a twenty-ninth embodiment of the invention.

Referring first to FIG. 80, the seal resin 1 has a main surface 1b on which the second conductor 10 is formed as well as side surfaces 1e defining a periphery of the main surface 1b. The second conductor 10 is preferably provided at a peripheral portion of the main surface 1b. Thereby, the resin seal semiconductor package can be mounted on the printed board (not shown) with the main surface 1b being upright to the printed board.

The printed board and the resin seal semiconductor package are opposite to each other through an area substantially equal to an area of one side surface 1e. As shown in FIG. 80, the area of the main surface 1b is generally larger than the area of the side surface 1e.

Therefore, an area occupied by each resin seal semiconductor package on the printed board can be reduced by mounting the same on the printed board with the one side surface 1e opposite to the printed board. This enables high integration of the resin seal semiconductor packages on the printed board.

Referring to FIG. 81, electrodes for external connection in this embodiment include first and second conductors 9 and 10. By appropriately adjusting the sizes and the like of the second conductor 10, the resin seal semiconductor package can be mounted more easily on the is printed board as compared with the case where the electrode for external connection has a single layer structure. Also in connection with the mounting thereof on the printed board, the reliability can be made higher than that in the single layer structure.

A modification of this embodiment will be described below with reference to FIG. 82. In this modification shown in FIG. 82, a protruded electrode 65 of a single layer is formed as an electrode for external connection. While this modification has the already described problem relating to the reliability, this can achieve high integration of the resin seal semiconductor packages.

This modification can employ the scheme disclosed, for example, in the twentieth embodiment in which the positions of the bonding pads 4 and electrodes (second conductors 10) for external connection are shifted from each other. Thereby, the resin seal semiconductor package shown in FIGS. 80–82 can be easily obtained even if various devices are formed in the semiconductor chip 3.

Thirtieth Embodiment

Figure 83:
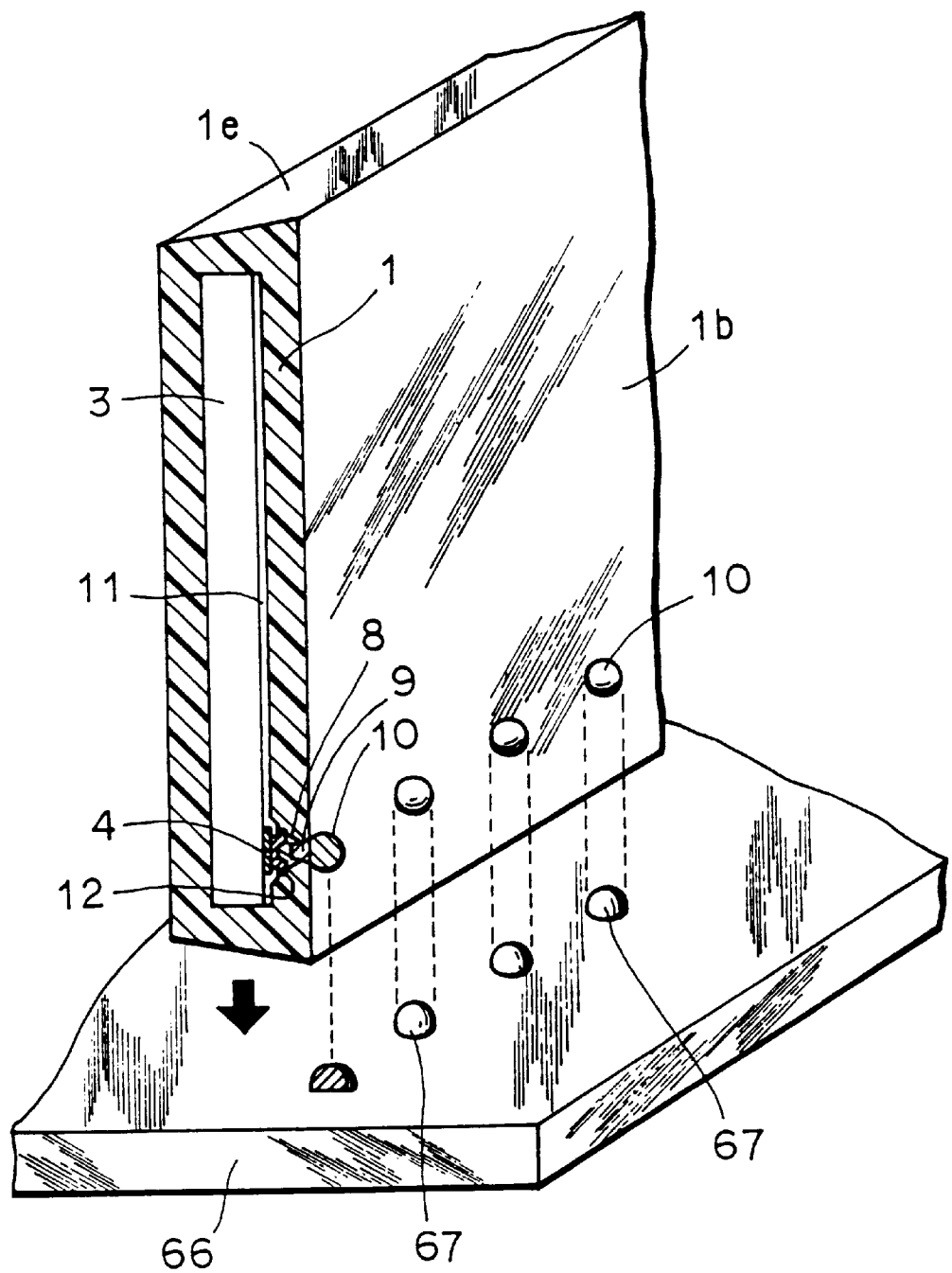
FIG. 83 is a perspective view partially in section showing a state in which a resin seal semiconductor package of a thirtieth embodiment of the invention is being mounted on a printed board.
Figure 84:
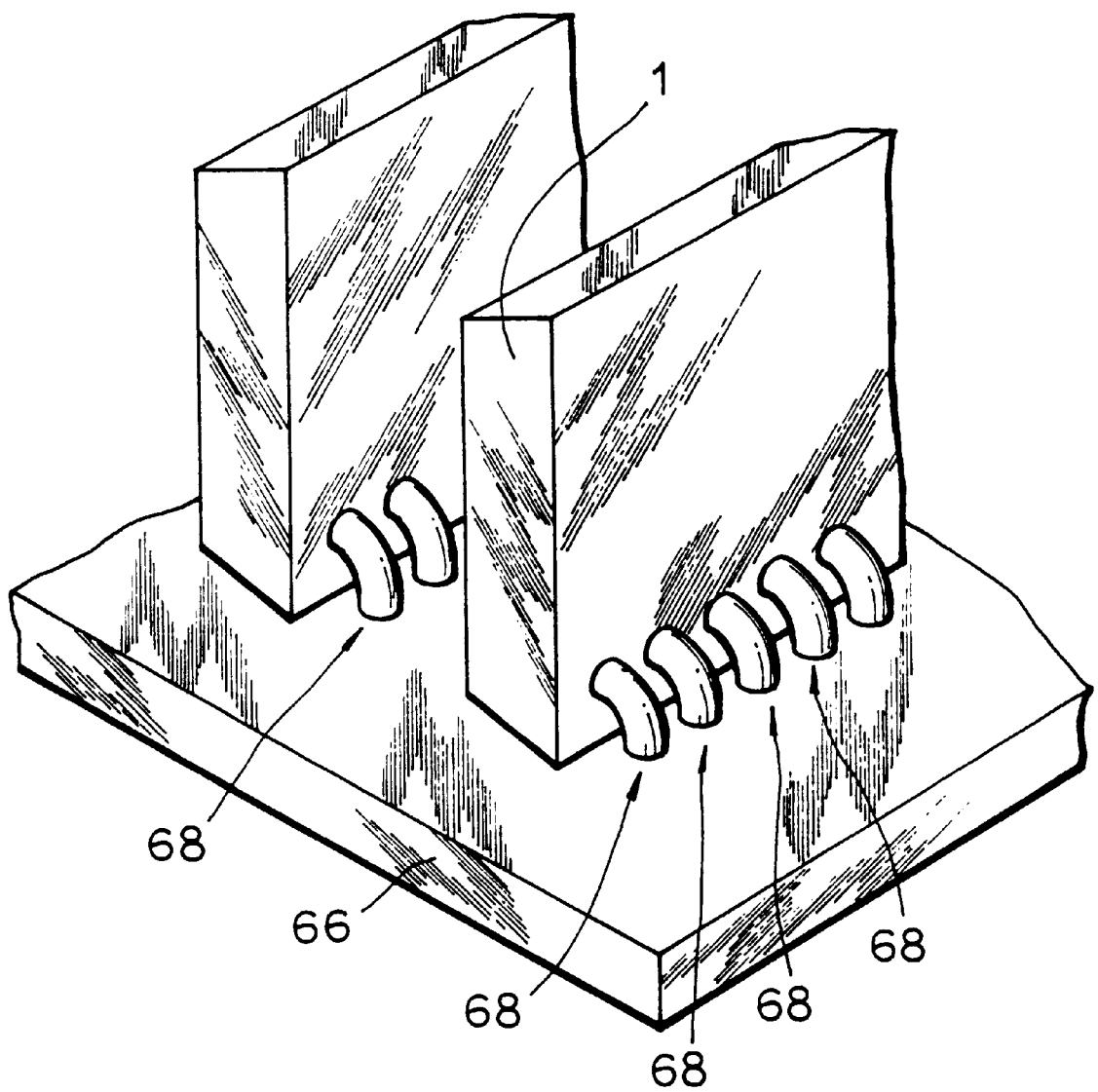
FIG. 84 is a perspective view showing a state in which the resin seal semiconductor package of the thirtieth embodiment of the invention is mounted on the printed board.

A thirteenth embodiment of the invention will be described below. FIG. 83 is a partially in section perspective view showing the thirtieth embodiment and particularly showing a first step in a process of mounting the resin seal semiconductor package on a printed board. FIG. 84 is a perspective view showing the thirtieth embodiment and particularly showing a second step in a process of mounting the resin seal semiconductor package on the printed board.

Referring to FIG. 83, the resin seal semiconductor package having a structure shown in FIG. 80 is prepared. Protruded electrodes 67 are formed at positions on a printed board 66 corresponding to the positions of the second conductors 10. The resin seal semiconductor package is moved in a direction indicated by arrow in FIG. 83 to locate the same on a predetermined position on the printed board 66.

Thereby, the side surface 1e of the resin seal semiconductor package is opposite to the printed board 66. On the printed board 66, the resin seal semiconductor package occupies an area substantially equal to the area of the side surface 1e. Thereby, high integration of the resin seal semiconductor packages on the printed board can be achieved to a higher extent as compared with the case where the main surface 1b of the resin seal semiconductor package is opposite to the printed board 66.

After disposing the resin seal semiconductor package on the printed board 66, the second conductors 10 and the protruded electrodes 67 are melted to form joined portions 68 as shown in FIG. 84. Through these steps, the resin seal semiconductor package is mounted on the printed board 66.

If the protruded electrode 65 for external connection of the resin seal semiconductor package were formed of a single layer as shown in FIG. 82, the following problem would arise. When the resin seal semiconductor package is mounted on the printed board, the protruded electrode 65 itself melts to form a joined portion similarly to the above. Thereby, a possibility of a gap being formed between the protruded electrode 65 and the seal resin 1 increases as compared with the case where the electrode for external connection has a multilayer structure, which leads to low reliability. Therefore, it is preferable that the protruded electrode for external connection is formed of multiple conductive layers.

Thirty-First Embodiment

Figure 85:
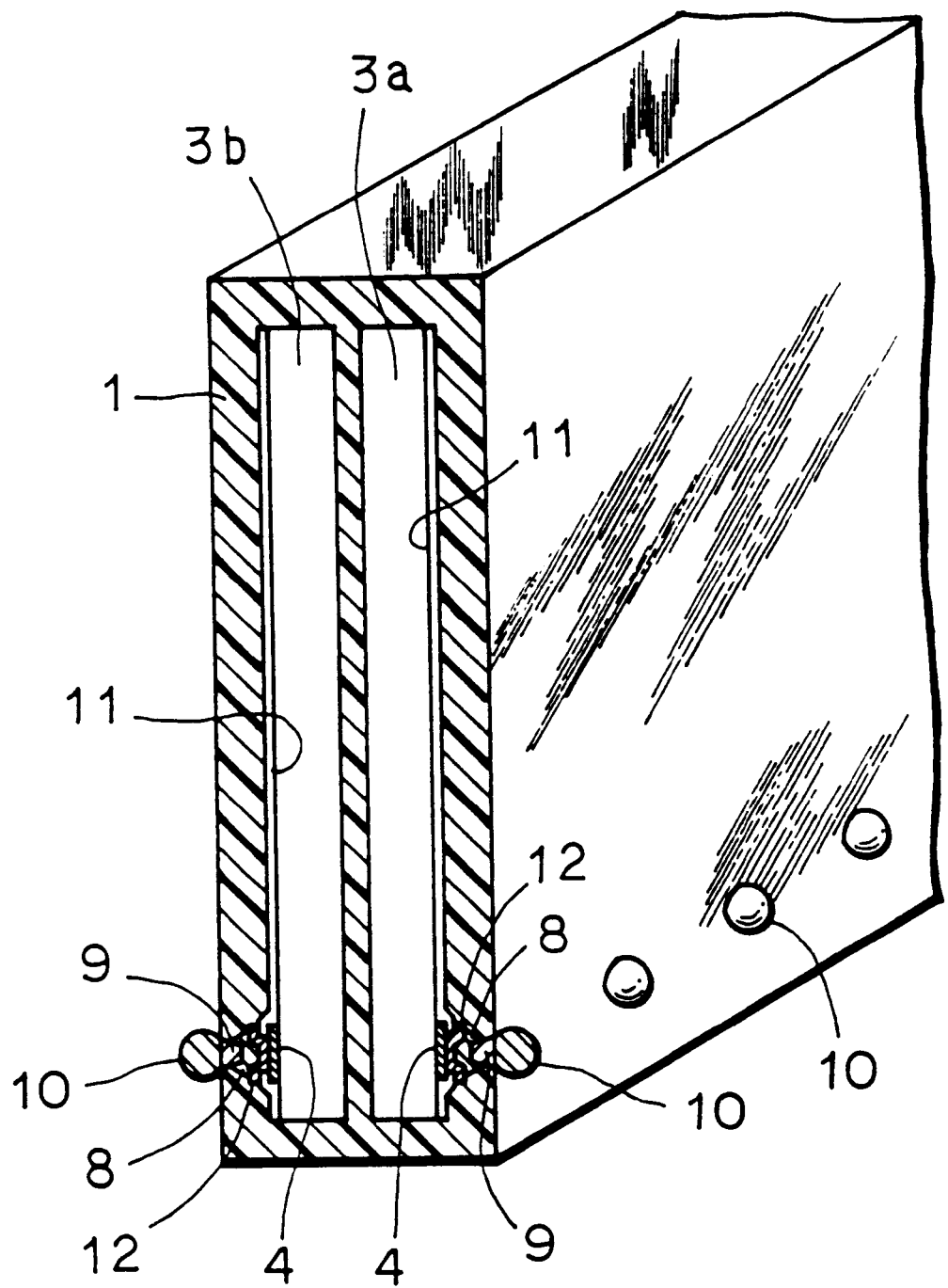
FIG. 85 is a perspective view partially in section showing a resin seal semiconductor package in a thirty-first embodiment of the invention.

A thirty-first embodiment of the invention will be described below. FIG. 85 is a perspective view partially in section showing a resin seal semiconductor package of the thirty-first embodiment.

The resin seal semiconductor package of the embodiment shown in FIG. 85 includes two semiconductor chips 3a and 3b, which are sealed with one seal resin 1. In this embodiment, the two semiconductor chips 3a and 3b are located with their rear surfaces opposite to each other.

Therefore, the second conductors 10 are provided at the opposite surfaces. Owing to this structure, the resin seal semiconductor packages in greater number can be disposed on the printed board 6 than in the thirtieth embodiment.

Thirty-Second Embodiment

Figure 86:
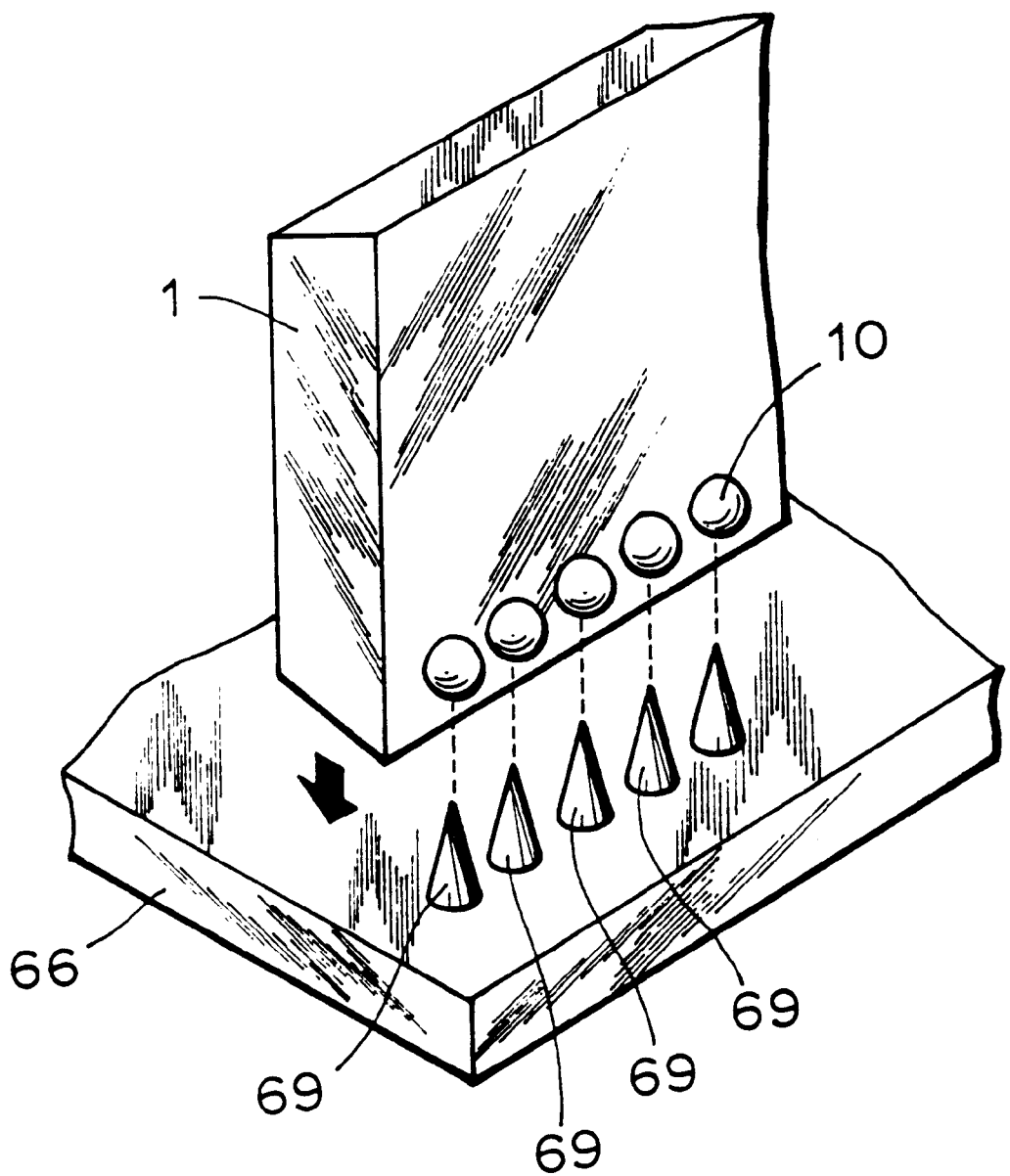
FIG. 86 is a perspective view showing a state in which a resin seal semiconductor package of a thirty-second embodiment of the invention is being mounted on a printed board.

A thirty-second embodiment of the invention will be described below. FIG. 86 is a perspective view showing the thirty-second embodiment of the invention and particularly showing a process of mounting the resin seal semiconductor package on the printed board.

In the embodiment shown in FIG. 86, pins 69 are provided at positions on the printed board 66 corresponding to the positions of the second conductors 10. Owing to provision of the pins 69, a predetermined height can be obtained more easily than the case where the protruded electrodes are formed on the printed board 66.

Thereby, the degree of freedom of positions of the second conductors 10 on the resin seal semiconductor package can be made higher than that in the twenty-ninth and thirtieth embodiments. Other structures are similar to those of the thirtieth embodiment shown in FIG. 84, and thus an effect similar to that of the thirtieth embodiment can also be obtained.

Thirty-Third Embodiment

Figure 87:
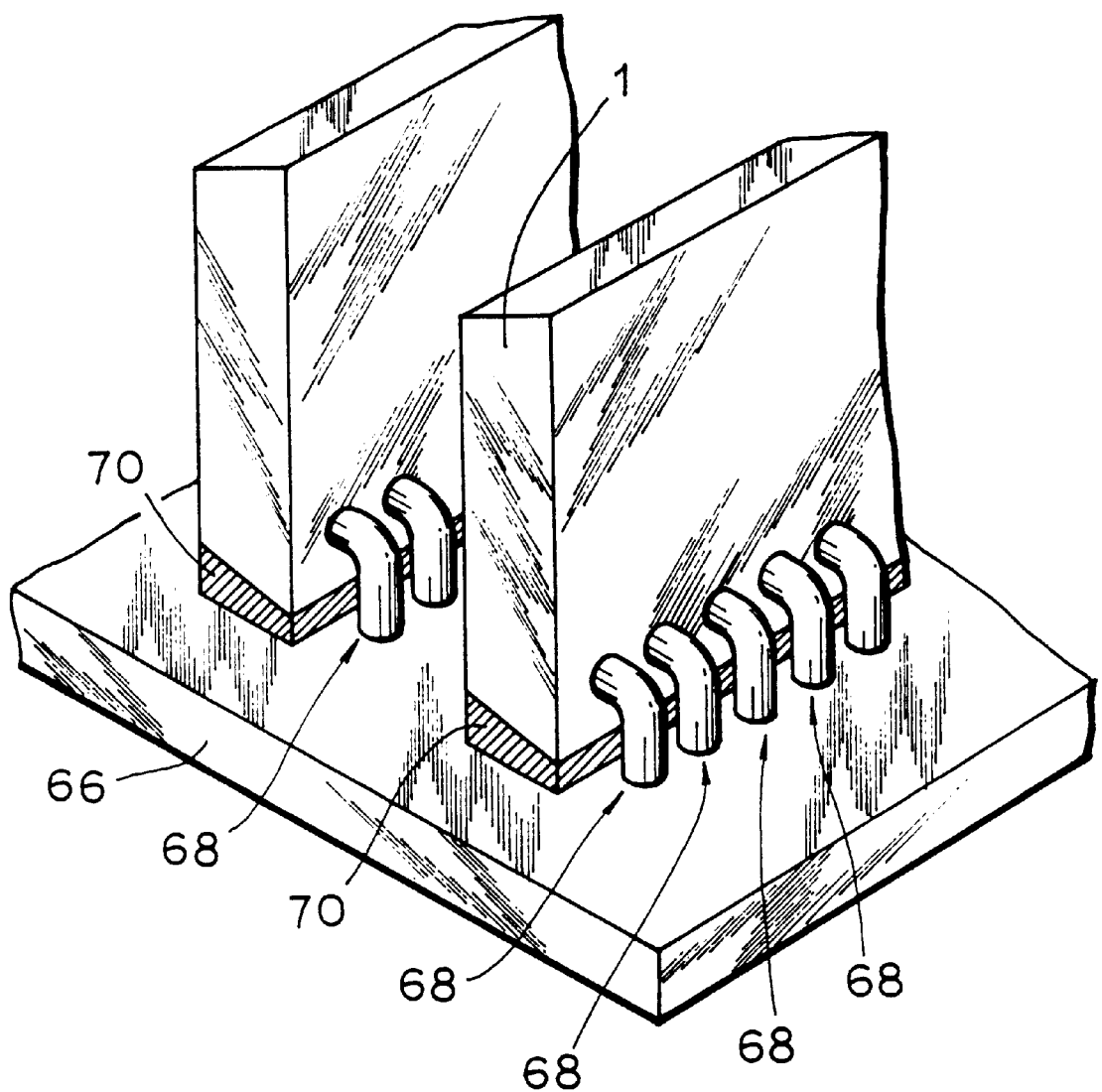
FIGS. 87–89 are perspective views showing a state in which resin seal semiconductor package of a 33th to 35th embodiments of the invention are mounted on a printed board.

A thirty-third embodiment of the invention will be described below. FIG. 87 is perspective view showing the thirty-third embodiment and particularly showing a process of mounting the resin seal semiconductor package on the printed board.

In the embodiment shown in FIG. 87, an insulating adhesive 70 is interposed between the resin seal semiconductor package and the printed board 66. This can reduce a load against the joined portion 68 as compared with the thirtieth embodiment, so that the reliability is further improved.

Other structures are similar to those of the thirtieth embodiment, and thus an effect similar to that of the thirtieth embodiment can also be obtained.

Thirty-Fourth Embodiment

Figure 88:
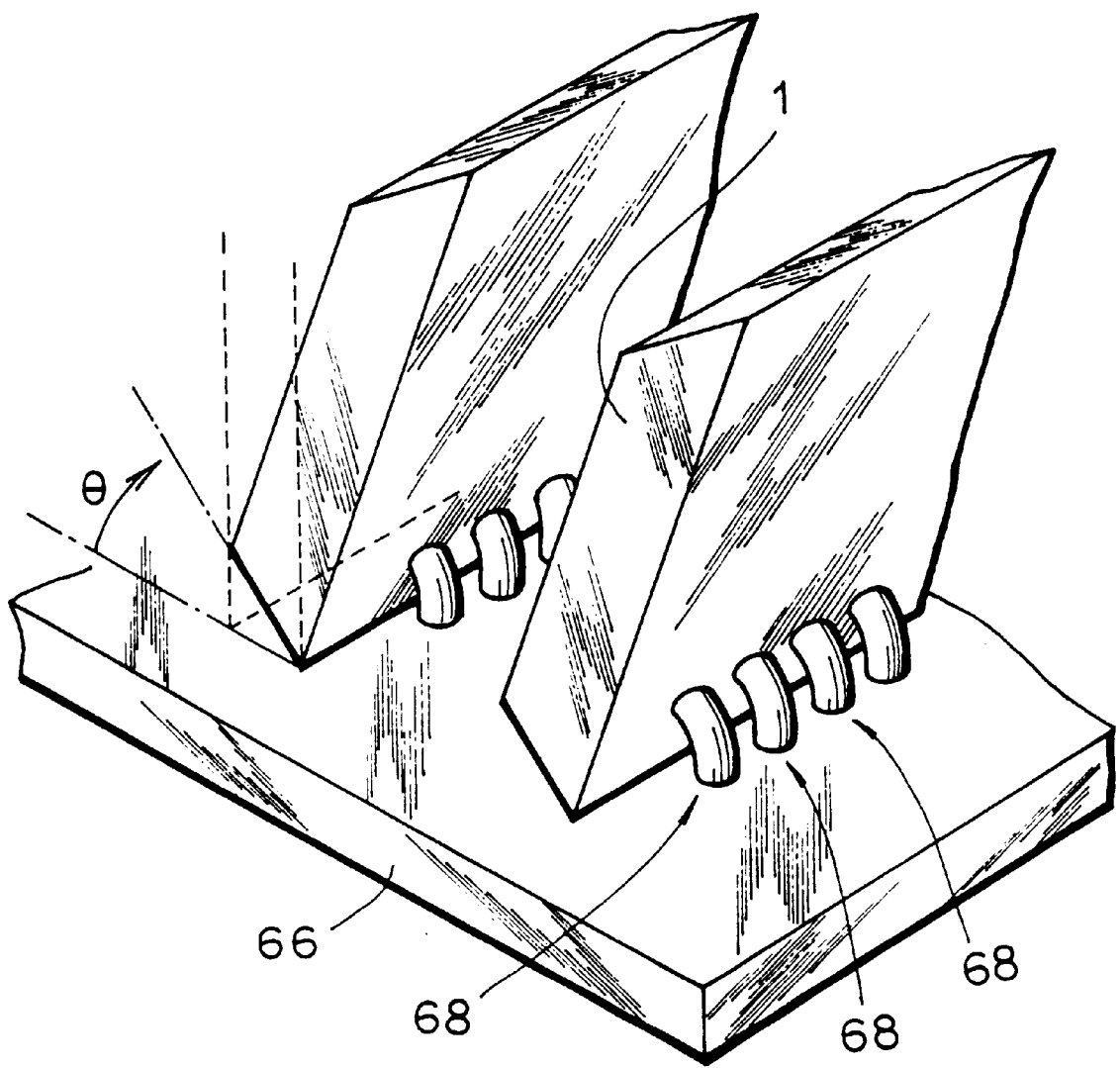

A thirty-fourth embodiment of the invention will be described below. FIG. 88 is a perspective view showing the thirty-fourth embodiment and particularly showing a process of mounting a resin seal semiconductor package on the printed board 66.

In the embodiment shown in FIG. 88, the resin seal semiconductor package is mounted on the printed board 66 inclined by a predetermined angle (θ) with respect to the printed board 66. In this example, the resin seal semiconductor package is inclined by the angle of θ toward the joined portion 68 as shown in FIG. 88. The value of θ is determined taking a joining strength of the joined portion 68 and others into consideration.

By inclining the resin seal semiconductor package with respect to the printed board 66 by the predetermined angle of θ, it is possible to reduce substantial distance between the second conductor 10 in the semiconductor package and the protruded electrode 67 formed on the printed board.

Thereby, the joined portion 68 can be formed easily. Also, the reliability of the joined portion is improved. Since the joined portion 68 can be made shorter, an electric resistance of the joined portion 68 can be reduced.

Thirty-Fifth Embodiment

Figure 89:
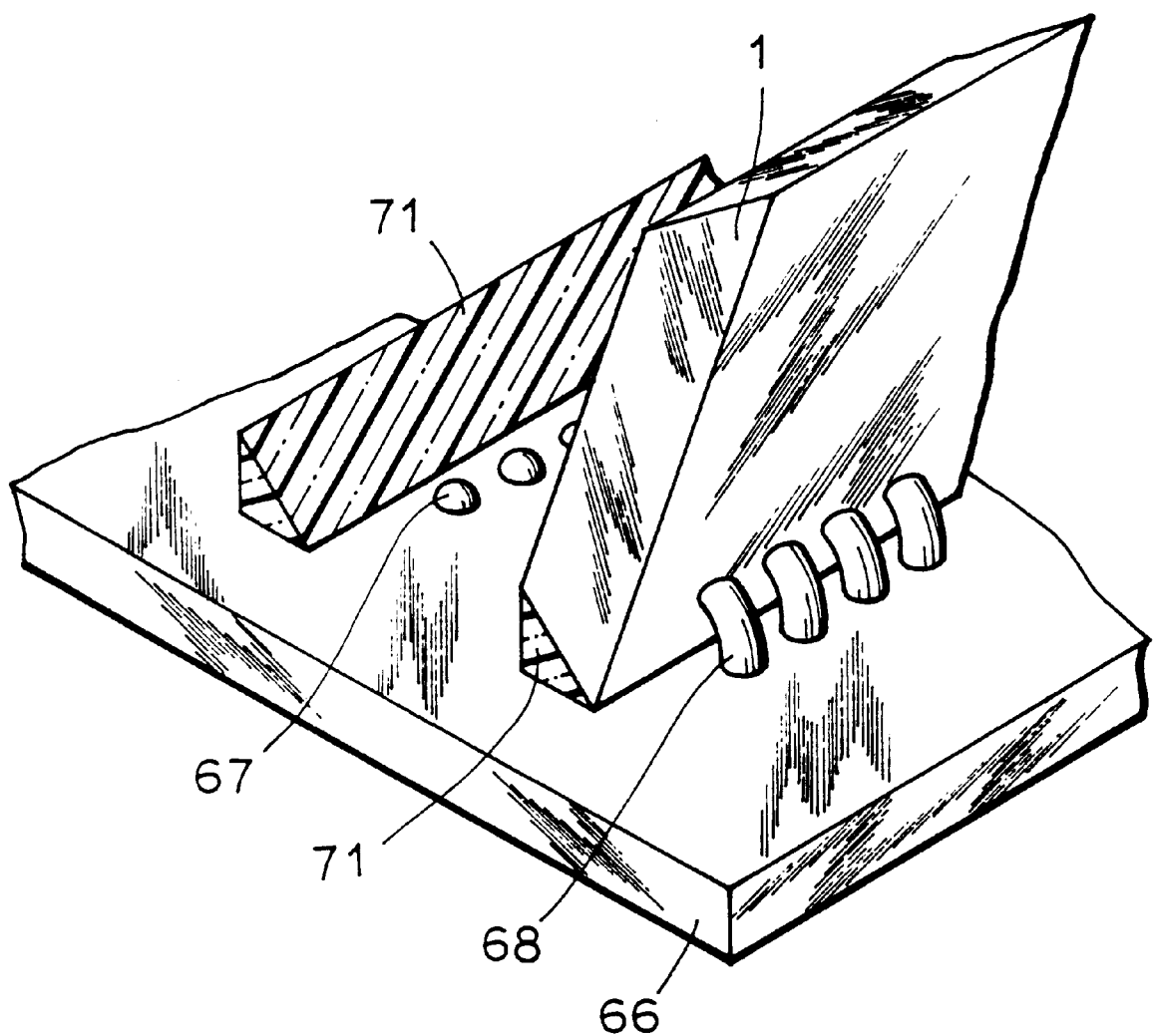

A thirty-fifth embodiment of the invention will be described below. FIG. 89 is a perspective view showing the thirty-fifth embodiment of the invention and particularly showing a process of mounting the resin seal semiconductor package on the printed board 66.

In the embodiment shown in FIG. 89, the resin seal semiconductor package is inclined by a predetermined angle with respect to the printed board 66, similarly to the thirty-fourth embodiment. A base 71 is provided between the printed board 66 and the resin seal semiconductor package.

Owing to the provision of the base 71, the resin seal semiconductor package can be mounted on the printed board 66 more stably than the thirty-fourth embodiment. Other structures are similar to those of the thirty-fourth embodiment, and thus an effect similar to that of the thirty-fourth embodiment can be achieved.

Thirty-Sixth Embodiment

Figure 90:
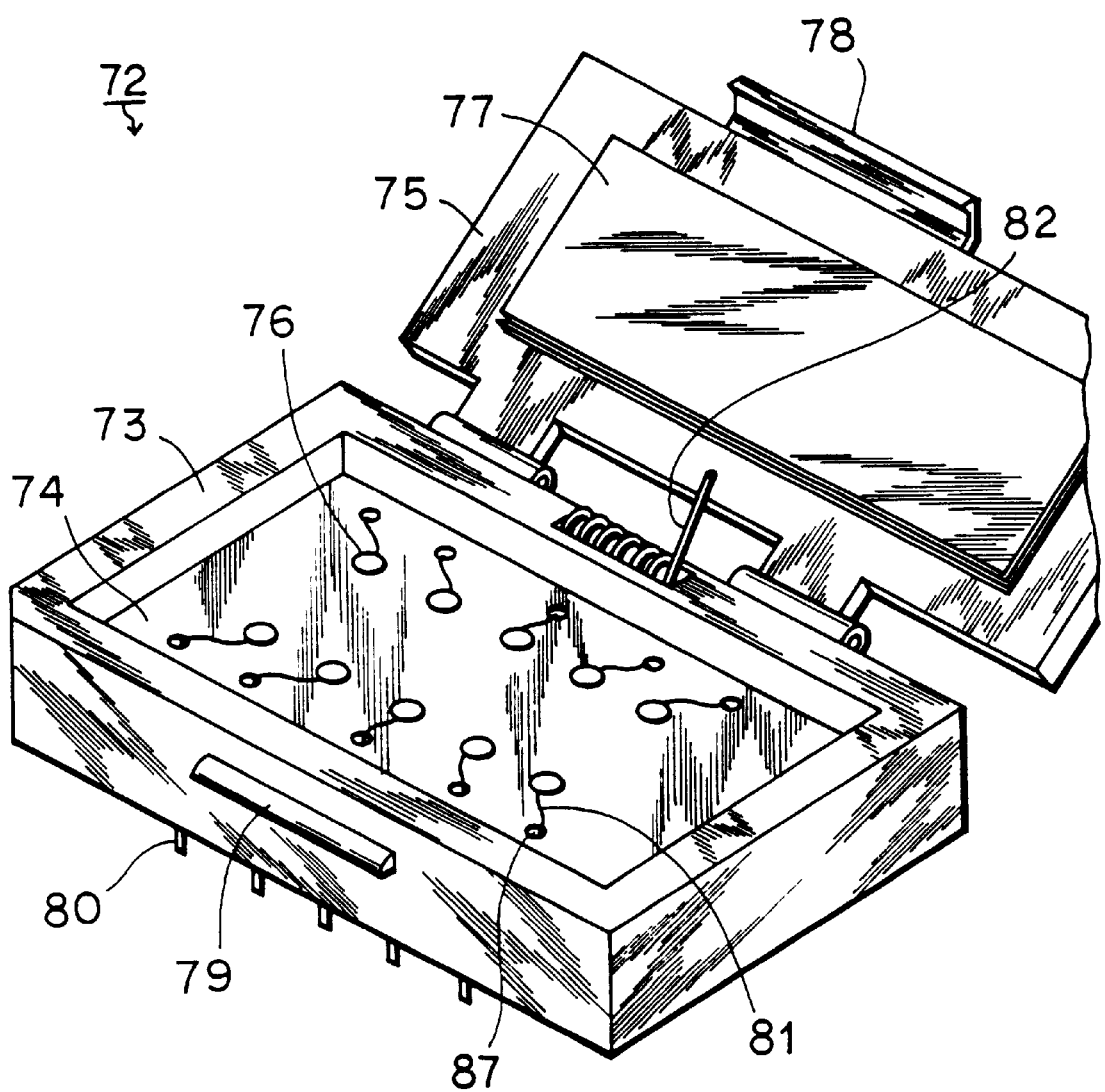
FIG. 90 is a perspective view showing a socket for performance evaluation of a resin seal semiconductor package of a thirty-sixth embodiment of the invention.
Figure 91:
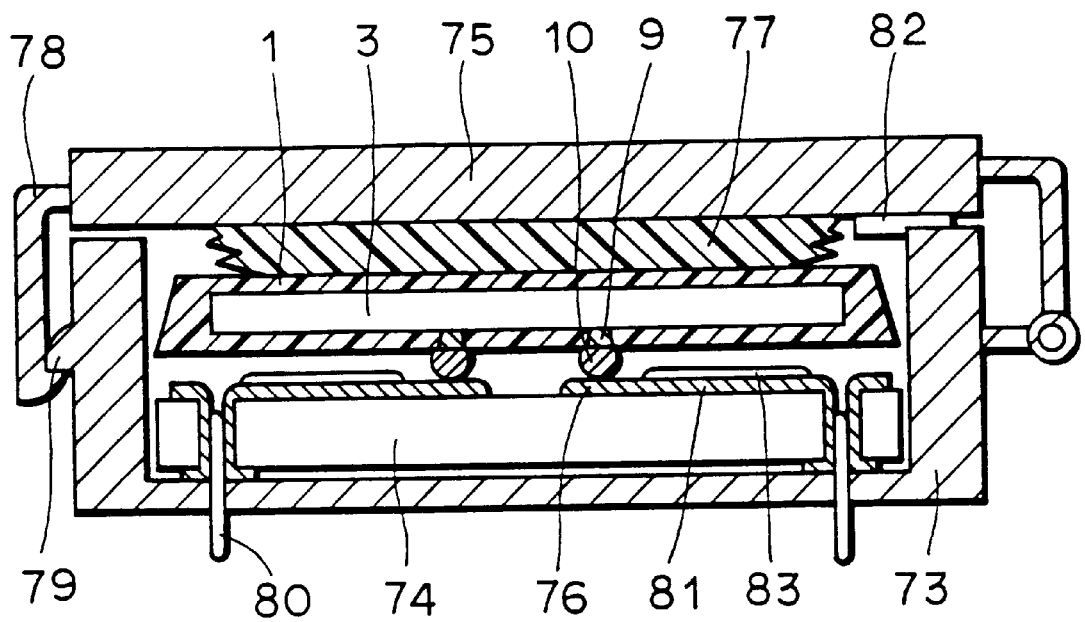
FIG. 91 is a cross section showing a state in which a resin seal semiconductor package is accommodated in the socket shown in FIG. 90.

A thirty-sixth embodiment of the invention will be described below. FIG. 90 is a perspective view showing a socket 72 of the thirty-sixth embodiment, which is used for performance evaluation of the resin seal semiconductor package. FIG. 91 is a cross section of the socket 72 shown in FIG. 90 as well as the resin seal semiconductor package having protruded electrodes and inserted into the socket 72.

Thirty-sixth to thirty-ninth embodiments which will be described below relate to structures of sockets which can perform more easily the performance evaluation of the resin seal semiconductor package having protruded electrodes for external connection. Although the following embodiment will be described in connection with structures in which protruded electrodes have the multilayer structure, the concept of these embodiments can be applied also to structures where the protruded electrodes have the single layer structure.

Referring to FIG. 90, the socket 72 includes an accommodating portion 73 for accommodating the resin seal semiconductor package, and a lid 75 for closing the accommodating portion 73. A base plate 74 is provided in the accommodating portion 73. The base plate 74 is made of insulating material, and is preferably made of glass-epoxy or the like. Receiving electrodes 76 made of copper (Cu) or the like are formed on the surface of the base plate 74. The receiving electrodes 76 are adapted to contact with the protruded electrodes provided in the resin seal semiconductor package.

Interconnections 81 electrically connected to the receiving electrodes 76 are formed on the surface of the base plate 74. The base plate 74 is provided at predetermined positions with openings 87 formed by, e.g., a drill. Conductive layers of copper (Cu) or the like are formed over inner surfaces of the openings 87 by an electrolytic plating method, and are electrically connected to the interconnections 81.

Input/output pins 80 made of kovar or the like are put into the openings 87, and are projected beyond the bottom of the accommodating portion 73. The accommodating portion 73 is provided at a predetermined position with a spring 82 which facilitates opening of the lid 75.

Meanwhile, the lid 75 is provided with a convex portion 77, which applies a pressing force against a rear surface of the resin seal semiconductor package. Thereby, the protruded electrodes of the resin seal semiconductor package can be pressed against the receiving electrodes 76. As a result, it is possible to ensure stable contact between the protruded electrodes of the resin seal semiconductor package and the receiving electrodes 76 on the base plate 74.

The lid 75 is provided with an engaging portion 78. On the other hand, the accommodating portion 73 is provided at a predetermined portion with an engaging portion 79 to be engaged with the engaging portion 78. The lid 75 is maintained in the closed state by the mutual engagement of the engaging portions 78 and 79.

Referring to FIG. 91, a state where the resin seal semiconductor package is accommodated in the accommodating portion 73 will be described below. Referring to FIG. 91, the resin seal semiconductor package is accommodated in the accommodating portion 73 with its main surface opposite to the base plate 74. The lid 75 is provided with the convex portion 77 made of, e.g., an elastic material.

The convex portion 77 applies the pressing force against the rear surface of the resin seal semiconductor package. Thereby, the second conductors 10 are elastically pressed against the receiving electrodes 76. This ensures stable contact between the second conductors 10 and the receiving electrodes 76. Insulating layers 83 are formed on the interconnection layers 81 for protecting the interconnection layers 81.

By accommodating the resin seal semiconductor package in the accommodating portion 73 as described above, the stable contact between the second conductors 10 and the receiving electrodes 76 are ensured. Thereby, the performance evaluation of the resin seal semiconductor package can be performed more stably and reliably.

Thirty-Seventh Embodiment

Figure 92:
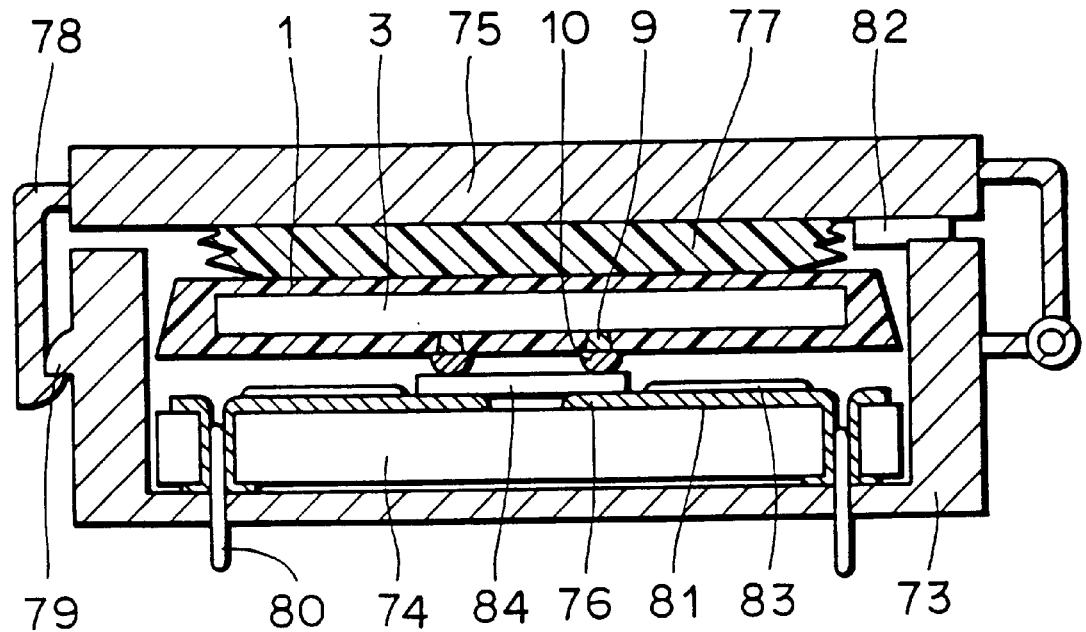
FIG. 92 is a cross section showing a socket for performance evaluation of a resin seal semiconductor package of a thirty-seventh embodiment of the invention.

A thirty-seventh embodiment of the invention will be described below. FIG. 92 is a cross section showing a socket for performance evaluation of the resin seal semiconductor package of the thirty-seventh embodiment.

In the embodiment shown in FIG. 92, an anisotropy conductive member 84 is interposed between the second conductors 10 and the receiving electrodes 76. The anisotropy conductive member 84 has such characteristics that, when a predetermined pressure is applied to a certain portion, only the portion receiving the pressure becomes electrically conductive in a direction of reception of the pressure.

In this case, since the convex portion 77 presses the rear surface of the resin seal semiconductor package, the anisotropy conductive member 84 receives a force in a direction in which the second conductors 10 and the receiving electrodes 76 oppose each other. Thereby, the second conductors 10 and the receiving electrodes 76 can be electrically connected together. As a result, the performance evaluation of the resin seal semiconductor package can be stably performed similarly to the thirty-sixth embodiment.

For example, the anisotropy conductive material may be made of silicon rubber randomly containing Ag grains. The anisotropy conductive member 84 may be integral with a socket 72 or may be separable therefrom.

Thirty-Eighth Embodiment

Figure 93:
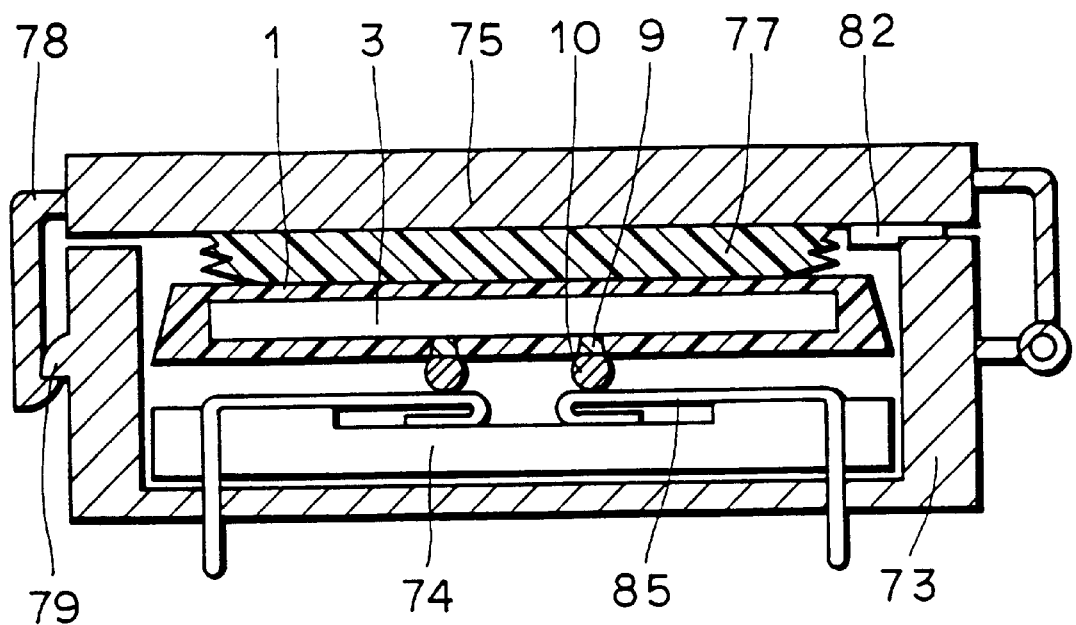
FIG. 93 is a cross section showing a socket for performance evaluation of a resin seal semiconductor package of a thirty-eighth embodiment of the invention.

A thirty-eighth embodiment of the invention will be described below. FIG. 93 is a cross section showing a socket for performance evaluation of the resin seal semiconductor package of the thirty-eighth embodiment.

In the embodiment shown in FIG. 93, the input/output pins 85 themselves have elasticity. This ensures stable contact between the input/output pins 85 and the second conductors 10. Therefore, the performance evaluation of the resin seal semiconductor package can be performed stably.

In the above example, the base plate 74 is provided with concave portions for providing elasticity in the input/output pins 85. The input/output pin may be formed integrally with the receiving electrode, whereby the elasticity is further improved. The socket 72 of this embodiment is preferably applied when the protruded electrodes of the resin seal semiconductor package are small in number.

Thirty-Ninth Embodiment

A thirty-ninth embodiment of the invention will be described below. FIG. 94 is a perspective view showing a socket for performance evaluation of the resin seal semiconductor package of the thirty-ninth embodiment. In this embodiment, the accommodating portion is provided with a recess 86 for easily taking in and out the resin seal semiconductor package.

It is preferable that a planar area of a space of the accommodating portion 73 for accommodating the resin seal semiconductor package is substantially equal to a planar area of the resin seal semiconductor package in the main surface side. Owing to this, the inner wall of the accommodating portion 73 can prevent shift of the resin seal semiconductor package in the main surface direction.

Thereby, tests such as performance evaluation can be performed. In this case, the resin seal semiconductor package can be easily put in and taken out by providing the recess 86 as shown in FIG. 94.

The thirty-sixth to thirty-ninth embodiments have been described in connection with the second conductors 10 for external connection which are arranged in two rows extending near the center of the main surface of the resin seal semiconductor package. However, the invention is not restricted to this, and the second conductors 10 may be arranged at any positions on the main surface of the resin seal semiconductor package. If the second conductors 10 are large in number, this can be complied with by forming the interconnection layers 81 of multilayer structures.

According to an aspect of the invention, as described hereinbefore, since there is provided the base metal layer, diffusion of material of the first conductor and material of the bonding pad can be prevented. Since the lumpish second conductor is formed on the top surface of the first conductor, the second conductor also forms a part of the connection to the external equipment. Therefore, characteristics of the connection such as fatigue strength can be improved by appropriately selecting components of the second conductor. Thereby, reliability of the connection can be improved.

Further, the first and second conductors are made of different kinds of material, and the material of the first conductor has a melting point higher than that of the second conductor. Therefore, such a phenomenon can be prevented that the first conductor melt when connecting the second conductor to the external equipment. Therefore, the semiconductor package can be maintained air-tight even when it is connected to the external equipments.

Since the electrode for external extension is formed directly on the bonding pad, the semiconductor package can be made compact. Owing to this, the length of the electrode can be made short, resulting in improved electrical characteristics. As described above, the present invention can provide the compact resin seal semiconductor package having improved electrical characteristics and high reliability.

The third conductor is preferably formed between the base metal layer and the first conductor. By melting the third conductor thus provided, the third conductor can be joined to the first conductor. Thereby, the first and third conductors can be joined together without applying a large load. As a result, other components are not adversely affected when joining the first and third conductors together.

By melting the third conductors, the third conductors are tapered. Thereby, a holding force by the seal resin can be increased compared with the case where the third conductor has a straight columnar shape. Consequently, the reliability of the resin seal semiconductor package is improved.

According to another aspect of the invention, there is provided the extended base metal layer. Thereby, the area of the bonding pad can be made smaller than that in the prior art. This can promote high integration of elements formed in the semiconductor chip. Since the second conductor can be formed in the desired position, the degree of freedom of the layout of elements on the semiconductor chip as well as the degree of freedom of connection to external equipments are increased.

According to the method of manufacturing the resin seal semiconductor package of the invention, the sealing with resin is effected on the semiconductor chip disposed on the insulating base plate. Therefore, the flat top surface of the first conductor can be obtained after separating the insulating base plate from the first conductor. Also, the top surface of the first conductor can be flush with the top surface of the seal resin. Thereby, the second conductor can be formed easily. Further, the first conductor and the connection layer were formed before forming the seal resin, so that the resin seal semiconductor package of which seal resin is completed is highly air-tight. As described above, the method of manufacturing the resin seal semiconductor package of the invention can be easily put into practice and it can produce the reliable resin seal semiconductor package.

According to the method of manufacturing the resin seal semiconductor package of another aspect of the invention, the seal resin is formed while the conical portion of the conductor of the semiconductor chip is fixed to the first molding die. Generally, there are provided a large number of conductors, so that the semiconductor chip can be stably fixed to the first molding die. As a result, the resin seal semiconductor package can be formed more stably and precisely.

According to the resin seal semiconductor package of still another aspect of the invention, the position at which the bonding pad is formed can be shifted in the main surface direction of the semiconductor chip from the position of the electrode for external connection. Thereby, the positions of the electrodes for external connection can be standardized. As a result, the resin seal semiconductor package can be easily mounted on the printed board. Also, the degree of freedom of positions of the bonding pads can be increased. Thereby, the degree of freedom of the layout of elements formed in the main surface of the semiconductor chip can be increased.

According to the resin seal semiconductor package of a further aspect of the invention, the bonding pads receiving the same signal are electrically connected together by the interconnection layer. Therefore, the number of electrodes for external connection can be reduced. Thereby, the degree of freedom of positions at which the electrodes for external connection are formed can be increased.

According to the semiconductor chip of this invention, the resin seal semiconductor package is mounted on the printed board with the main surface of the resin seal semiconductor package being upright to the printed board. Generally, the area of the main surface of the resin seal semiconductor package is larger than the area of the side surface defining the main surface. Therefore, the area occupied by each resin seal semiconductor package mounted on the printed board can be reduced. As a result, a large number of resin seal semiconductor packages can be mounted on the printed board.

The resin seal semiconductor package of a still further aspect of the invention includes the semiconductor chips of which rear surfaces are opposed to each other. Thereby, the second conductors can be formed in the opposite two surfaces of the resin seal semiconductor package. Thus, the resin seal semiconductor package having two main surfaces is obtained.

The second conductors are formed along the periphery of the main surface of the resin seal semiconductor package, whereby the resin seal semiconductor package can be mounted on the printed board with its main surface being upright to the printed board. Therefore, the number of the resin seal semiconductor packages mounted on the printed board can be increased.

According to the socket of the invention, the receiving electrode and the protruded electrode are kept elastically in contact with each other by elastic means. Thereby, the performance evaluation can be performed more stably and reliably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A socket for evaluating a performance of a resin seal semiconductor package, comprising:

a receiving electrode disposed at its one surface for receiving in a predetermined direction a protruded electrode protruded from a main surface of a resin seal semiconductor package;

a connection electrode disposed at the other surface for making electrical connection to a performance evaluating device used for evaluating the performance of said resin seal semiconductor package; and elastic means for elastically maintaining contact of said receiving electrode with said protruded electrode in said predetermined direction.

2. A socket according to claim 1, wherein said elastic means includes a box which has an accommodating portion for accommodating said resin seal semiconductor package and an opening at its upper portion for taking in and out said resin seal semiconductor package, said connection electrode protruded externally from said box, and a lid for closing said opening at the upper portion of said box.

3. The socket according to claim 2, wherein said lid has an elastic member which presses a rear surface of said resin seal semiconductor package in said predetermined direction toward said receiving electrode when said resin seal semiconductor package is accommodated.

4. The socket according to claim 3, wherein said receiving electrode is formed of an elastic member which is adapted to elastically contact said protruded electrode in said resin seal semiconductor package supported at its rear surface by said lid.

5. The socket according to claim 1, wherein an antisotropic conductive member in which only a portion receiving a predetermined pressure has conductivity in a direction of said pressure is provided between said receiving electrode and said protruded electrode.

6. A resin seal semiconductor package, comprising:

a semiconductor chip having a main surface on which an element is formed and a side surface which defines a periphery of said main surface;

a bonding pad formed on said main surface of said semiconductor chip;

a conductor formed on said bonding pad with a base metal layer interposed therebetween; and a seal resin sealing said semiconductor chip and partially exposing a surface of said conductor, wherein said side surface of said semiconductor chip has a tapered shape.

* * * * *